(12) United States Patent
An et al.

(10) Patent No.: US 10,031,360 B2
(45) Date of Patent: Jul. 24, 2018

(54) CURVED DISPLAY APPARATUS AND MULTI DISPLAY APPARATUS HAVING THE SAME

(71) Applicants: SAMSUNG ELECTRONICS CO., LTD., Suwon-si (KR); Samsung Display Co., Ltd., Yongin-si (KR)

(72) Inventors: Jun-seok An, Suwon-si (KR); Dong-wook Kim, Asan-si (KR); Sung-hwan Kim, Seongnam-si (KR); Jee-su Park, Hwaseong-si (KR); Chan-hong Park, Anyang-si (KR); Byung-kook Sim, Seoul (KR); Jong-cheol Lee, Yongin-si (KR); Cheol-se Lee, Daegu (KR); Hyeong-sik Choi, Hwaseong-si (KR); Byung-wook Ahn, Seoul (KR); Cheong-hun Lee, Asan-si (KR)

(73) Assignees: SAMSUNG ELECTRONICS CO., LTD., Suwon-si (KR); Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/371,329

(22) Filed: Dec. 7, 2016

(65) Prior Publication Data
US 2017/0082889 A1 Mar. 23, 2017

Related U.S. Application Data

(63) Continuation of application No. 14/797,453, filed on Jul. 13, 2015, now Pat. No. 9,551,893, which is a (Continued)

(30) Foreign Application Priority Data

Jul. 5, 2012 (KR) .................. 10-2012-0073323
Nov. 5, 2012 (KR) .................. 10-2012-0124338

(51) Int. Cl.
*G02F 1/1333* (2006.01)
*H05K 5/02* (2006.01)
(Continued)

(52) U.S. Cl.
CPC .... *G02F 1/133308* (2013.01); *F21V 33/0052* (2013.01); *G02F 1/13336* (2013.01);
(Continued)

(58) Field of Classification Search
CPC ................................. G02F 1/133308
See application file for complete search history.

(56) References Cited

U.S. PATENT DOCUMENTS 6,631,016 B1 * 10/2003 Klug ................ G03H 1/26
359/22
6,906,860 B2 * 6/2005 Starkweather ......... G03B 21/62
348/389.1
(Continued)

FOREIGN PATENT DOCUMENTS

CN 101344651 A 1/2009
CN 101464582 A 6/2009
(Continued)

OTHER PUBLICATIONS

Communication (PCT/ISA/210), dated Mar. 26, 2013, issued by the International Patent Office in counterpart International Application No. PCT/KR2013/000705.
(Continued)

*Primary Examiner* — Sang V Nguyen
(74) *Attorney, Agent, or Firm* — Sughrue Mion, PLLC

(57) ABSTRACT

A curved display apparatus and a multi display system having the same are provided. The curved display apparatus includes a display panel, and a fixation member which fixes the display panel so that the display panel is curved with multiple curvatures.

18 Claims, 45 Drawing Sheets

Related U.S. Application Data continuation of application No. 13/896,978, filed on May 17, 2013, now Pat. No. 9,113,553.

(60) Provisional application No. 61/648,189, filed on May 17, 2012.

(51) Int. Cl.

| | | |
|---|---|---|
| *H05K 5/00* | (2006.01) | |
| *F21V 33/00* | (2006.01) | |
| *G02F 1/1335* | (2006.01) | |
| *G02F 1/1362* | (2006.01) | |

(52) U.S. Cl.
CPC .. *G02F 1/133305* (2013.01); *G02F 1/133602* (2013.01); *G02F 1/136286* (2013.01); *H05K 5/0017* (2013.01); *H05K 5/02* (2013.01); *H05K 5/0217* (2013.01); *G02F 2001/13332* (2013.01); *G02F 2001/133328* (2013.01)

(56) References Cited

U.S. PATENT DOCUMENTS

| | | | |
|---|---|---|---|
| 7,667,786 B2 | 2/2010 | Nouchi et al. | |
| 7,834,962 B2 | 11/2010 | Satake et al. | |
| 7,847,912 B2 | 12/2010 | Nishizawa et al. | |
| 7,920,223 B2 | 4/2011 | Nishizawa et al. | |
| 8,111,347 B2 | 2/2012 | Koganezawa | |
| 8,310,614 B2 | 11/2012 | Sasaki et al. | |
| 8,462,289 B2 | 6/2013 | Nishizawa et al. | |
| 9,113,553 B2 | 8/2015 | An et al. | |
| 9,551,893 B2 * | 1/2017 | An | H05K 5/0217 |
| 2002/0003711 A1 | 1/2002 | Hashimoto et al. | |
| 2002/0027636 A1 | 3/2002 | Yamada | |
| 2005/0117197 A1 * | 6/2005 | Ide | G02F 1/1333 359/291 |
| 2006/0050195 A1 | 3/2006 | Choi et al. | |
| 2006/0146488 A1 | 7/2006 | Kimmel | |
| 2006/0168855 A1 | 7/2006 | D'Urban Jackson | |
| 2006/0273304 A1 * | 12/2006 | Cok | H01L 51/0096 257/40 |
| 2007/0002130 A1 * | 1/2007 | Hartkop | H04N 7/141 348/14.16 |
| 2007/0146569 A1 | 6/2007 | Nouchi et al. | |
| 2008/0303976 A1 | 12/2008 | Nishizawa et al. | |
| 2009/0015747 A1 * | 1/2009 | Nishizawa | G02F 1/133308 349/58 |
| 2009/0091681 A1 | 4/2009 | Nishizawa et al. | |
| 2009/0115933 A1 | 5/2009 | Mimura | |
| 2009/0161048 A1 | 6/2009 | Satake et al. | |
| 2009/0201443 A1 * | 8/2009 | Sasaki | G02F 1/1333 349/70 |
| 2009/0237597 A1 | 9/2009 | Maniwa et al. | |
| 2009/0316062 A1 | 12/2009 | Nishizawa | |
| 2010/0073593 A1 * | 3/2010 | Sasaki | B29D 11/00 349/58 |
| 2010/0073620 A1 * | 3/2010 | Yamaguchi | G02F 1/133305 349/160 |
| 2010/0124603 A1 * | 5/2010 | Ito | H01L 27/3246 427/66 |
| 2010/0128112 A1 * | 5/2010 | Marti | G06F 3/011 348/51 |
| 2010/0164860 A1 | 7/2010 | Misono | |
| 2010/0188422 A1 * | 7/2010 | Shingai | G06F 3/016 345/647 |
| 2010/0195040 A1 | 8/2010 | Koganezawa | |
| 2010/0236116 A1 | 9/2010 | Gimpel et al. | |
| 2011/0019129 A1 | 1/2011 | Nishizawa et al. | |
| 2011/0193814 A1 | 8/2011 | Gay et al. | |
| 2012/0075166 A1 * | 3/2012 | Marti | G06F 3/011 345/1.1 |
| 2013/0321740 A1 | 12/2013 | An et al. | |
| 2015/0346542 A1 | 12/2015 | An et al. | |

FOREIGN PATENT DOCUMENTS

| | | |
|---|---|---|
| CN | 101625474 A | 1/2010 |
| CN | 101681060 A | 3/2010 |
| CN | 203324614 U | 12/2013 |
| JP | 06160820 A | 6/1994 |
| JP | 2002-006797 A | 1/2002 |
| JP | 200679038 A | 3/2006 |
| JP | 2007171681 A | 7/2007 |
| JP | 2007333818 A | 12/2007 |
| JP | 200889884 A | 4/2008 |
| JP | 2008304535 A | 12/2008 |
| JP | 200942565 A | 2/2009 |
| JP | 200986560 A | 4/2009 |
| JP | 2010-48887 A | 3/2010 |
| JP | 2010181545 A | 8/2010 |
| JP | 2010266603 A | 11/2010 |

OTHER PUBLICATIONS

Communication (PCT/ISA/237), dated Mar. 26, 2013, issued by the International Patent Office in counterpart International Application No. PCT/KR2013/000705.
Communication dated May 28, 2015, issued by the State Intellectual Property Office on P.R. China in counterpart Chinese Application No. 201310175306.6.
Communication dated May 8, 2015 issued by the European Patent Office in counterpart European Patent Application No. 13 153 969.4.
Communication dated Oct. 20, 2014, issued by the European Patent Office in counterpart European Application No. 13153969.4.
Communication, dated Apr. 15, 2014, issued by the Japanese Patent Office in counterpart Japanese Application No. 2013-048924.
Communication, dated May 15, 2013, issued by the European Patent Office in counterpart European Application No. 13153969.4.
Communication from the European Patent Office dated Sep. 25, 2015 in a counterpart European Application No. 13153969.4.
Communication dated Dec. 9, 2015, issued by the State Intellectual Property Office of the People's Republic of China in counterpart Chinese Patent Application No. 201310175306.6.
Communication dated Jan. 22, 2016, issued by the State Intellectual Property Office of the People's Republic of China in counterpart Chinese Patent Application No. 201510390872.8.
Communication dated Feb. 3, 2016, issued by the European Patent Office in counterpart European Patent Application No. 13153969.4.
Communication dated Jul. 4, 2016, issued by the State Intellectual Property Office of the People's Republic of China in counterpart Chinese Patent Application No. 201510390872.8.
Communication dated Nov. 2, 2016, issued by the State Intellectual Property Office of P.R. China in counterpart Chinese application No. 201510390872.8.
Non-Final Office Action dated Oct. 21, 2013 in U.S. Appl. No. 13/896,978.
Final Office Action dated Feb. 12, 2014 in U.S. Appl. No. 13/896,978.
Non-Final Office Action dated Jul. 31, 2014 in U.S. Appl. No. 13/896,978.
Pre-Appeal Brief Conference Decision mailed Aug. 5, 2014 in U.S. Appl. No. 13/896,978.
Final Office Action dated Nov. 19, 2014 in U.S. Appl. No. 13/896,978.
Advisory Action dated Feb. 20, 2015 in U.S. Appl. No. 13/896,978.
Notice of Allowance dated Apr. 8, 2015 in U.S. Appl. No. 13/896,978.
Notice of Allowance dated Jun. 19, 2015 in U.S. Appl. No. 13/896,978.
Non-Final Office Action dated May 16, 2016 in U.S. Appl. No. 14/797,453.
Notice of Allowance dated Sep. 12, 2016 in U.S. Appl. No. 14/797,453.
Communication dated Apr. 13, 2017, issued by the European Patent Office in counterpart European application No. 13153969.4.

(56) References Cited

OTHER PUBLICATIONS

Communication dated Jun. 16, 2017, issued by the State Intellectual Property Office of P.R. China in counterpart Chinese application No. 201510390872.8.
Communication dated Jan. 2, 2018, from the European Patent Office in counterpart European Application No. 13153969.4.

* cited by examiner

FIG. 8

| | | FLAT DISPLAY APPARATUS | |
|---|---|---|---|
| (a) 4000mm | BRIGHTNESS MEASURE SCREEN | 0.07　　　　　　　0.08　　0.14　　0.07　　　　　　0.13　　0.06　　　　　0.11 | |
| | LIGHT LEAK | max | 0.14nit |
| | | AVERAGE | 0.09nit |
| (b) 4500mm | BRIGHTNESS MEASURE SCREEN | 0.04　　　　　　　0.09　　0.15　　0.07　　　　　　0.14　　0.06　　　　　0.1 | |
| | LIGHT LEAK | max | 0.15nit |
| | | AVERAGE | 0.09nit |
| (c) 5000mm | BRIGHTNESS MEASURE SCREEN | 0.05　　　　　　　0.12　　0.20　　0.06　　　　　　0.18　　0.08　　　　　0.11 | |
| | LIGHT LEAK | max | 0.20nit |
| | | AVERAGE | 0.11nit |

FIG. 9

| | | DISPLAY APPARATUS WITH SINGLE CURVATURE |
|---|---|---|
| (a) 4000mm | BRIGHTNESS MEASURE SCREEN | 0.63  0.43  0.18  0.69<br>0.08<br>0.52  0.24  0.28  0.51 |
| | LIGHT LEAK max | 0.69nit |
| | LIGHT LEAK AVERAGE | 0.44nit |
| (b) 4500mm | BRIGHTNESS MEASURE SCREEN | 0.49  0.21  0.25  0.52<br>0.08<br>0.4  0.2  0.25  0.48 |
| | LIGHT LEAK max | 0.52nit |
| | LIGHT LEAK AVERAGE | 0.35nit |
| (c) 5000mm | BRIGHTNESS MEASURE SCREEN | 0.5  0.16  0.24  0.38<br>0.08<br>0.27  0.29  0.19  0.52 |
| | LIGHT LEAK max | 0.52nit |
| | LIGHT LEAK AVERAGE | 0.32nit |

FIG. 11

4000mm SINGLE CURVATURE (a)

|   | LEFT | INTERMEDIATE | | RIGHT | LEFT–RIGHT | RIGHT–LEFT |
|---|---|---|---|---|---|---|
| X X | 0.2867 | 0.2754 | 0.2754 | 0.2793 | 0.0113 | 0.0039 |
| Y Y | 0.3097 | 0.2988 | 0.2988 | 0.3027 | 0.0109 | 0.0039 |
| BRIGHTNESS | 315 | 427 | 427 | 455 | -112 | 28 |

4500mm SINGLE CURVATURE (a)

|   | LEFT | INTERMEDIATE | | RIGHT | LEFT–RIGHT | RIGHT–LEFT |
|---|---|---|---|---|---|---|
| X X | 0.2847 | 0.273 | 0.273 | 0.2774 | 0.0117 | 0.0044 |
| Y Y | 0.309 | 0.2942 | 0.2942 | 0.2979 | 0.0148 | 0.0037 |
| BRIGHTNESS | 322.6 | 403.2 | 403.2 | 455 | -80.6 | 41.8 |

5000mm SINGLE CURVATURE (a)

|   | LEFT | INTERMEDIATE | | RIGHT | LEFT–RIGHT | RIGHT–LEFT |
|---|---|---|---|---|---|---|
| X X | 0.2823 | 0.2747 | 0.2747 | 0.2772 | 0.0076 | 0.0025 |
| Y Y | 0.3066 | 0.2969 | 0.2969 | 0.2996 | 0.0097 | 0.0027 |
| BRIGHTNESS | 296.9 | 406.2 | 406.2 | 443 | -109.3 | 36.8 |

FIG. 12

4000R MULTI CURVATURES (a)

|  | LEFT | INTERMEDIATE | RIGHT | LEFT–RIGHT | RIGHT–LEFT |
|---|---|---|---|---|---|
| X | 0.2812 | 0.2727 | 0.2748 | 0.0085 | 0.0021 |
| Y | 0.3013 | 0.2914 | 0.2904 | 0.0099 | −0.001 |
| BRIGHTNESS | 337.1 | 417.3 | 461.3 | −80.2 | 44 |

4500R MULTI CURVATURES (b)

|  | LEFT | INTERMEDIATE | RIGHT | LEFT–RIGHT | RIGHT–LEFT |
|---|---|---|---|---|---|
| X | 0.2781 | 0.2705 | 0.2727 | 0.0076 | 0.0022 |
| Y | 0.2996 | 0.2894 | 0.2966 | 0.0102 | 0.0072 |
| BRIGHTNESS | 319.3 | 407.8 | 445.5 | −88.5 | 37.7 |

5000R MULTI CURVATURES (c)

|  | LEFT | INTERMEDIATE | RIGHT | LEFT–RIGHT | RIGHT–LEFT |
|---|---|---|---|---|---|
| X | 0.2775 | 0.2701 | 0.2735 | 0.0074 | 0.0034 |
| Y | 0.2984 | 0.2872 | 0.2911 | 0.0112 | 0.0039 |
| BRIGHTNESS | 299.3 | 402.8 | 444.5 | −103.5 | 41.7 |

CURVED DISPLAY APPARATUS AND MULTI DISPLAY APPARATUS HAVING THE SAME

CROSS-REFERENCE TO RELATED APPLICATIONS

This application is a continuation of U.S. application Ser. No. 14/797,453, filed Jul. 13, 2015, which is a continuation of U.S. application Ser. No. 13/896,978, filed May 17, 2013, which claims the benefit under 35 U.S.C. § 119 from U.S. Provisional Application No. 61-648189, filed on May 17, 2012, at the United States Patent and Trademark Office, and Korean Patent Application Nos. 10-2012-0073323, filed on Jul. 5, 2012 and 10-2012-0124338, filed on Nov. 5, 2012 at the Korea Intellectual Property Office, the disclosures of which are incorporated herein by reference in their entireties.

BACKGROUND

1. Field

Exemplary embodiments consistent with the disclosure provided herein relate to a curved display apparatus and a multi display apparatus having the same, and more particularly, to a curved display apparatus having improved display characteristics and a multi display apparatus having the same.

2. Description of the Related Art

Liquid crystal displays have been adopted as displays for use in television receivers and are continuously being developed to have wider sizes to meet viewer's demands. The increasing size of the screen, however, is accompanied with a drawback of increased difference of viewpoints between when the viewer watches the center and when he or she watches left and right ends of the screen. Throughout the description, the term "viewpoint" as used herein may be defined as an angle between an eyeline of the observer who watches the screen and a tangent of the observed screen and the expression "difference of viewpoint" as used herein is defined as a difference of such angle.

Another shortcoming of a wide-screen television liquid crystal display is increasing glare-off. The problems associated with the difference of viewpoints can be dealt with by curving in the screen. However, when curved in, the display panel is subject to stress ('curvature stress'), which then leads to defective display performance as a result of problems such as a black mura defect or yellowish defect.

The mura defect is a contrast type defect in the region base, which is a phenomenon of pixel groups at a specific area being displayed brighter or darker than the rest of peripheral pixels, instead of being displayed with the same uniform brightness as the other pixels. The 'black mura' is the specific display defect in which a specific pixel group is displayed darker than the peripheral pixels. The mural defect can be defined as a different or abnormal light emitting area (of pixels on the substrate) in comparison to a peripheral area, or as patternized brightness non-uniformity (BMU).

Meanwhile, the 'yellowish defect' refers to a display defect according to which a displayed image contains yellowish color components. The yellowish defect can occur due to smaller transmissivity of B color pixels corresponding to blue color when the image is displayed in a combination of three colors, i.e., red (R), green (G) and blue (B) colors.

SUMMARY

Exemplary embodiments may overcome the above disadvantages and other disadvantages not described above. Also, exemplary embodiments are not required to overcome the disadvantages described above, and an exemplary embodiment may not overcome any of the problems described above.

A technical aspect of the exemplary embodiments is to provide a curved display apparatus which may include a display panel, and a fixation member which fixes the display panel so that the display panel is curved with multiple curvatures.

Another technical aspect of the exemplary embodiments is to provide a display apparatus which may include a display panel which displays an image, first and second members which respectively support the display panel at front and rear locations of the display panel so that the display panel is curved with multiple curvatures. The first and second members each provide support so that a first region of the display panel maintains a first curvature, a second region on a left side of the first region maintains a second curvature which is smaller than the first curvature, and a third region on a right side of the first region maintains a third curvature which is smaller than the first curvature.

Another technical aspect of the exemplary embodiments is to provide a curved display apparatus which may include a display panel which displays an image, and first and second members which support a front surface and a rear surface of the display panel so that curvatures on both sides of the display panel are maintained to be smaller than a curvature of a center of the display panel.

Another technical aspect of the exemplary embodiments is to provide a curved display apparatus which may include a display panel which displays an image, a backlight unit which is arranged in back of the display panel, and a top chassis and a bottom chassis which package the display panel and the backlight unit into a single module, and support the display panel so that the display panel is curved with multiple curvatures. A rear surface of the top chassis and a front surface of the bottom chassis each contact the display panel, and the rear surface of the top chassis and the front surface of the bottom chassis may each include a first supporting region which provides support so that a center of a curved region of the display panel with multiple curvatures maintains a first curvature, and second and third supporting regions which provide support so that sides of the display panel respectively maintain second and third curvatures which are smaller than the first curvature.

Another technical aspect of the exemplary embodiments is to provide a curved display apparatus which may include a display panel which displays an image, a backlight unit arranged in back of the display panel, a top chassis and a bottom chassis which package the display panel and the backlight unit into a single module, and a molding member arranged between the display panel and the bottom chassis. A rear surface of the top chassis and a front surface of the molding member are divided into a first supporting region which provides support so that a center of a curved region of the display panel with multiple curvatures maintains a first curvature, and second and third supporting regions which provide support so that sides of the display panel respectively maintain second and third curvatures which are smaller than the first curvature.

Another technical aspect of the exemplary embodiments is to provide a multi display apparatus having a plurality of display apparatuses, in which the plurality of display apparatuses may each include a display panel, and a fixation member which fixes the display panel so that the display panel is curved with multiple curvatures.

BRIEF DESCRIPTION OF THE DRAWINGS

The above and/or other aspects of the exemplary embodiments will be more apparent by illustrating certain exemplary embodiments with reference to the accompanying drawings, in which:

FIGS. 8 to 10 are views provided to explain light leaks occurring at the curved display apparatuses;

FIGS. 11 and 12 are views provided to explain color coordinates and brightness properties corresponding to the curved display apparatuses;

DETAILED DESCRIPTION OF EXEMPLARY EMBODIMENTS

Figure 1:
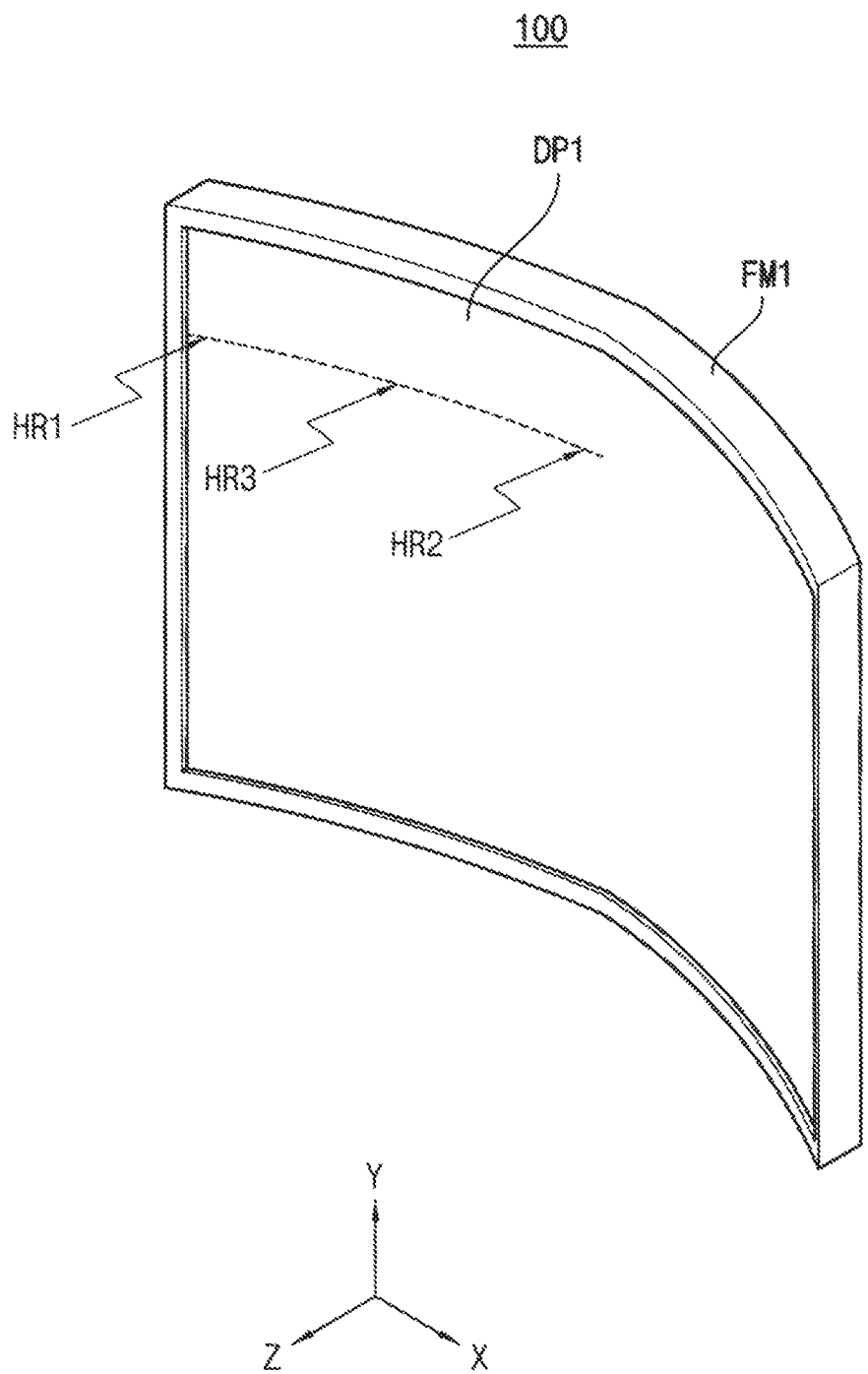
FIG. 1 is a perspective view provided to explain a curved display apparatus according to an exemplary embodiment.

Certain exemplary embodiments will now be described in greater detail with reference to the accompanying drawings.

In the following description, same drawing reference numerals are used for the same elements even in different drawings. The matters defined in the description, such as detailed construction and elements, are provided to assist in a comprehensive understanding of the exemplary embodiments. Accordingly, it is apparent that the exemplary embodiments can be carried out without those specifically defined matters. Also, well-known functions or constructions are not described in detail since they would obscure the exemplary embodiments with unnecessary detail.

The expressions used throughout the description will first be explained. It is understood that the following definitions are exemplary only.

The expression "horizontal radius of curvature" as used herein refers to a radius of curvature drawn in a parallel relationship with an X axis (i.e., in a horizontal direction), when viewed on XY plane. According to exemplary embodiments, a horizontal radius of curvature corresponds to a radius of a circular arc which approximates a curve at a corresponding point.

The expression "vertical curvature radium" as used herein refers to a radius of curvature drawn in a parallel relationship with a Y axis (i.e., in vertical direction), when viewed on an XY plane.

The expression "X color coordinates" as used herein refers to white X values on a CIE 1931 chromaticity diagram.

The expression "Y color coordinates" as used herein refers to white Y values on a CIE 1931 chromaticity diagram.

FIG. 1 is a perspective view provided to explain a curved display apparatus according to an exemplary embodiment. To take a more specific example, FIG. 1 illustrates a concave-curved display apparatus with a larger curvature corresponding to the center of a display member than the curvature corresponding to the peripheral area of the display member.

Referring to FIG. 1, the curved display apparatus 100 according to an embodiment includes a display member DP1 arranged in a landscape relationship to display an image, and a fixation member FM1 which fixes the display member DP1 at multiple curvatures and in a concave-curved manner.

The display member DP1 may have a flexible property. Also, the display member DP1 may have a curved form with a single curvature. Alternatively, the display member DP1 may be curved with multiple curvatures. Either the point of origin of the horizontal radius of curvature corresponding to the single curvature, or the respective points of origin of the horizontal radii of curvature corresponding to the multiple curvatures, may be formed on the front space (or to the viewer's side) of the display member DP1. As a result, the center of the display member DP1 is recessed from the viewer in a concave-curved form.

The fixation member FM1 is so curved that it has two or more horizontal radii of curvature, and fixes the display member DP1 to a curved form with multiplex curvatures.

If the display member DP1 has a flexible property, the fixation member FM1 fixes the display member DP1 so that the display member DP1 is curved with multiple curvatures.

Further, if the display member DP1 has a curved form of a single curvature, the fixation member FM1 varies the curvature of the display member DP1 so that the display member DP1 is curved with multiple curvatures.

Further, if the display member DP1 has multiple curvatures, the fixation member FM1 fixes the display member DP1 so that the display member DP1 maintains multiple curvatures.

For instance, the fixation member FM1 may fix the display member DP1 so that the horizontal radius of curvature of the display member DP1 linearly increases farther away from the center of the display member DP1. Accordingly, the display member DP1 may have a rounded V-shape.

In this case, if the fixation member FM1, curved with three horizontal radii of curvature, fixes the display member DP1, the display member DP1 is curved to have three horizontal radius of curvature. For example, the first horizontal radius of curvature HR1 corresponding to the edge portion of the display member DP1 may be larger than the second horizontal radius of curvature HR2 corresponding to the center, and the third horizontal radius of curvature HR3 corresponding to the intermediate area between the edge portion and the center is smaller than the first horizontal radius of curvature HR1 and larger than the second horizontal radius of curvature HR2.

The first, second and third horizontal radii of curvature HR1, HR2, HR3 may be, respectively, the averages of the horizontal radii of curvature corresponding to the edge portion, center and intermediate (middle) area of the display member DP1. That is, if there is a plurality of horizontal radii of curvature present on the edge portion of the display member DP1, the first horizontal radius of curvature HR1 may be an average of the above-mentioned horizontal radii of curvature. According to exemplary embodiments, the horizontal radii of curvature present on the edge portion of the display member DP1 may linearly increase in a direction moving closer to the edge of the display member DP1.

Examples of the horizontal radii of curvature which increase in a direction moving closer to the edge portion of the display member will be explained below with reference to FIGS. 2 to 4.

Figure 2:
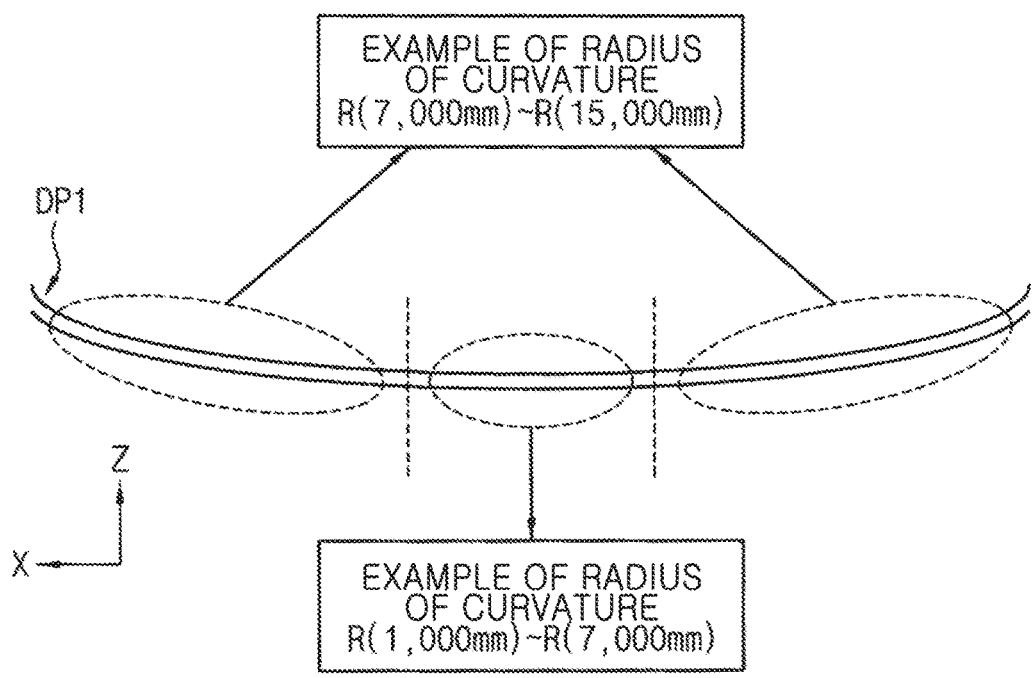
FIG. 2 is a schematic view provided to explain a display panel having two types of radii of curvature.

FIG. 2 is a schematic view provided to explain a display panel having two types of radii of curvature.

Referring to FIG. 2, the display panel is divided into three areas. That is, the display panel is divided into a center area, a left-peripheral area and a right-peripheral area.

The center area may be curved to have 1000 mm to 7000 mm of horizontal radius of curvature. The left- and right-peripheral areas may be curved to have 7000 mm to 15000 mm of horizontal radius of curvature.

Figure 3:
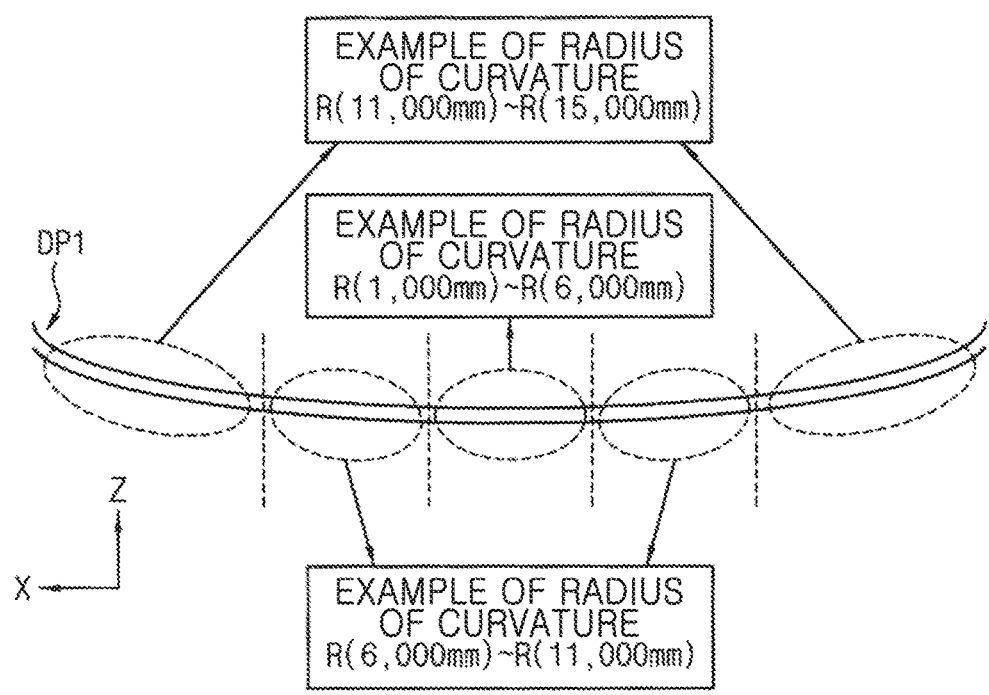
FIG. 3 is a schematic view provided to explain a display panel having three types of radius of curvature.

FIG. 3 is a schematic view provided to explain a display panel having three types of radius of curvature.

Referring to FIG. 3, the display panel is divided into five areas. That is, the display panel is divided into a center area, a left-peripheral area, a right-peripheral area, a left-middle area between the center area and the left-peripheral area, and a right-middle area between the center area and the right-peripheral area.

The center area may be curved to have 1000 mm to 6000 mm of horizontal radius of curvature. The left- and right-middle areas may be curved to have 6000 mm to 11000 mm of horizontal radius of curvature. The left- and right-peripheral areas may be curved to have 11000 mm to 15000 mm of horizontal radius of curvature.

Figure 4:
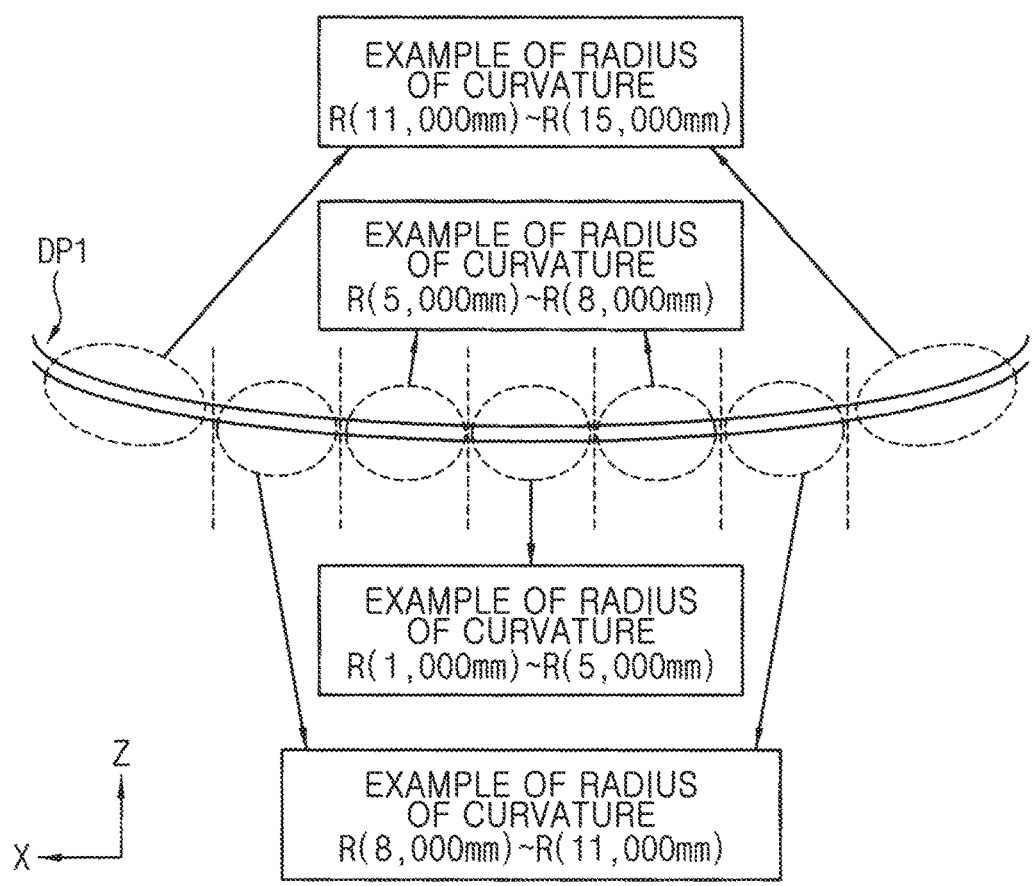
FIG. 4 is a schematic view provided to explain a display panel having four types of radii of curvature.

FIG. 4 is a schematic view provided to explain a display panel having four types of radii of curvature.

Referring to FIG. 4, the display panel is divided into seven areas. That is, the display panel is divided into a center area, a left-peripheral area, a right-peripheral area, a first left-middle area closer to the center area, a second left-middle area closer to the left-peripheral area, a first right-middle area closer to the center area, and the second right-middle area closer to the right-peripheral area.

The center area may be curved to have 1000 mm to 5000 mm of horizontal radius of curvature. The first left-middle and the first right-middle areas may be curved to have 5000 mm to 8000 mm of horizontal radius of curvature. The second left-middle area and the second right-middle area may be curved to have 8000 mm to 11000 mm of horizontal radius of curvature. The left- and right-peripheral areas may be curved to have 11000 mm to 15000 mm of horizontal radius of curvature. It is understood that the horizontal radii of curvature described above in connection with FIGS. 2 through 4 are exemplary only and may also have other values according to other exemplary embodiments.

Referring back to FIG. 1, the fixation member FM1 may fix the display member DP1 so that the horizontal radii of curvature of the display member DP1 linearly decrease in a direction moving farther from the center of the display member DP1. Accordingly, the display member DP1 may have an extended U-shape.

In this case, if the fixation member FM1 with three horizontal radii of curvature is curved to fix the display member DP1, the display member DP1 is curved to have three horizontal radii of curvature. For example, the first horizontal radius of curvature HR1 corresponding to the edge portion of the display member DP1 may be smaller than the second horizontal radius of curvature HR2 corresponding to the center portion, and the third horizontal radius of curvature HR3 corresponding to the intermediate area between the edge portion and the middle portion is larger than the first horizontal radius of curvature HR1 and smaller than the second horizontal radius of curvature HR2.

The first, second and third horizontal radii of curvature HR1, HR2, HR3 may be, respectively, the averages of the horizontal radii of curvature corresponding to the edge portion, center and middle area of the display member DP1. That is, if there is a plurality of horizontal radii of curvature present on the edge portion of the display member DP1, the first horizontal radius of curvature HR1 may be an average of the above-mentioned horizontal radii of curvature. At this time, the horizontal radii of curvature present on the edge portion of the display member DP1 may linearly decrease in a direction moving closer to the edge of the display member DP1.

In another example, the fixation member FM1 may fix the display member DP1 so that the display member DP1 has a horizontal radius of curvature non-linearly increasing farther away from the center of the display member DP1. Accordingly, the display member DP1 may have a rounded V shape.

In this case, if the fixation member FM1, curved with three horizontal radii of curvature, fixes the display member DP1, the display member DP1 is curved to have three horizontal radii of curvature. For example, the first horizontal radius of curvature HR1 corresponding to the edge portion of the display member DP1 is larger than the second horizontal radius of curvature HR2 corresponding to the center, and the third horizontal radius of curvature HR3 corresponding to the intermediate area between the edge portion and the center is smaller than the first horizontal radius of curvature HR1 and larger than the second horizontal radius of curvature HR2.

The first, second and third horizontal radii of curvature HR1, HR2, HR3 may be, respectively, the averages of the horizontal radii of curvature corresponding to the edge portion, center and middle area of the display member DP1. That is, if there is a plurality of horizontal radii of curvature present on the edge portion of the display member DP1, the first horizontal radius of curvature HR1 may be an average of the above-mentioned horizontal radii of curvature. At this time, the horizontal radii of curvature present on the edge portion of the display member DP1 may non-linearly increase in a direction moving closer to the edge of the display member DP1.

In yet another example, the fixation member FM1 may fix the display member DP1 so that the horizontal radii of curvature of the display member DP1 nonlinearly decrease in a direction moving farther from the center of the display member DP1. Accordingly, the display member DP1 may have an extended U-shape.

In this case, if the fixation member FM1 with three horizontal radii of curvature is curved to fix the display member DP1, the display member DP1 is curved to have three horizontal radii of curvature. For example, the first horizontal radius of curvature HR1 corresponding to the edge portion of the display member DP1 may be smaller than the second horizontal radius of curvature HR2 corresponding to the center portion HR1, and the third horizontal radius of curvature HR3 corresponding to the intermediate area between the edge portion and the middle portion is larger than the first horizontal radius of curvature HR1 and is smaller than the second horizontal radius of curvature HR2.

The first, second and third horizontal radii of curvature HR1, HR2, HR3 may be, respectively, the averages of the horizontal radii of curvature corresponding to the edge portion, center and middle area of the display member DP1. That is, if there is a plurality of horizontal radii of curvature present on the edge portion of the display member DP1, the first horizontal radius of curvature HR1 may be an average of the above-mentioned horizontal radii of curvature. At this time, the horizontal radii of curvature present on the edge portion of the display member DP1 may non-linearly decrease in a direction moving closer to the edge of the display member DP1.

Generally, when a display panel having two glass substrates sealed with sealant is curved, the high modulus of the sealant does not allow shear deformation, which results in a "buckling phenomenon." The "buckling phenomenon" causes uneven liquid crystal cell gaps. For example, while the center of the display panel is resistant to thermal or mechanical stress, the left and right sides of the display panel are relatively weak to thermal or mechanical stress. Meanwhile, depending on the curved display panel, the left or right sides of the display panel may be resistant against thermal or mechanical stress, while the center is relatively weak to thermal or mechanical stress. The liquid crystal display regulates a phase change rate of the light through a liquid crystal layer arranged in between a glass substrate (e.g., an array substrate) and another glass substrate (e.g., a color filter substrate). Light transmittance is decided based on the phase retardation between upper and lower polarization plates. That is, the phase retardation decides whether or not the light is passed. Generally, a glass substrate is not involved with the phase retardation, while the two polarization plates and the liquid crystal are involved with the phase retardation. However, when the glass substrate is subject to thermal or mechanical stress, the liquid crystal cell gap decreases or increases, resulting in phase retardation. Efforts to minimize the stress exerted on the stress-vulnerable area are necessary, particularly in a curved display apparatus utilizing a liquid crystal display.

In consideration of the above, the second horizontal radius of curvature in one exemplary embodiment may be set to any value from 1000 mm to 20000 mm. The third horizontal radius of curvature may be set to be larger than the second horizontal radius of curvature within a range of 1000 mm to 20000 mm, and the first horizontal radius of curvature may be set to be larger than the third horizontal radius of curvature within a range of 1000 mm to 20000 mm.

Accordingly, by constructing a display panel to have multiple curvatures, influence by thermal or mechanical stress can be reduced. As the influence due to thermal or mechanical stress is lessened, irregularly of liquid crystal cell gaps along the display panel can be prevented. As a result, display defects, such as a mura defect or a yellowish defect, which are caused due to a curved display panel under stress, can also be prevented.

Figure 5:
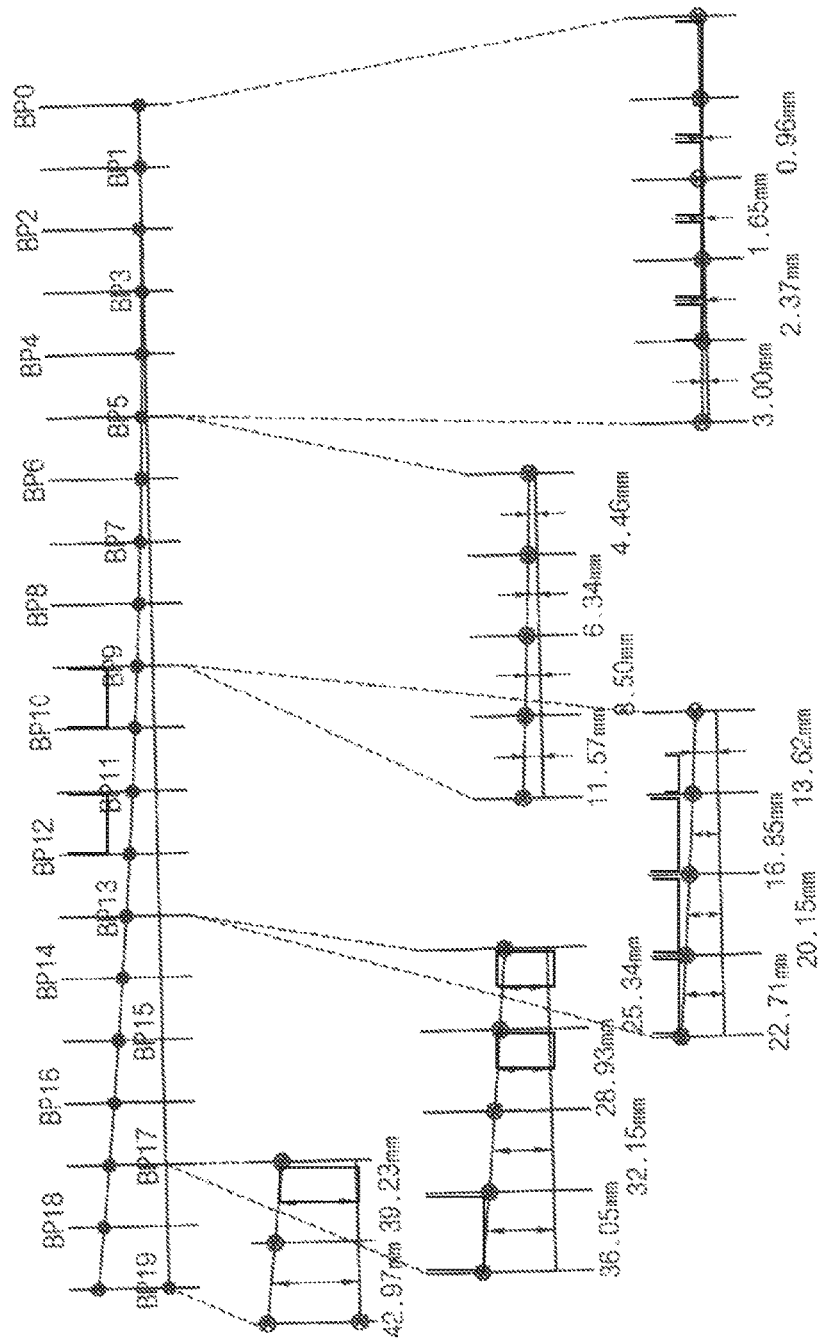
FIG. 5 is a conceptual view provided to explain multiple curvatures of the curved display apparatus of FIG. 1.

FIG. 5 is a conceptual view provided to explain multiple curvatures of the curved display apparatus 100 of FIG. 1. For convenience of explanation, the curved display apparatus is illustrated between center and right edge portions.

Referring to FIG. 5, variation portions, i.e., first to nineteenth variation portions BP1, BP2, BP3, . . . , BP18, BP19, are arranged at uniform intervals on a circular arc connecting the center and edge of the curved display apparatus.

The first variation portion BP1 closest to the center BP0 is at a height of approximately 0.96 mm away from the center BP0. The second variation portion BP2 next to the first variation portion BP1 is at height of approximately 1.65 mm from the center portion BP0.

The third variation portion BP3 next to the second variation portion BP2 is at a height of approximately 2.37 mm from the center portion BP0. The fourth variation portion BP4 next to the third variation portion BP3 is at a height of approximately 3.00 mm from the center portion BP0. In other words, the first and second variation portions BP1, BP2 are separated by a distance of 0.69 mm from each other, the second and third variation portions BP2, BP3 are separated by a distance of 0.72 mm from each other, and the third and fourth variation portions BP3, BP4 are separated by a distance of 0.63 mm from each other.

Further, the fifth variation portion BP5 next to the fourth variation portion BP4 is at a height of approximately 4.46 mm from the center portion BP0. The sixth variation portion BP6 next to the fifth variation portion BP5 is at a height of approximately 6.34 mm from the center portion BP0. The seventh variation portion BP7 next to the sixth variation portion B6 is at a height of approximately 8.50 mm from the center portion BP0. The eighth variation portion BP8 next to the seventh variation portion BP7 is at a height of approximately 11.57 mm from the center portion BP0. In other words, the fourth and fifth variation portions BP4, BP5 are separated by a distance of 1.46 mm from each other, the fifth and sixth variation portions BP5, BP6 are separated by a distance of 1.88 mm from each other, the sixth and seventh variation portions BP6, BP7 are separated by a distance of 2.16 mm from each other, and the seventh and eighth variation portions BP7, BP8 are separated by a distance of 3.07 mm from each other.

Further, the ninth variation portion BP9 next to the eighth variation portion BP8 is at a height of approximately 13.62 mm from the center portion BP0. The tenth variation portion BP10 next to the ninth variation portion BP9 is at a height of approximately 16.85 mm from the center portion BP0. The eleventh variation portion BP11 next to the tenth variation portion BP10 is at a height of approximately 20.15 mm from the center portion BP0. The twelfth variation portion BP12 next to the eleventh variation portion BP11 is at a height of approximately 22.71 mm from the center portion BP0. In other words, the eighth and ninth variation portions BP8, BP9 are separated by a distance of 2.05 mm from each other, the ninth and tenth variation portions BP9, BP10 are separated by a distance of 3.23 mm from each other, the tenth and eleventh variation portions BP10, BP11 are separated by a distance of 3.3 mm from each other, and the eleventh and twelfth variation portions BP11, BP12 are separated by a distance of 2.56 mm from each other.

Further, the thirteenth variation portion BP13 next to the twelfth variation portion BP12 is at height of approximately 25.34 mm from the center portion BP0. The fourteenth variation portion BP14 next to the thirteenth variation portion BP13 is at height of approximately 28.93 mm from the center portion BP0. The fifteenth variation portion BP15 next to the fourteenth variation portion BP14 is at a height of approximately 32.15 mm from the center portion BP0. The sixteenth variation portion BP16 next to the fifteenth variation portion BP15 is at a height of approximately 36.05 mm from the center portion BP0. In other words, the twelfth and thirteenth variation portions BP12, BP13 are separated by a distance of 2.63 mm from each other, the thirteenth and fourteenth variation portions BP13, BP14 are separated by a distance of 3.59 mm from each other, the fourteenth and fifteenth variation portions BP14, BP15 are separated by a distance of 3.22 mm from each other, and the fifteenth and sixteenth variation portions BP15, BP16 are separated by a distance of 3.97 mm from each other.

Further, the seventeenth variation portion BP17 next to the sixteenth variation portion BP16 is at a height of approximately 39.23 mm from the center portion BP0. The eighteenth variation portion BP18 next to the seventeenth variation portion BP17 is at a height of approximately 42.97 mm from the center portion BP0. The nineteenth variation portion BP19 next to the eighteenth variation portion BP18 is at a height of approximately 47.25 mm from the center portion BP0. In other words, the sixteenth and seventeenth variation portions BP16, BP17 are separated by a distance of 3.18 mm from each other, the seventeenth and eighteenth variation portions BP17, BP18 are separated by a distance of 3.74 mm from each other, and the eighteenth and nineteenth variation portions BP18, BP19 are separated by a distance of 4.28 mm from each other.

As explained above, by curving the display panel in a manner in which the curvature per unit length (i.e., radius of curvature) regularly decreases farther away from the center of the display panel, influence by thermal or mechanical stress that can occur along the curvature of the display panel can be reduced. For example, the left and right sides of the display panel may each have 6000 mm of radius of curvature, while the center of the display panel may have 3000 mm of radius of curvature. That is, multiple radii of curvature may be applied in accordance with a condition that the left and right sides of the display panel have greater radii of curvature than that of the center.

Figure 6:
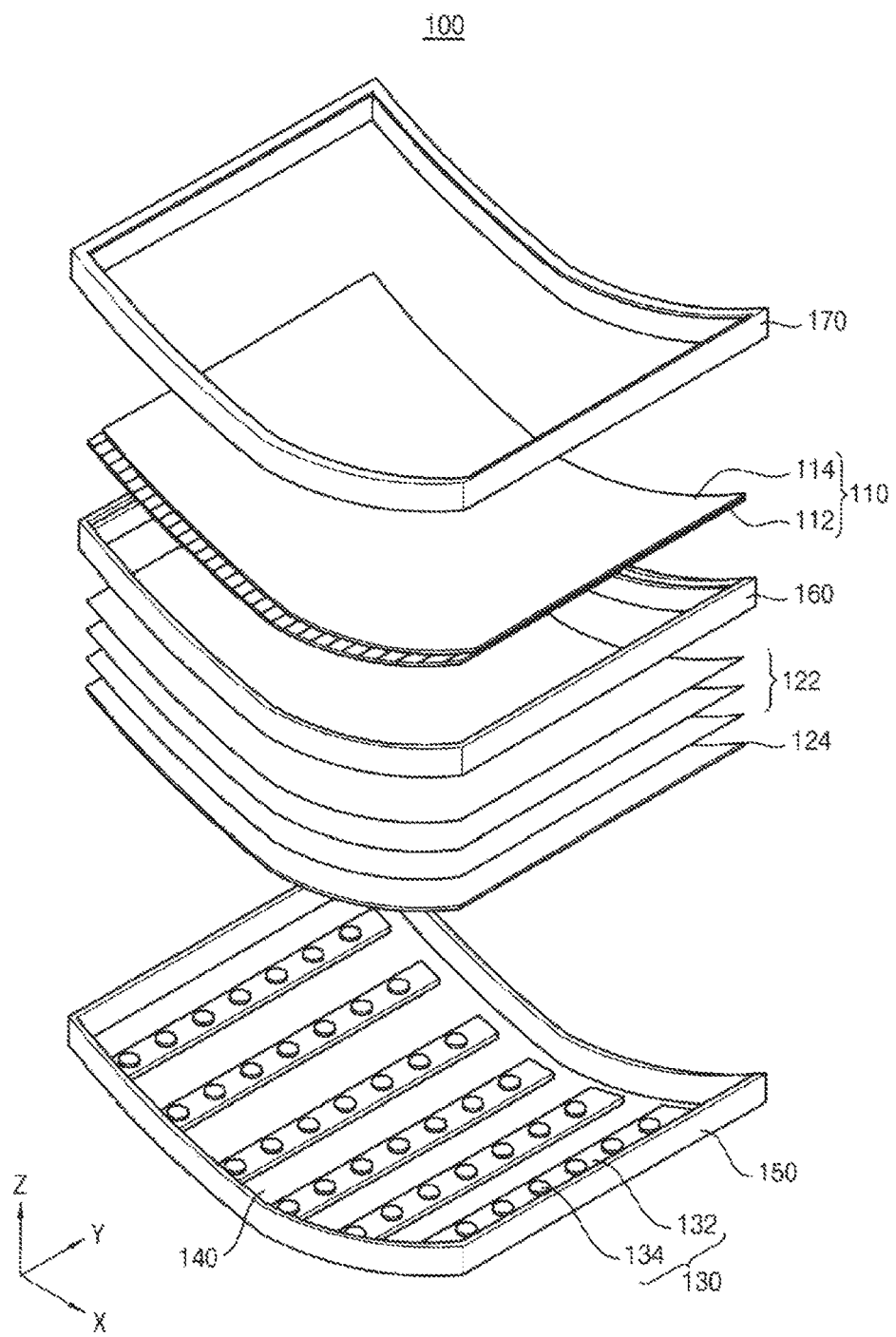
FIG. 6 is a schematic, exploded perspective view of the display apparatus 100 of FIG. 1.

FIG. 6 is a schematic, exploded perspective view of the display apparatus 100 of FIG. 1. FIG. 6 particularly illustrates a landscape-type, concave-curved display apparatus 100 having a direct type backlight assembly.

Referring to FIG. 6, the curved display apparatus 100 includes a display panel 110, a backlight assembly and a fixation member. The display panel 110 and the backlight assembly are defined as a display member throughout the description. The curved display apparatus 100 of FIG. 6 may be implemented as a middle-sized display apparatus such as a computer monitor, or a large-sized display apparatus having a wide screen such as a wide-screen television.

The display panel 110 may include an array substrate 112, a color filter substrate 114 facing the array substrate 112 and a liquid crystal layer (not illustrated) interposed between the array substrate 112 and the color filter substrate 114. The color filter substrate 114 may be smaller in size than the array substrate 112. Accordingly, a portion uncovered by the color filter substrate 114 is exposed. A pad portion is formed on the exposed portions.

The array substrate 112 has thin film transistors (TFT) in matrix form as switching devices. Data lines and gate lines are connected to source and gate terminals of the TFTs, and pixel electrodes formed from transparent conductive material are connected to the drain terminals. On the non-display area of the array substrate 112 is arranged a data pad portion extended from the data lines. Although not illustrated, the gate pad portion extended from the gate lines may additionally be arranged.

The color filter substrate 114 is arranged opposite to the array substrate 112 and has RGB pixels provided in membrane form to express colors. On the color filter substrate 114 is formed a common electrode formed from transparent conductive material, opposite to the pixel electrodes formed on the array substrate 112.

According to exemplary embodiments, the display panel 110 may include an array substrate having a color filter formed thereon, and an opposite substrate on which the common electrode is formed, facing the array substrate.

In the display panel 110, as the TFTs are turned on with the electricity applied through the gate terminals thereof, an electric field is formed between the pixel electrodes and the common electrodes. The liquid crystal arrangement of the liquid crystal layer interposed between the array substrate 112 and the color filter substrate 114 is varied according to the electric field, and accordingly, light transmittance is varied in accordance with the varied liquid crystal arrangement to thus express an image of intended grayscale.

The display panel 110 may additionally include a first polarization film (not illustrated) arranged on a lower side of the array substrate 112, and a second polarization film (not illustrated) arranged on an upper side of the color filter substrate 114. The first polarization film includes a transmittance axis of first direction to thus polarize the light to the first direction. The second polarization film includes a transmittance axis of a second direction, to thus polarize the light to the second direction. For example, the transmittance axes of the first and second polarization films may be arranged perpendicularly to each other.

The backlight assembly is arranged on the lower portion of the display panel 110 to provide the display panel 110 with the light. Generally, the backlight assembly is classified as either a direct type or an edge type. A direct type backlight assembly has a plurality of light sources arranged on the lower surface of a diffusion plate 124 to advance the light to the back side of the display panel 110. In contrast, an edge type backlight assembly includes a plurality of light sources arranged to face the side of a light guide panel, and a plurality of optical sheets 122 arranged between the display panel 110 and the light guide panel. The edge type backlight assembly changes a line or point of light fed from the light sources into planar light transmitted through the light guide panel, and advances the converted planar light to the back side of the display panel 110 through the optical sheets 122.

In one exemplary embodiment, the backlight assembly is a direct type backlight assembly. The backlight assembly may include a light source module 130, optical sheets 122, a diffusion plate 124, a reflection plate 140, a bottom chassis 150 and a molding member 160.

The light source module 130 includes a plurality of light emitting diode (LED) packages 132 with a plurality of LEDs mounted thereon, and a printed circuit board (PCB) 134 on which the ED packages 132 are mounted. On the PCD 134 is formed a plurality of signal lines (not illustrated) to feed driving voltage to the LED packages 132. The light source module 130 may be arranged in accordance with a direction which is parallel to a shorter side of the display panel 110. Alternatively, the light source module 130 may be arranged in accordance with a direction which is parallel to a larger side of the display panel 110.

The optical sheets 122 are arranged on the upper portion of the diffusion plate 124 to increase the efficiency of the incoming light fed from the diffusion plate 124. The optical sheets 122 may include a diffusion sheet to re-diffuse the light which is diffused at the diffusion plate 124 and a prism sheet to converge the light diffused at the diffusion sheet to a front surface. For example, the prism sheet may include a vertical prism sheet to focus the light in the vertical direction, and a horizontal prism sheet to focus the light in the horizontal direction.

The reflection plate 140 is arranged on a lower portion of the light source module 130 to reflect the incoming light fed from the light source module 130.

The bottom chassis 150 includes a bottom portion and sidewalls extended from edges of the bottom portion of the bottom chassis 150 to define an accommodating space therein. The bottom chassis 150 is arranged below the display panel 110, to accommodate the reflection plate 140, the diffusion plate 124, the light source module 130 and the optical sheets 122. The light source module 130 may be arranged on one of the sidewalls of the bottom chassis 150. Alternatively, the light source module 130 may be arranged on the bottom portion of the bottom chassis 150.

The molding member 160 is arranged between the display panel 110 and the bottom chassis 150, has multiple curvatures, supports the display panel 110 and fixes the optical sheets 122, the diffusion plate 124 and the reflection plate 140 to the bottom chassis 150.

The curved display apparatus 100 may additionally include a driving PCB (not illustrated) to drive the display panel 110.

A top chassis 170 is arranged on the display panel 110, has multiple curvatures, and fixes the display panel 110 via coupling with the bottom chassis 150. The top chassis 170 protects the display panel 110 from external impact. On the upper surface of the top chassis 170 is formed a window to expose the display area of the display panel 110 to outside.

The fixation member includes the top chassis 170 and fixes the display panel 110 so that the display panel 110 is curved with multiple curvatures.

In one exemplary embodiment, the light source module 130 may include LED packages 132 and a PCT 134. However, in another exemplary embodiment, the light source module 130 may include a plurality of cathode fluorescent lamps (CCFL).

Figure 7:
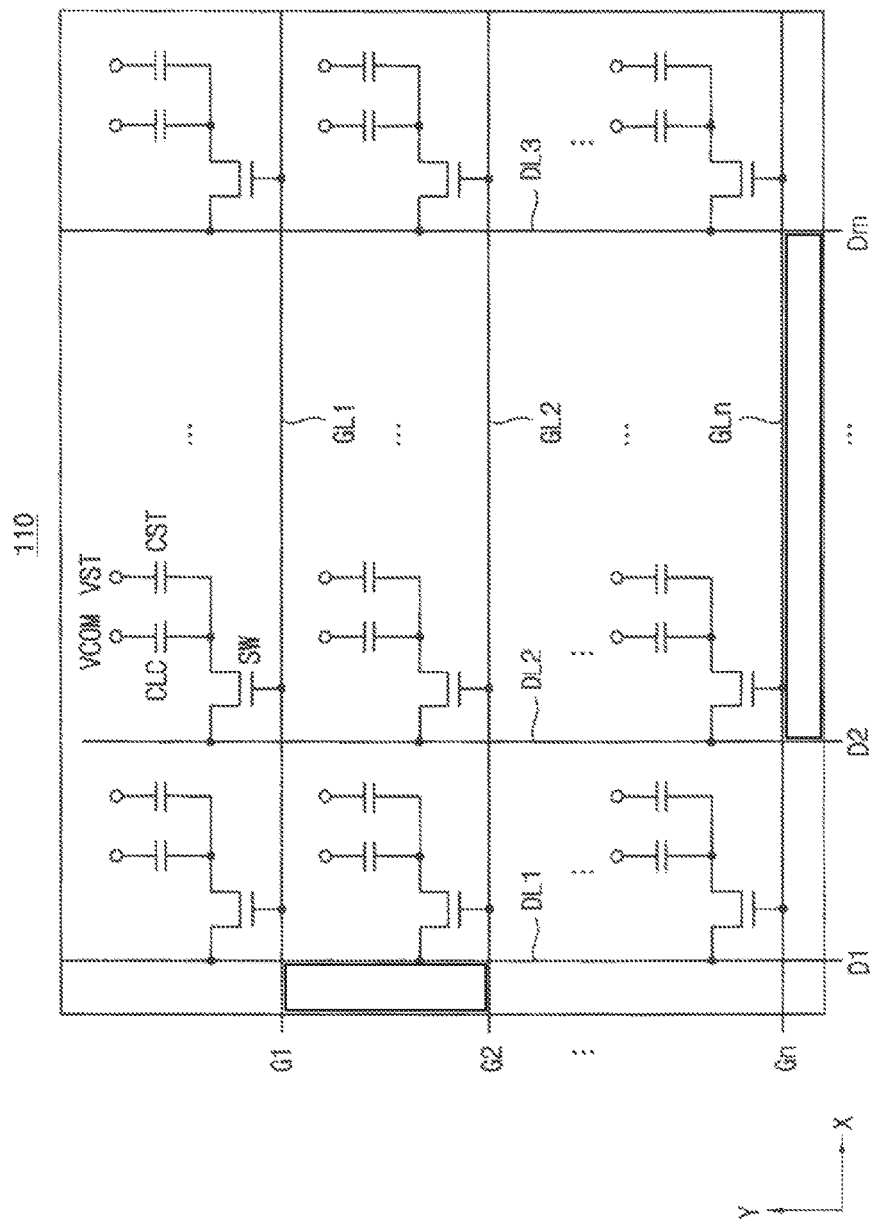
FIG. 7 is an equivalent circuit diagram provided to explain the display panel 110 of FIG. 6.

FIG. 7 is an equivalent circuit diagram provided to explain the display panel 110 of FIG. 6.

Referring to FIG. 7, the display panel 110 includes a plurality of data lines D1, D2, . . . , Dm (m=natural number), a plurality of gate lines G1 G2, . . . , Gn (n=natural number), a plurality of switching devices SW, a plurality of liquid crystal capacitors (CLC), and a plurality of storage capacitors (CST).

The data lines D1, D2, . . . , Dm are extended in a Y-axis direction, and arranged in an X-axis direction.

The gate lines G,1 G2, . . . , Gn are extended in an X-axis direction, and arranged in a Y-axis direction. In one exemplary embodiment, the gate lines G,1 G2, . . . , Gn each have a longer length than the data lines D1, D2, . . . , Dm.

The switching device SW includes a source electrode connected to the data lines, a gate electrode connected to the gate lines, and a drain electrode connected to the CLC and CST.

The CLC is connected to the drain electrode of the switching device SW at one end, and connected to the common voltage end (VCOM) at the other end.

The CST is connected to the drain electrode of the switching device SW at one end, and connected to the storage voltage end (VST) at the other end.

In one exemplary embodiment, the gate lines G1, G2, . . . , Gn are curved with multiple curvatures, with the display panel arranged in landscape fashion.

Figure 10:
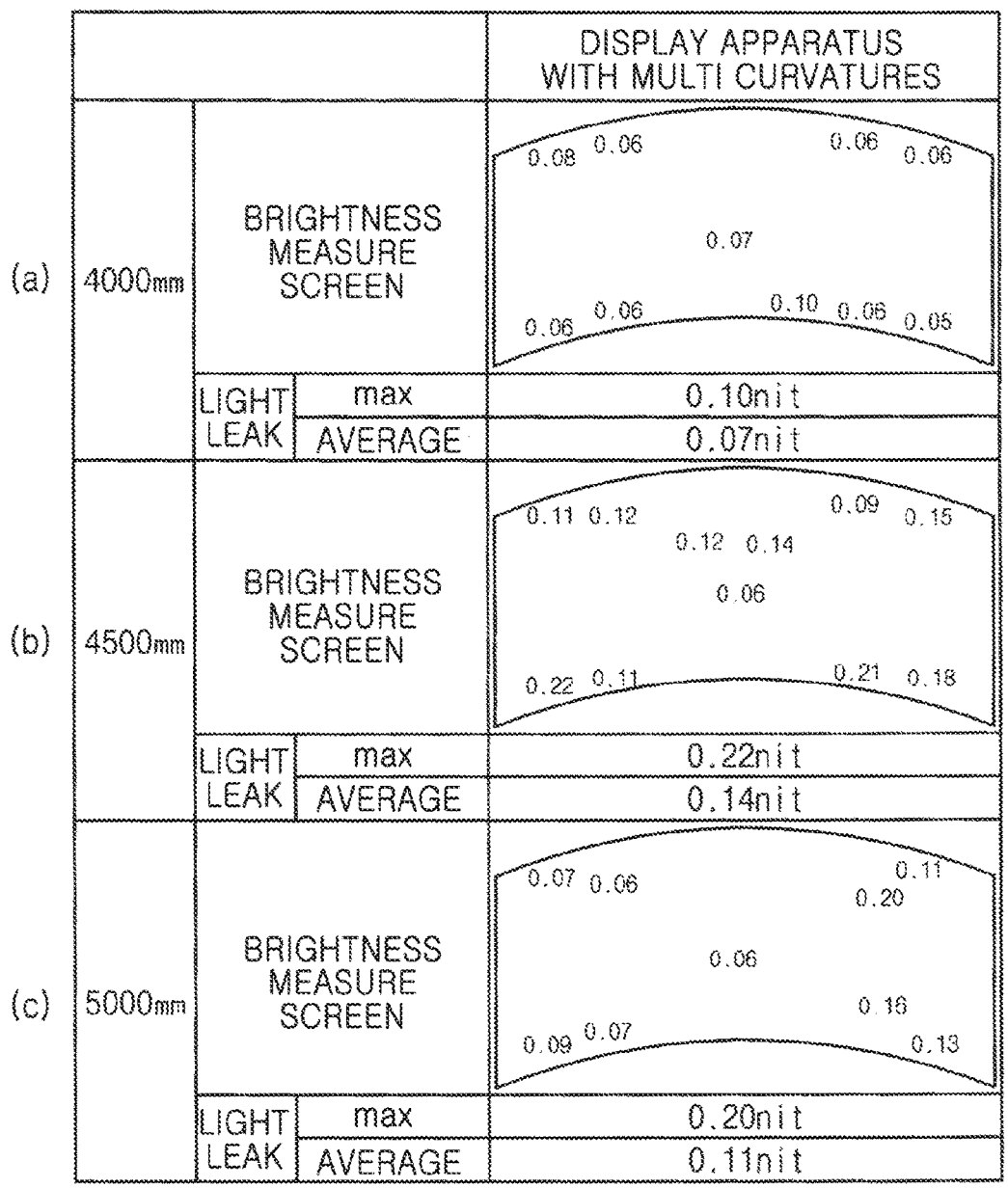

FIGS. 8 to 10 are views provided to explain light leaks occurring at the curved display apparatuses with a single curvature and curved display apparatuses with multiple curvatures. The effects of a black mura defect will be particularly explained below with reference to FIGS. 8 to 10.

Referring to FIG. 8(a), a black screen was displayed on a flat display apparatus according to a first comparative example, in which 0.07 nit of light leak was observed corresponding to the center, and 0.07 nit and 0.06 nit of light leak were observed corresponding to the left upper portion and left lower portion, respectively. Further, 0.08 nit and 0.11 nit of light leaks were observed corresponding to the right upper portion and right lower portion, respectively. Further, 0.14 nit of light leak was observed at an area adjoining the right upper portion, and 0.13 nit of light leak was observed at an area adjoining the right lower portion. In summary, when the black screen was displayed on the flat display apparatus according to the first comparative example, a maximum light leak of 0.14 nit was observed and an average light leak of 0.09 nit was calculated.

Referring to FIG. 8(b), a black screen was displayed on a flat display apparatus according to a second comparative example, in which 0.07 nit of light leak was observed corresponding to the center, and 0.04 nit and 0.06 nit of light leak were observed corresponding to the left upper portion and left lower portion, respectively. Further, 0.09 nit and 0.1 nit of light leaks were observed corresponding to the right upper portion and the right lower portion, respectively. Further, 0.15 nit of light leak was observed at an area adjoining the right upper portion, and 0.14 nit of light leak was observed at an area adjoining the right lower portion. In summary, when the black screen was displayed on the flat display apparatus according to the second comparative example, a maximum light leak of 0.15 nit was observed and an average light leak of 0.09 nit was calculated.

Referring to FIG. 8(c), a black screen was displayed on a flat display apparatus according to a third comparative example, in which 0.06 nit of light leak was observed corresponding to the center, and 0.05 nit and 0.08 nit of light leak were observed corresponding to the left upper portion and left lower portion, respectively. Further, 0.12 nit and 0.11 nit of light leaks were observed corresponding to the right upper portion and the right lower portion, respectively. Further, 0.20 nit of light leak was observed at an area adjoining the right upper portion, and 0.18 nit of light leak was observed at an area adjoining the right lower portion. In summary, when the black screen was displayed on the flat display apparatus according to the third comparative example, the maximum light leak of 0.20 nit was observed and an average light leak of 0.11 nit was calculated.

Referring to FIG. 9(a), a curved display apparatus according to a fourth comparative example is a modified form of the flat display apparatus of the first comparative example, in which the curved display apparatus according to the fourth comparative example has a single radius of curvature of 4000 mm. When the black screen was displayed on the curved display apparatus according to the fourth comparative example, 0.08 nit of light leak was observed corresponding to the center, and 0.63 nit and 0.52 nit of light leak were observed corresponding to the left upper portion and left lower portion, respectively. Further, 0.43 nit of light leak was observed at an area adjoining the left upper portion, and 0.24 nit of light leak was observed at an area adjoining the left lower portion. Further, 0.69 nit and 0.51 nit of light leak were observed corresponding to the right upper portion and right lower portion, respectively. Further, 0.18 nit of light leak was observed at an area adjoining the right upper portion, and 0.28 nit of light leak was observed at an area adjoining the right lower portion. In summary, when the black screen was displayed on the curved display apparatus according to the fourth comparative example, a maximum light leak of 0.69 nit was observed and an average light leak of 0.44 nit was calculated.

Referring to FIG. 9(b), a curved display apparatus according to a fifth comparative example is a modified form of the flat display apparatus of the second comparative example, in which the curved display apparatus according to the fifth comparative example has a single radius of curvature of 4500 mm. When the black screen was displayed on the curved display apparatus according to the fifth comparative example, 0.08 nit of light leak was observed corresponding to the center, and 0.49 nit and 0.4 nit of light leak were observed corresponding to the left upper portion and left lower portion, respectively. Further, 0.21 nit of light leak was observed at an area adjoining the left upper portion, and 0.2 nit of light leak was observed at an area adjoining the left lower portion. Further, 0.52 nit and 0.48 nit of light leak were observed corresponding to the right upper portion and right lower portion, respectively. Further, 0.25 nit of light leak was observed at an area adjoining the right upper portion, and 0.25 nit of light leak was observed at an area adjoining the right lower portion. In summary, when the black screen was displayed on the curved display apparatus according to the fifth comparative example, a maximum light leak of 0.52 nit was observed and an average light leak of 0.35 nit was calculated.

Referring to FIG. 9(c), a curved display apparatus according to a sixth comparative example is a modified form of the flat display apparatus of the third comparative example, in which the curved display apparatus according to the fifth comparative example has a single radius of curvature of 5000 mm. When the black screen was displayed on the curved display apparatus according to the sixth comparative example, 0.08 nit of light leak was observed corresponding to the center, and 0.5 nit and 0.27 nit of light leak were observed corresponding to the left upper portion and left lower portion, respectively. Further, 0.16 nit of light leak was observed at an area adjoining the left upper portion, and 0.29 nit of light leak was observed at an area adjoining the left lower portion. Further, 0.38 nit and 0.52 nit of light leak were observed corresponding to the right upper portion and right lower portion, respectively. Further, 0.24 nit of light leak was observed at an area adjoining the right upper portion, and 0.19 nit of light leak was observed at an area adjoining the right lower portion. In summary, when the black screen is displayed on the curved display apparatus according to the sixth comparative example, a maximum light leak of 0.52 nit was observed and an average light leak of 0.32 nit was calculated.

Referring to FIG. 10(a), a curved display apparatus according to a first exemplary embodiment is a modified form of the curved display apparatus of the fourth comparative example, in which the curved display apparatus according to the first exemplary embodiment has multiple radii of curvature between approximately 4000 mm and approximately 4200 mm. When the black screen was displayed on the curved display apparatus according to the first exemplary embodiment, 0.07 nit of light leak was observed corresponding to the center, and 0.08 nit and 0.06 nit of light leak were observed corresponding to the left upper portion and left lower portion, respectively. Further, 0.06 nit of light leak was observed at an area adjoining the left upper portion, and 0.06 nit of light leak was observed at an area adjoining the left lower portion. Further, 0.06 nit and 0.05 nit of light leak were observed corresponding to the right upper portion and right lower portion, respectively. Further, 0.06 nit of light leak was observed at an area adjoining the right upper portion, and 0.06 nit of light leak was observed at an area adjoining the right lower portion. In summary, when the black screen was displayed on the curved display apparatus according to the first exemplary embodiment, a maximum light leak of 0.10 nit was observed and an average light leak of 0.07 nit was calculated.

Accordingly, it was confirmed that the curved display apparatus according to the first exemplary embodiment has both a maximum light leak and an average light leak which are smaller than those of the flat display apparatus according to the first comparative example. Further, it was confirmed that the curved display apparatus according to the first exemplary embodiment has both a maximum light leak and an average light leak which are smaller than those of the curved display apparatus according to the fourth comparative example.

Accordingly, the curved display apparatus with multiple curvatures according to the first exemplary embodiment can prevent the occurrence of black mura more efficiently than a curved display apparatus with a single curvature, such as the curved display apparatus according to the fourth comparative example.

Referring to FIG. 10(b), a curved display apparatus according to a second exemplary embodiment is a modified form of the curved display apparatus of the fifth comparative example, in which the curved display apparatus according to the second exemplary embodiment has multiple radii of curvature between approximately 4500 mm and approximately 4700 mm. When the black screen was displayed on the curved display apparatus according to the second exemplary embodiment, 0.06 nit of light leak was observed corresponding to the center, and 0.11 nit and 0.22 nit of light leak were observed corresponding to the left upper portion and left lower portion, respectively. Further, 0.12 nit of light leak was observed at an area adjoining the left upper portion, and 0.11 nit of light leak was observed at an area adjoining the left lower portion. Further, 0.15 nit and 0.18 nit of light leak were observed corresponding to the right upper portion and right lower portion, respectively. Further, 0.09 nit of light leak was observed at an area adjoining the right upper portion, and 0.21 nit of light leak was observed at an area adjoining the right lower portion. In summary, when the black screen was displayed on the curved display apparatus according to the second exemplary embodiment, a maximum light leak of 0.22 nit was observed and an average light leak of 0.14 nit was calculated.

Accordingly, it was confirmed that the curved display apparatus according to the second exemplary embodiment has both a maximum light leak and an average light leak which are larger than those of the flat display apparatus according to the second comparative example. However, it was confirmed that the curved display apparatus according to the second exemplary embodiment has both a maximum light leak and an average light leak which are smaller than those of the curved display apparatus according to the fifth comparative example.

Accordingly, the curved display apparatus with multiple curvatures according to the second exemplary embodiment can prevent the occurrence of black mura more efficiently than a curved display apparatus with a single curvature, such as the one according to the fifth comparative example.

Referring to FIG. 10(c), a curved display apparatus according to a third exemplary embodiment is a modified form of the curved display apparatus of the sixth comparative example, in which the curved display apparatus according to the third exemplary embodiment has multiple radii of curvature between approximately 5000 mm and approximately 5200 mm. When the black screen was displayed on the curved display apparatus according to the third exemplary embodiment, 0.06 nit of light leak was observed corresponding to the center, and 0.07 nit and 0.09 nit of light leak were observed corresponding to the left upper portion and left lower portion, respectively. Further, 0.06 nit of light leak was observed at an area adjoining the left upper portion, and 0.07 nit of light leak was observed at an area adjoining the left lower portion. Further, 0.11 nit and 0.13 nit of light leak were observed corresponding to the right upper portion and right lower portion, respectively. Further, 0.20 nit of light leak was observed at an area adjoining the right upper portion, and 0.16 nit of light leak was observed at an area adjoining the right lower portion. In summary, when the black screen was displayed on the curved display apparatus according to the third exemplary embodiment, a maximum light leak of 0.20 nit was observed and an average light leak of 0.11 nit was calculated.

Accordingly, it was confirmed that the curved display apparatus according to the third exemplary embodiment has both a maximum light leak and an average light leak equal to those of the flat display apparatus according to the third comparative example. However, it was confirmed that the curved display apparatus according to the third exemplary embodiment has both a maximum light leak and an average light leak which are smaller than those of the curved display apparatus according to the sixth comparative example.

Accordingly, the curved display apparatus with multiple curvatures according to the third exemplary embodiment can prevent occurrence of black mura more efficiently than a curved display apparatus with a single curvature, such as the one according to the sixth comparative example.

FIGS. 11 and 12 are views provided to explain color coordinates and brightness properties corresponding to the curved display apparatuses with single curvature and curved display apparatuses with multiple curvatures, respectively. The improvement of yellowish defect will be particularly explained below with reference to FIGS. 11 and 12.

Referring to FIG. 11(a), regarding the curved display apparatus according to the fourth comparative example, X color coordinate, Y color coordinate and brightness corresponding to the left portion were observed as 0.2867, 0.3097 and 315 nit, respectively. The X color coordinate, Y color coordinate and brightness corresponding to the center were observed as 0.2754, 0.2988 and 427 nit, respectively. The X color coordinate, Y color coordinate and brightness corresponding to the right portion were observed as 0.2793, 0.3027 and 455 nit, respectively. Subtracting the right portion from the left portion gives differences of the X color coordinate, Y color coordinate and brightness which are: 0.0113, 0.0109 and −112, respectively. Further, subtracting the left portion from the right portion gives differences of the X color coordinate, Y color coordinate and brightness which are: 0.0039, 0.0039 and 28, respectively.

Referring to FIG. 11(b), regarding the curved display apparatus according to the fifth comparative example, X color coordinate, Y color coordinate and brightness corresponding to the left portion were observed as 0.2847, 0.309 and 322.6 nit, respectively. The X color coordinate, Y color coordinate and brightness corresponding to the center were observed as 0.273, 0.2942 and 403.2 nit, respectively. The X color coordinate, Y color coordinate and brightness corresponding to the right portion were observed as 0.2774, 0.2979 and 455 nit, respectively. Subtracting the right portion from the left portion gives differences of the X color coordinate, Y color coordinate and brightness which are: 0.0117, 0.0148 and −80.6, respectively. Further, subtracting the left portion from the right portion gives differences of the X color coordinate, Y color coordinate and brightness which are: 0.0044, 0.0037 and 41.8, respectively.

Referring to FIG. 11(c), regarding the curved display apparatus according to the sixth comparative example, X color coordinate, Y color coordinate and brightness corresponding to the left portion were observed as 0.2823, 0.3066 and 296.9 nit, respectively. The X color coordinate, Y color coordinate and brightness corresponding to the center were observed as 0.2747, 0.2969 and 406.2 nit, respectively. The X color coordinate, Y color coordinate and brightness corresponding to the right portion were observed as 0.2772, 0.2996 and 443 nit, respectively. Subtracting the right portion from the left portion gives differences of the X color coordinate, Y color coordinate and brightness which are: 0.0076, 0.0097 and −109.3, respectively. Further, subtracting the left portion from the right portion gives differences of the X color coordinate, Y color coordinate and brightness which are 0.0025, 0.0027 and 36.8, respectively.

FIG. 12 illustrates X color coordinate, Y color coordinate and brightness properties of the curved display apparatuses with multiple curvatures of FIG. 10 according to the first, second and third exemplary embodiments.

Referring to FIG. 12(a), regarding the curved display apparatus according to the first exemplary embodiment, X color coordinate, Y color coordinate and brightness corresponding to the left portion were observed as 0.2812, 0.3013 and 337.1 nit, respectively. The X color coordinate, Y color coordinate and brightness corresponding to the center were observed as 0.2727, 0.2914 and 417.3 nit, respectively. The X color coordinate, Y color coordinate and brightness corresponding to the right portion were observed as 0.2748, 0.2904 and 461.3 nit, respectively. Subtracting the right portion from the left portion gives differences of the X color coordinate, Y color coordinate and brightness which are: 0.0085, 0.0099 and −80.2, respectively. Further, subtracting the left portion from the right portion gives differences of the X color coordinate, Y color coordinate and brightness which are 0.0021, −0.001 and 44, respectively.

It was confirmed that the curved display apparatus according to the first exemplary embodiment has smaller X color coordinates than those of the curved display apparatus according to the fourth comparative example, at each of the left portion, the center and the right portion. Further, it was confirmed that the curved display apparatus according to the first exemplary embodiment has smaller Y color coordinates than those of the curved display apparatus according to the fourth comparative example, at each of the left portion, the center and the right portion. Considering the smaller X and Y color coordinates, it was confirmed that the color gamut moved to blue in the first exemplary embodiment. Accordingly, the curved display apparatus according to the first exemplary embodiment has a weaker yellowish defect than the curved display apparatus according to the fourth comparative example.

Referring to FIG. 12(b), regarding the curved display apparatus according to the second exemplary embodiment, X color coordinate, Y color coordinate and brightness corresponding to the left portion were observed as 0.2781, 0.2996 and 319.3 nit, respectively. The X color coordinate, Y color coordinate and brightness corresponding to the center were observed as 0.2705, 0.2894 and 407.8 nit, respectively. The X color coordinate, Y color coordinate and brightness corresponding to the right portion were observed as 0.2727, 0.2966 and 445.5 nit, respectively. Subtracting the right portion from the left portion gives differences of the X color coordinate, Y color coordinate and brightness which are: 0.0076, 0.0102 and −88.5, respectively. Further, subtracting the left portion from the right portion gives differences of the X color coordinate, Y color coordinate and brightness which are 0.0022, 0.0072 and 37.7, respectively.

It was confirmed that the curved display apparatus according to the second exemplary embodiment has smaller X color coordinates than those of the curved display apparatus according to the fifth comparative example, at each of the left portion, the center and the right portion. Further, it was confirmed that the curved display apparatus according to the second exemplary embodiment has smaller Y color coordinates than those of the curved display apparatus according to the fifth comparative example, at each of the left portion, the center and the right portion. Considering the smaller X and Y color coordinates, it was confirmed that the color gamut moved to blue in the second exemplary embodiment. Accordingly, the curved display apparatus according to the second exemplary embodiment has a weaker yellowish defect than the curved display apparatus according to the fifth comparative example.

Referring to FIG. 12(c), regarding the curved display apparatus according to the third exemplary embodiment, X color coordinate, Y color coordinate and brightness corresponding to the left portion were observed as 0.2775, 0.2984 and 299.3 nit, respectively. The X color coordinate, Y color coordinate and brightness corresponding to the center were observed as 0.2701, 0.2872 and 402.8 nit, respectively. The X color coordinate, Y color coordinate and brightness corresponding to the right portion were observed as 0.2735, 0.2911 and 444.5 nit, respectively. Subtracting the right portion from the left portion gives differences of the X color coordinate, Y color coordinate and brightness which are: 0.0074, 0.0112 and −103.5, respectively. Further, subtracting the left portion from the right portion gives differences of the X color coordinate, Y color coordinate and brightness which are 0.0034, 0.0039 and 41.7, respectively.

It was confirmed that the curved display apparatus according to the third exemplary embodiment has smaller X color coordinates than those of the curved display apparatus according to the sixth comparative example, at each of the left portion, the center and the right portion. Further, it was confirmed that the curved display apparatus according to the third exemplary embodiment has smaller Y color coordinates than those of the curved display apparatus according to the sixth comparative example, at each of the left portion, the center and the right portion.

Considering the smaller X and Y color coordinates, it was confirmed that the color gamut moved to blue. Accordingly, the curved display apparatus according to the third exemplary embodiment has a weaker yellowish defect than the curved display apparatus according to the sixth comparative example.

Figure 13:
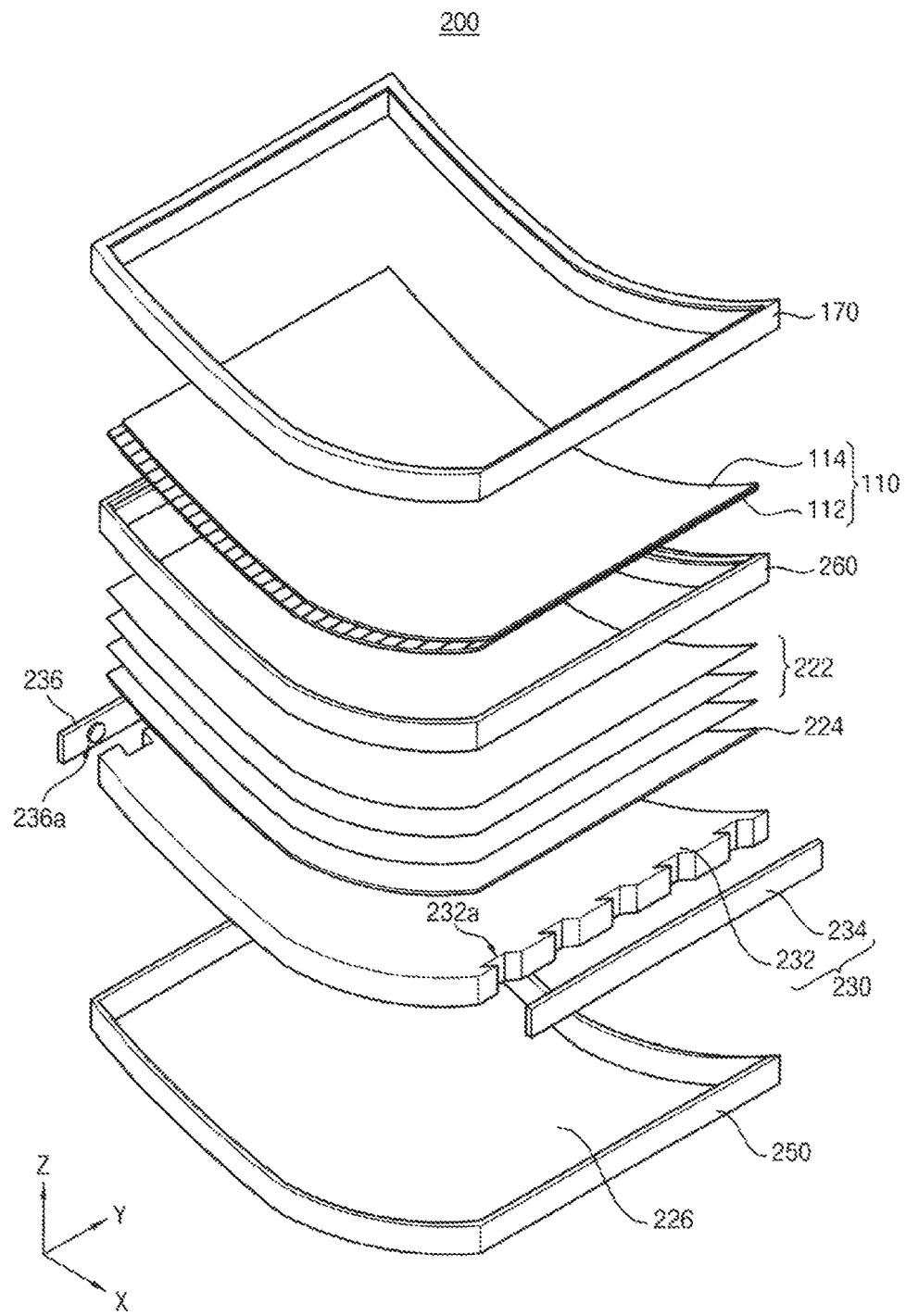
FIG. 13 is a schematic, exploded perspective view of the curved display apparatus of FIG. 1 according to another example.

FIG. 13 is a schematic, exploded perspective view of the curved display apparatus of FIG. 1 according to another example. FIG. 13 particularly illustrates a landscape-type, concave-curved display apparatus 200 having an edge-type backlight assembly.

Referring to FIG. 13, the curved display apparatus 200 includes a display panel 110, a backlight assembly and a fixation member. In one exemplary embodiment, the display panel 110 and the backlight assembly are defined as a display member. The curved display apparatus 200 illustrated in FIG. 7 may be implemented as a middle-sized display apparatus such as a computer monitor, or a large-sized display apparatus having a wide screen, such as a wide screen television.

Since the display panel 110 is same as the display panel 110 explained above with reference to FIG. 6, the element will not be explained in detail for the sake of brevity.

The backlight assembly is arranged on a lower portion of the display panel 110 to provide the display panel 110 with the light. The backlight assembly according to an exemplary embodiment is an edge-type backlight assembly. The backlight assembly may include a light source module 230, a diffusion sheet 224, optical sheets 222 and a reflection plate 226.

The light source module 230 includes a light guide panel 232, a first PCB 234, a plurality of first light sources (not illustrated), a second PCB 236 and a plurality of second light sources 236a.

The light guide panel 232 has multiple curvatures. On one side of the light guide panel 232 are formed first openings 232a corresponding to the first light sources, and on the other side of the light guide panel 232 are formed second openings (not designated with reference numerals) corresponding to the second light sources 236a. Alternatively, the first and second openings 232a may be omitted.

The first PCB 234 is mounted with the first light sources and is arranged on one side of the light guide panel 232. That is, the first light sources are mounted on the first PCB 234 and generate light.

Signal lines (not illustrated) are formed on the first and second PCBs 234, 236 to supply driving voltages to the first light source and the second light source 236a, respectively. The light source module 230 may be arranged in a parallel direction to a longer side of the display panel 110. Alternatively, the light source module 230 may be arranged in a parallel direction to a shorter side of the display panel 110.

The diffusion sheet 224 is arranged on the light guide panel 232 to diffuse the surface light from the light guide panel 232 so that the light is emitted to the optical sheets 222.

The optical sheets 222 are arranged on the upper portion of the diffusion sheet 224 to enhance efficiency of the incoming light from the diffusion sheet 224. The optical sheets 222 may include a prism sheet to collect the light, diffused at the diffusion sheet 224, at a front surface. For example, the prism sheet may include a vertical prism sheet to converge the light in a vertical direction, and a horizontal prism sheet to converge the light in a horizontal direction.

The reflection sheet 226 is arranged on a lower portion of the light guide panel 232 to reflect the incoming light from the light source module 230.

The fixation member includes a bottom chassis 250, a molding member 260 and a top chassis 170, and fixes the display panel 110 so that the display panel 110 is curved with multiple curvatures.

The bottom chassis 250 includes a bottom portion and sidewalls extended from edges of the bottom portion to define an accommodating space therein.

A top chassis 170 is arranged on the display panel 110, has multiple curvatures, and fixes the display panel 110 via coupling with the bottom chassis 250. The top chassis 170 protects the display panel 110 from external impact. A window is formed on the upper surface of the top chassis 170 to expose the display area of the display panel 110 to the outside.

The curved display apparatus 200 may additionally include a driving PCB (not illustrated) to drive the display panel 110. The driving PCB may be arranged between the light guide panel 232 and the bottom chassis 250, or arranged on the rear surface of the bottom chassis 250.

Figure 14:
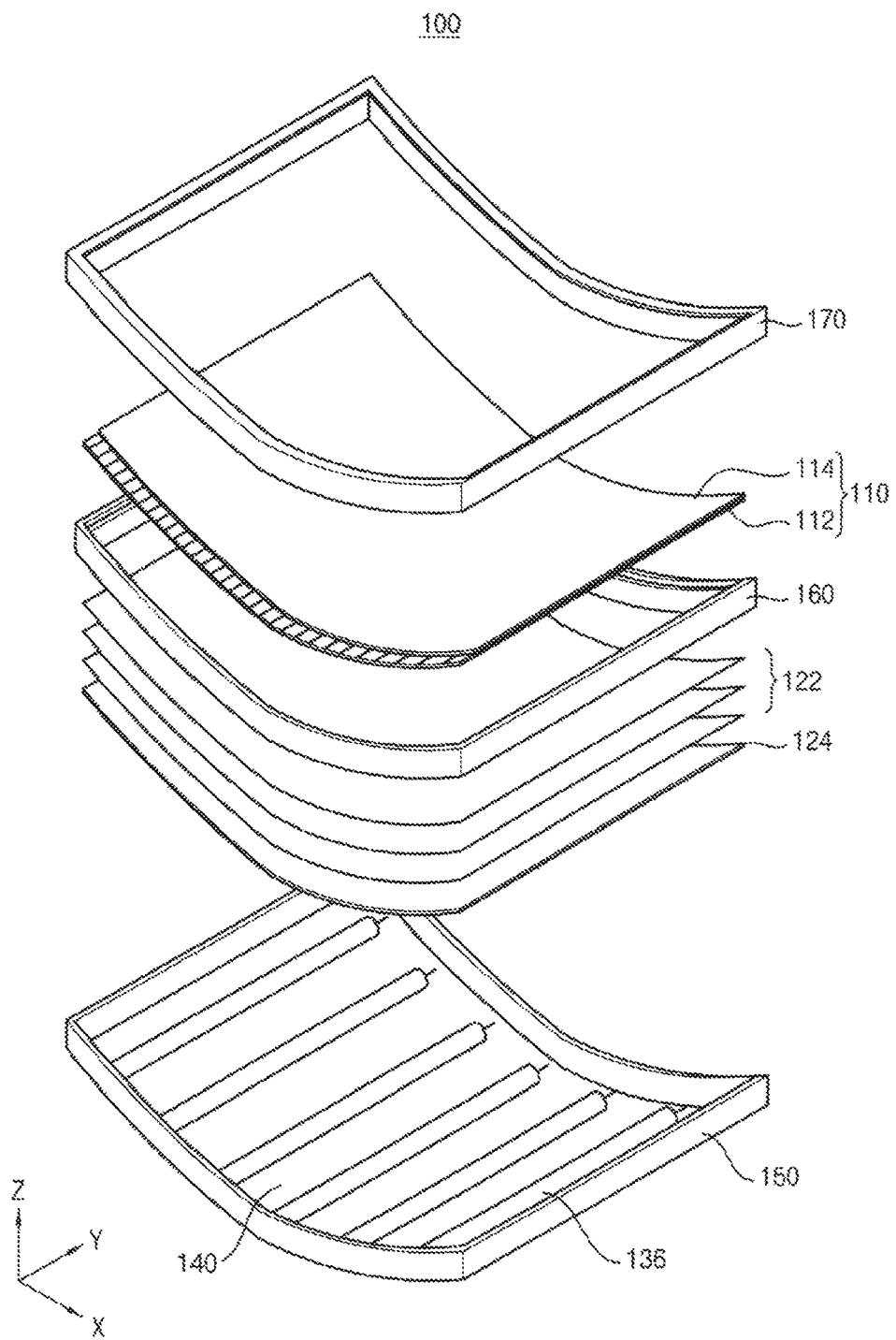
FIG. 14 is a schematic, exploded perspective view of the curved display apparatus of FIG. 1 according to another example.

FIG. 14 is a schematic, exploded perspective view of the curved display apparatus of FIG. 1 according to another example.

Referring to FIG. 14, the curved display apparatus 100 includes a display panel 110, a backlight assembly and a fixation member.

Since the display panel 110 is same as the display panel 110 explained above with reference to FIG. 6, the element will not be explained in detail for the sake of brevity.

The backlight assembly is a direct type backlight assembly. The backlight assembly may include a light source module 136, optical sheets 122, a diffusion plate 124, a reflection plate 140, a bottom chassis 150 and a molding member 160.

The light source module 136 may include a plurality of cathode fluorescent lamps (CCFL). The CCFLs may be arranged in a parallel direction to a shorter side of the display panel 110, although are not limited to this arrangement and may be arranged in other configurations as well.

Since the optical sheets 122, the diffusion plate 124, the reflection plate 140, the bottom chassis 150 and the molding member 160 are identical to those illustrated in FIG. 6, the like elements are designated with the same reference numerals and will not be explained in detail for the sake of brevity.

Figure 15:
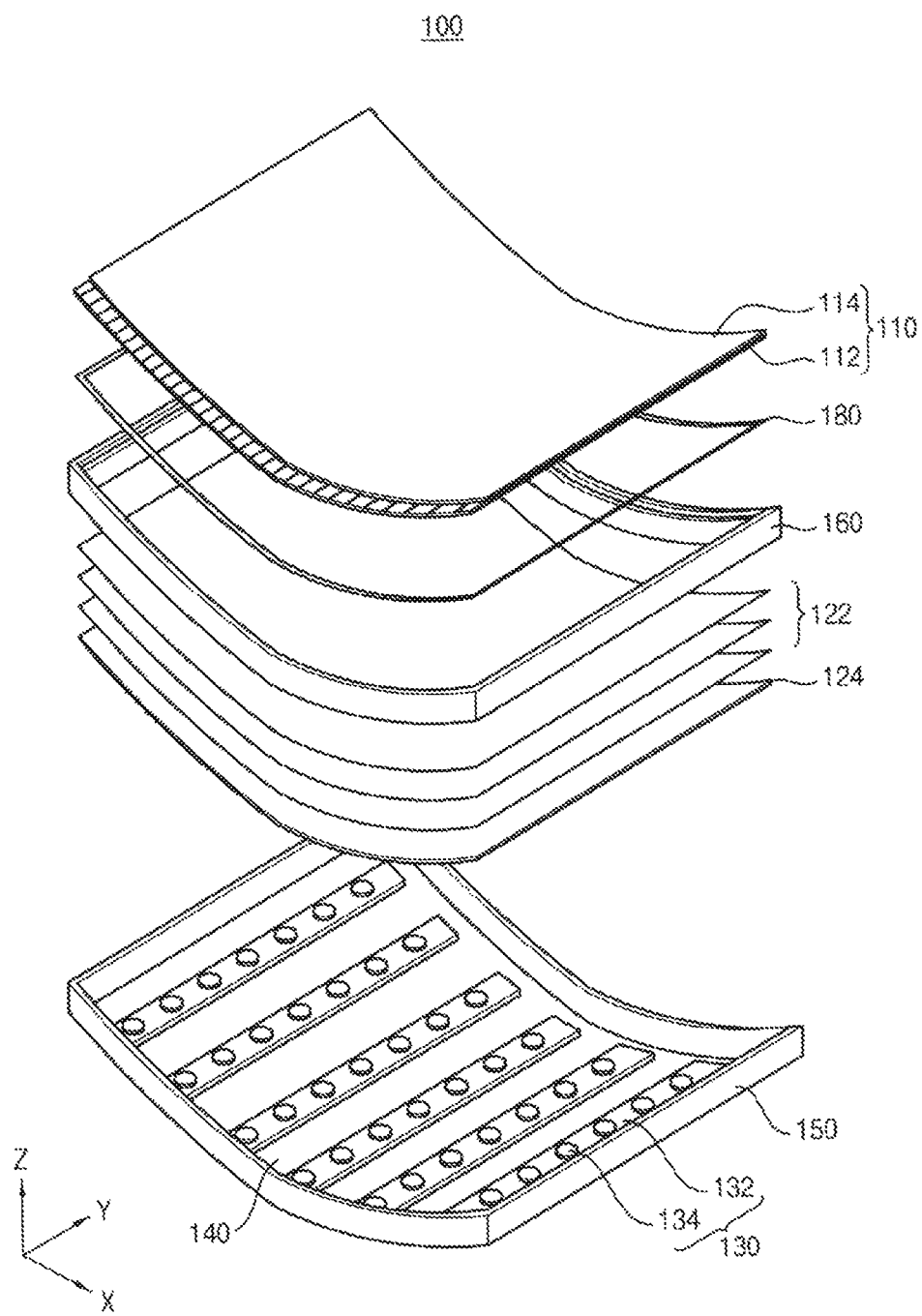
FIG. 15 is a schematic, exploded perspective view of the curved display apparatus of FIG. 1 according to another example.

FIG. 15 is a schematic, exploded perspective view of the curved display apparatus of FIG. 1 according to another example.

Referring to FIG. 15, the curved display apparatus 100 includes a display panel 110, a backlight assembly and a fixation member. The display panel 110 and the backlight assembly are defined herein as a display member.

Since the display panel 110 is same as the display panel 110 explained above with reference to FIG. 6, the element will not be explained in detail for the sake of brevity.

Since the backlight assembly is same as the backlight assembly explained above with reference to FIG. 6, the element will not be explained in detail for the sake of brevity.

The fixation member includes an adhesive member 180 and fixes the display panel 110 to the molding member 160 so that the display panel 110 is curved with multiple curvatures. The adhesive member 180 may be, for example, a two-sided tape, although is not limited thereto and may be other types of adhesives, fasteners, etc. known to those skilled in the art. Unlike the curved display apparatus of FIG. 6, the top chassis 170 may be omitted on one side of the adhesive member 180.

Figure 16:
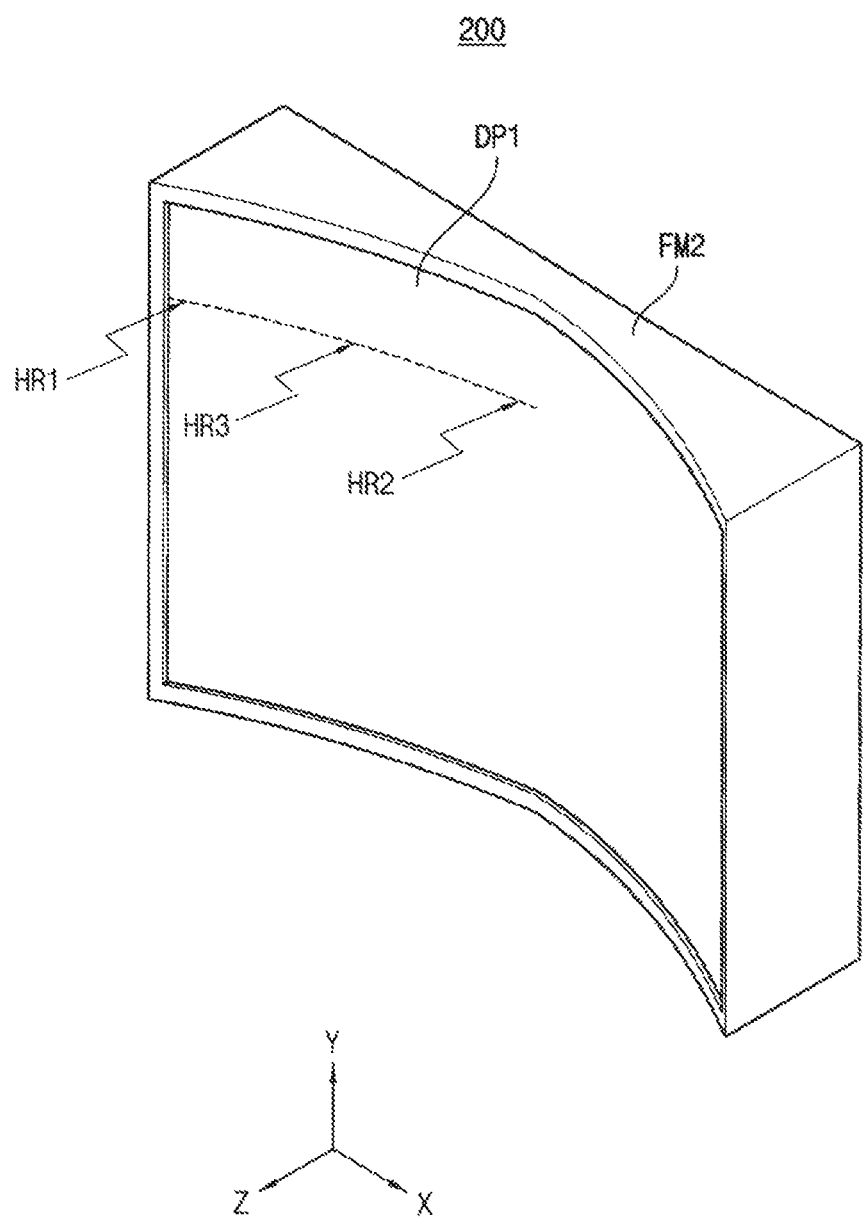
FIG. 16 is a perspective view provided to explain a curved display apparatus according to a second exemplary embodiment.

FIG. 16 is a perspective view provided to explain a curved display apparatus according to a second exemplary embodiment.

Referring to FIG. 16, the curved display apparatus 200 according to the second exemplary embodiment includes a display member DP1 arranged in landscape fashion to display an image, and a fixation member FM2 to fix the display member DP1 so that the display member DP1 is concavely curved with multiple curvatures.

Since the display member DP1 is identical to the display member DP1 illustrated in FIG. 6, the element is designated with the same reference numeral and will not be explained in detail for the sake of brevity.

The fixation member FM2 is so formed as to be curved with two or more horizontal radii of curvatures, and fixes the display member DP1 so that the display member DP1 is curved with multiple curvatures.

Except for having a flat rear surface, the fixation member FM2 is identical to the fixation member FM1 illustrated in FIG. 1. Accordingly, the fixation member FM2 will not be explained in detail for the sake of brevity.

Figure 17:
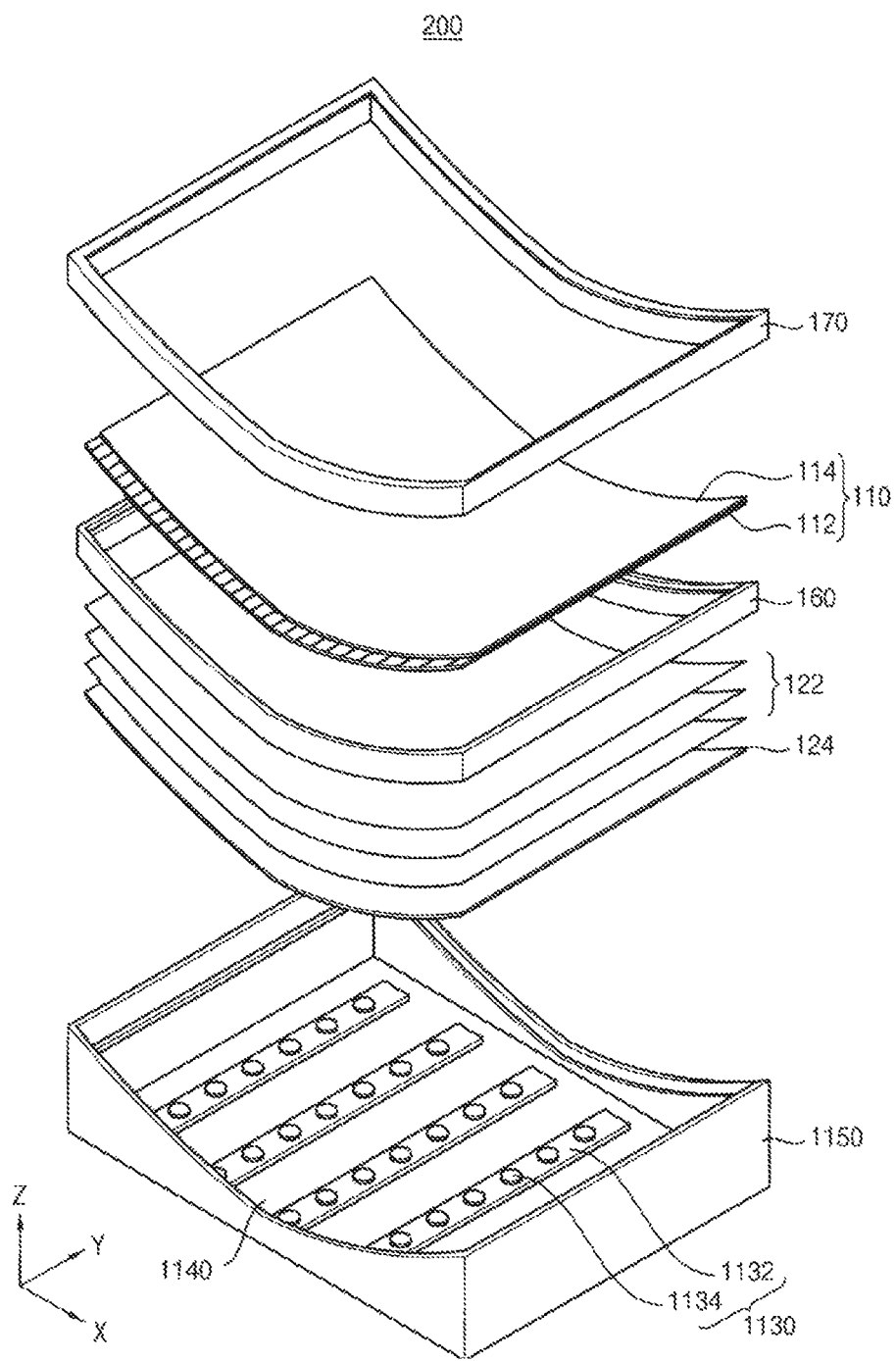
FIG. 17 is a schematic, exploded perspective view of the curved display apparatus of FIG. 16 according to an example.

FIG. 17 is a schematic, exploded perspective view of the curved display apparatus of FIG. 16 according to an example. FIG. 17 particularly illustrates a landscape-type, concave-curved display apparatus 200 having a vertical backlight assembly.

Referring to FIG. 17, the curved display apparatus 200 includes a display panel 110, a backlight assembly and a fixation member. The display panel 110 and the backlight assembly are defined herein as a display member. The curved display apparatus 200 illustrated in FIG. 1 may be implemented as a middle-sized display apparatus such as computer monitor, or a large-sized display apparatus having a wide screen such as a wide-screen television.

Since the display panel 110 is same as the display panel 110 illustrated in FIG. 6, the element is designated with the same reference numeral and will not be explained in detail below for the sake of brevity.

The backlight assembly is arranged on a lower portion of the display panel 110 to provide the display panel 110 with light. In one exemplary embodiment, the backlight assembly is a vertical-type backlight assembly. The backlight assembly may include a light source module 1130, optical sheets 122, a diffusion plate 124, a reflection plate 140, a bottom chassis 150 and a molding member 160.

Since the optical sheets 122, the diffusion plate 124, the reflection plate 140, the bottom chassis 150 and the molding member 160 are identical to those illustrated in FIG. 6, the like elements are designated with the same reference numerals and will not be explained in detail for the sake of brevity.

The light source module 1130 includes a plurality of light emitting diode (LED) packages 1132 on which a plurality of light emitting diodes (LEDs) are mounted, and a printed circuit board 1134 on which the LED packages 1132 are mounted. The light source module 1130 may be arranged flat on the reflection plate 1140 arranged on a bottom surface of the bottom chassis 1150. On the PCB is formed a signal line (not illustrated) to drive driving voltage to the LED packages 1132. According to exemplary embodiments, the PCBs 1134 may be arranged at regular or irregular intervals.

If the PCBs 1134 are arranged at regular intervals, a relatively lower driving voltage is fed to PCBs 1134 arranged in a position corresponding to the center of the bottom chassis 1150, while a relatively higher driving voltage may be fed to PCBs 1134 arranged in a position corresponding to the edge of the bottom chassis 1150. Accordingly, light with an even magnitude can be provided to the display panel.

If the PCBs 1134 are arranged at irregular intervals, the interval between the PCBs 1134 arranged in positions corresponding to the center of the bottom chassis 1150 may be larger than the interval among the PCBs 1134 arranged in positions corresponding to the edge of the bottom chassis 1150. Accordingly, light with an even magnitude can be provided to the display panel.

The bottom chassis 1150 includes a bottom portion and sidewalls extended from edges of the bottom portion to define an accommodating space therein. In one exemplary embodiment, the bottom portion has a flat shape. Accordingly, sidewalls corresponding to shorter sides of the display panel 110 have a square shape, while the sidewalls corresponding to the longer sides of the display panel 110 are formed to have a bottom surface which is flat and an upper surface which is concave. The bottom chassis 1150 is arranged below the display panel 110, and accommodates therein the reflection plate 1140, the diffusion plate 124, the light source module 1130 and the optical sheets 122.

The fixation member includes a top chassis 170, and fixes the display panel 110 so that the display panel 110 is curved with multiple curvatures.

Figure 18:
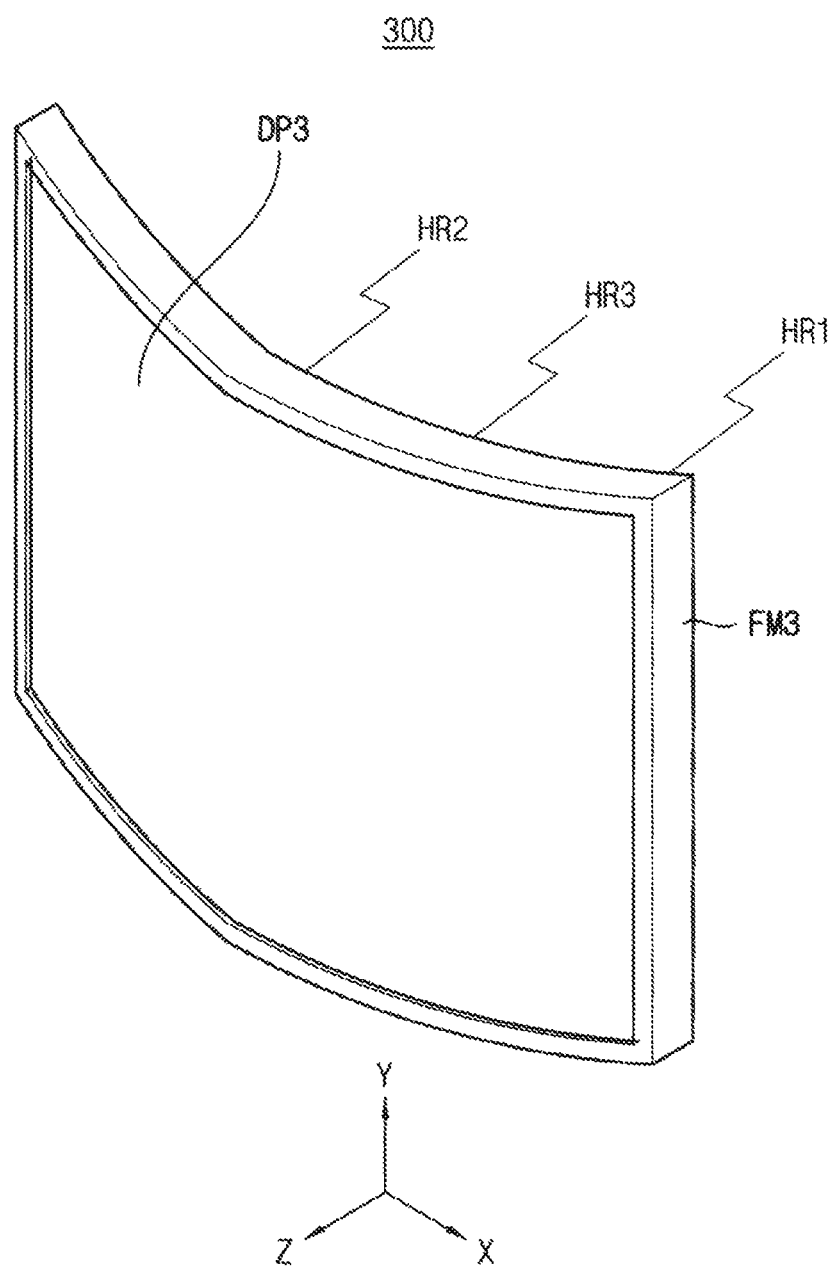
FIG. 18 is a perspective view provided to explain a curved display apparatus according to a third exemplary embodiment.

FIG. 18 is a perspective view provided to explain a curved display apparatus according to a third exemplary embodiment. FIG. 18 particularly illustrates a convex-curved display apparatus.

Referring to FIG. 18, the curved display apparatus 300 according to the third exemplary embodiment includes a display member DP3 arranged in landscape fashion to display an image, and a fixation member FM3 to fix the display member DP3 so that the display member DP3 is convexly curved with multiple curvatures.

For example, the fixation member FM3 may fix the display member DP3 in a manner in which the horizontal radius of curvature of the display member DP3 linearly increases farther away from the center of the display member DP3. Accordingly, the display member DP3 may have a rounded V-shape.

In this case, if the fixation member FM3 fixes the display member DP3 and the fixation member FM3 is curved with three horizontal radii of curvature, the display member DP3 is curved to have three horizontal radii of curvature. For example, the first horizontal radius of curvature HR1 corresponding to an edge of the display member DP3 is larger than the second horizontal radius of curvature HR2 corresponding to a center, and the third horizontal radius of curvature HR3 corresponding to an intermediate area between the edge and the center is smaller than the first horizontal radius of curvature HR1 and is larger than the second horizontal radius of curvature HR2.

The first, second and third horizontal radii of curvature HR1, HR2, HR3 may be averages of the horizontal radii of curvature respectively corresponding to the edge, center and intermediate area between the edge and the center of the display member DP3. That is, if a plurality of horizontal radii of curvature is present on the edge of the display member DP3, the first horizontal radius of curvature may be an average of the above-mentioned horizontal radii of curvature. The horizontal radii of curvature present on the edge of the display member DP3 may linearly increase in a direction moving closer to the edge of the display member DP3.

In another example, the fixation member FM3 may fix the display member DP3 so that the horizontal radius of curvature of the display member DP3 linearly decreases in a direction moving farther away from the center of the display member DP3. Accordingly, the display member DP3 may have an extended U-shape.

In this case, if the fixation member FM3 fixes the display member DP3 and the fixation member FM3 is curved with three horizontal radii of curvature, the display member DP3 is curved to have three horizontal radii of curvature. For example, the first horizontal radius of curvature HR1 corresponding to an edge of the display member DP3 is smaller than the second horizontal radius of curvature HR2 corresponding to a center, and the third horizontal radius of curvature HR3 corresponding to an intermediate area between the edge and the center is larger than the first horizontal radius of curvature HR1 and is smaller than the second horizontal radius of curvature HR2.

The first, second and third horizontal radii of curvature HR1, HR2, HR3 may be averages of the horizontal radii of curvature respectively corresponding to the edge, center and intermediate area between the edge and the center of the display member DP3. That is, if a plurality of horizontal radii of curvature are present on the edge of the display member DP3, the first horizontal radius of curvature may be an average of the above-mentioned horizontal radii of curvature. The horizontal radii of curvature present on the edge of the display member DP3 may linearly decrease in a direction moving closer to the edge of the display member DP3.

In yet another example, the fixation member FM3 may fix the display member DP3 so that the horizontal radius of curvature of the display member DP3 non-linearly increases in a direction moving farther away from the center of the display member DP3. Accordingly, the display member DP3 may have a rounded V-shape.

In this case, if the fixation member FM3 fixes the display member DP3 and the fixation member FM3 is curved with three horizontal radii of curvature, the display member DP3 is curved to have three horizontal radii of curvature. For example, the first horizontal radius of curvature HR1 corresponding to an edge of the display member DP3 is larger than the second horizontal radius of curvature HR2 corresponding to a center, and the third horizontal radius of curvature HR3 corresponding to an intermediate area between the edge and the center is smaller than the first horizontal radius of curvature HR1 and is larger than the second horizontal radius of curvature HR2.

The first, second and third horizontal radii of curvature HR1, HR2, HR3 may be averages of the horizontal radii of curvature respectively corresponding to the edge, center and intermediate area between the edge and center of the display member DP3. That is, if a plurality of horizontal radii of curvature are present on the edge of the display member DP3, the first horizontal radius of curvature may be an average of the above-mentioned horizontal radii of curvature. The horizontal radii of curvature present on the edge of the display member DP3 may non-linearly increase in a direction moving closer to the edge of the display member DP3.

In yet another example, the fixation member FM3 may fix the display member DP3 so that the horizontal radius of curvature of the display member DP3 non-linearly decreases in a direction moving farther away from the center of the display member DP3. Accordingly, the display member DP3 may have an extended U-shape.

In this case, if the fixation member FM3 fixes the display member DP3 and the fixation member FM3 is curved with three horizontal radii of curvature, the display member DP3 is curved to have three horizontal radii of curvature. For example, the first horizontal radius of curvature HR1 corresponding to an edge of the display member DP3 is smaller than the second horizontal radius of curvature HR2 corresponding to a center, and the third horizontal radius of curvature HR3 corresponding to an intermediate area between the edge and the center is larger than the first horizontal radius of curvature HR1 and is smaller than the second horizontal radius of curvature HR2.

The first, second and third horizontal radii of curvature HR1, HR2, HR3 may be averages of the horizontal radii of curvature respectively corresponding to the edge, center and intermediate area between the edge and center of the display member DP3. That is, if a plurality of horizontal radii of curvature are present on the edge of the display member DP3, the first horizontal radius of curvature may be an average of the above-mentioned horizontal radii of curvature. The horizontal radii of curvature present on the edge of the display member DP3 may non-linearly decrease in a direction moving closer to the edge of the display member DP3.

Figure 19:
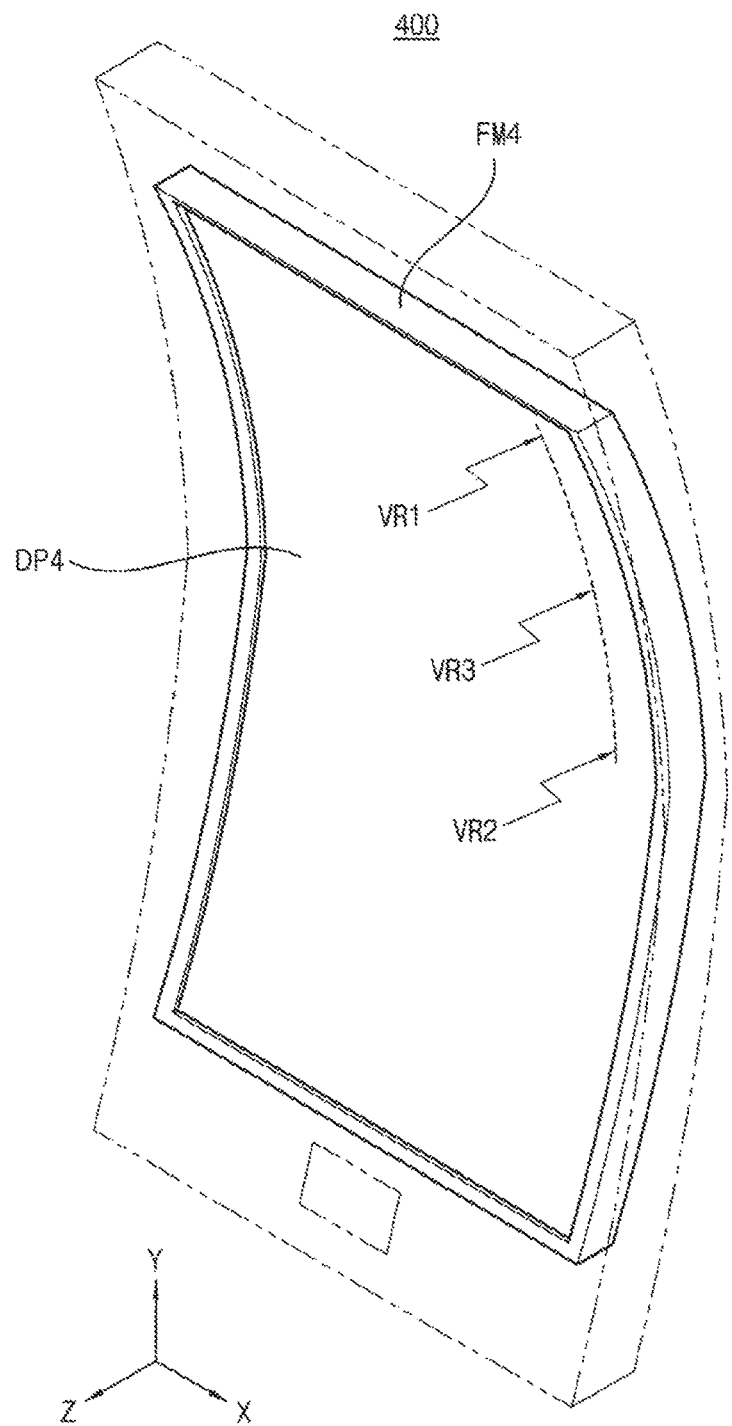
FIG. 19 is a perspective view provided to explain a curved display apparatus according to a fourth exemplary embodiment.

FIG. 19 is a perspective view provided to explain a curved display apparatus according to a fourth exemplary embodiment. FIG. 19 particularly illustrates a convex-curved display apparatus.

Referring to FIG. 19, the curved display apparatus 400 according to the fourth exemplary embodiment includes a display member DP4 arranged in a portrait fashion to display images, and a fixation member FM4 to fix the display member DP4 so that the display member DP4 is convexly curved with multiple curvatures. The curved display apparatus 400 illustrated in FIG. 19 may be implemented for use in a middle or small-sized display apparatus such as a mobile phone or smartphone which is used in contact with a user's face.

The display member DP4 may have a flexible property. Also, the display member DP4 may be curved with a single curvature. Alternatively, the display member DP4 may be curved with multiple curvatures. Either the point of origin of the horizontal radius of curvature corresponding to the single curvature, or the respective points of origin of the horizontal radii of curvature corresponding to the multiple curvatures, may be formed on the front space (or to the viewer's side) of the display member DP4. As a result, the center of the display member DP4 is recessed from the viewer in a concave-curved form.

The fixation member FM4 is so curved that it has two or more horizontal radii of curvature, and according to exemplary embodiments, fixes the display member DP4 to a curved form with multiplex curvatures.

If the display member DP4 has a flexible property, the fixation member FM4 fixes the display member DP4 so that the display member DP4 is curved with multiple curvatures.

Further, if the display member DP4 has a curved form of a single curvature, the fixation member FM4 varies the curvature of the display member DP4 so that the display member DP4 is curved with multiple curvatures.

Further, if the display member DP4 has multiple curvatures, the fixation member FM4 fixes the display member DP4 so that the display member DP1 maintains multiple curvatures.

For instance, the fixation member FM4 may fix the display member DP4 so that the vertical radius of curvature of the display member DP4 linearly increases in a direction moving farther from the center of the display member DP4. Accordingly, the display member DP4 may have a rounded V-shape.

In this case, if the fixation member FM4, curved with three vertical radii of curvature, fixes the display member DP4, the display member DP4 is curved to have three vertical radii of curvature. For example, the first vertical radius of curvature VR1 corresponding to the edge portion of the display member DP4 is larger than the second vertical radius of curvature VR2 corresponding to the center, and the third vertical radius of curvature VR3 corresponding to the intermediate area between the edge portion and the center is smaller than the first vertical radius of curvature VR1 and is larger than the second vertical radius of curvature (VR2).

The first, second and third vertical radii of curvature VR1, VR2, VR3 may be, respectively, the averages of the vertical radii of curvature corresponding to the edge portion, center and middle (intermediate) area of the display member DP4. That is, if there is a plurality of vertical radii of curvature present on the edge portion of the display member DP4, the first vertical radius of curvature VR1 may be an average of the above-mentioned vertical radii of curvature. At this time, the vertical radii of curvature present on the edge portion of the display member DP4 may linearly increase in a direction moving closer to the edge of the display member DP4.

In another example, the fixation member FM4 may fix the display member DP4 so that the vertical radius of curvature of the display member DP4 linearly decreases in a direction moving farther from the center of the display member DP4. Accordingly, the display member DP4 may have an extended U-shape.

In this case, if the fixation member FM4, curved with three vertical radii of curvature, fixes the display member DP4, the display member DP4 is curved to have three vertical radii of curvature. For example, the first vertical radius of curvature VR1 corresponding to the edge portion of the display member DP4 is smaller than the second vertical radius of curvature VR2 corresponding to the center, and the third vertical radius of curvature VR3 corresponding to the intermediate area between the edge portion and the center is larger than the first vertical radius of curvature VR1 and is smaller than the second vertical radius of curvature VR2.

The first, second and third vertical radii of curvature VR1, VR2, VR3 may be, respectively, the averages of the vertical radii of curvature corresponding to the edge portion, center and middle area of the display member DP4. That is, if there is a plurality of vertical radii of curvature present on the edge portion of the display member DP4, the first vertical radius of curvature VR1 may be an average of the above-mentioned vertical radii of curvature. At this time, the vertical radii of curvature present on the edge portion of the display member DP4 may linearly decrease in a direction moving closer to the edge of the display member DP4.

In yet another example, the fixation member FM4 may fix the display member DP4 so that the vertical radius of curvature of the display member DP4 non-linearly increases in a direction moving farther from the center of the display member DP4. Accordingly, the display member DP4 may have a rounded V-shape.

In this case, if the fixation member FM4, curved with three vertical radii of curvature, fixes the display member DP4, the display member DP4 is curved to have three vertical radii of curvature. For example, the first vertical radius of curvature VR1 corresponding to the edge portion of the display member DP4 is larger than the second vertical radius of curvature VR2 corresponding to the center, and the third vertical radius of curvature VR3 corresponding to the intermediate area between the edge portion and the center is smaller than the first vertical radius of curvature VR1 and is larger than the second vertical radius of curvature VR2.

The first, second and third vertical radii of curvature VR1, VR2, VR3 may be, respectively, the averages of the vertical radii of curvature corresponding to the edge portion, center and middle area of the display member DP4. That is, if there is a plurality of vertical radii of curvature present on the edge portion of the display member DP4, the first vertical radius of curvature VR1 may be an average of the above-mentioned vertical radii of curvature. At this time, the vertical radii of curvature present on the edge portion of the display member DP4 may non-linearly increase in a direction moving closer to the edge of the display member DP4.

In yet another example, the fixation member FM4 may fix the display member DP4 so that the vertical radius of curvature of the display member DP4 non-linearly decreases in a direction moving farther from the center of the display member DP4. Accordingly, the display member DP4 may have an extended U-shape.

In this case, if the fixation member FM4, curved with three vertical radii of curvature, fixes the display member DP4, the display member DP4 is curved to have three vertical radii of curvature. For example, the first vertical radius of curvature VR1 corresponding to the edge portion of the display member DP4 is smaller than the second vertical radius of curvature VR2 corresponding to the center, and the third vertical radius of curvature VR3 corresponding to the intermediate area between the edge portion and the center is larger than the first vertical radius of curvature (VR1) and is smaller than the second vertical radius of curvature (VR2).

The first, second and third vertical radii of curvature VR1, VR2, VR3 may be, respectively, the averages of the vertical radii of curvature corresponding to the edge portion, center and middle area of the display member DP4. That is, if there is a plurality of vertical radii of curvature present on the edge portion of the display member DP4, the first vertical radius of curvature VR1 may be an average of the above-mentioned vertical radii of curvature. At this time, the vertical radii of curvature present on the edge portion of the display member DP4 may non-linearly decrease in a direction moving closer to the edge of the display member DP4.

Figure 20:
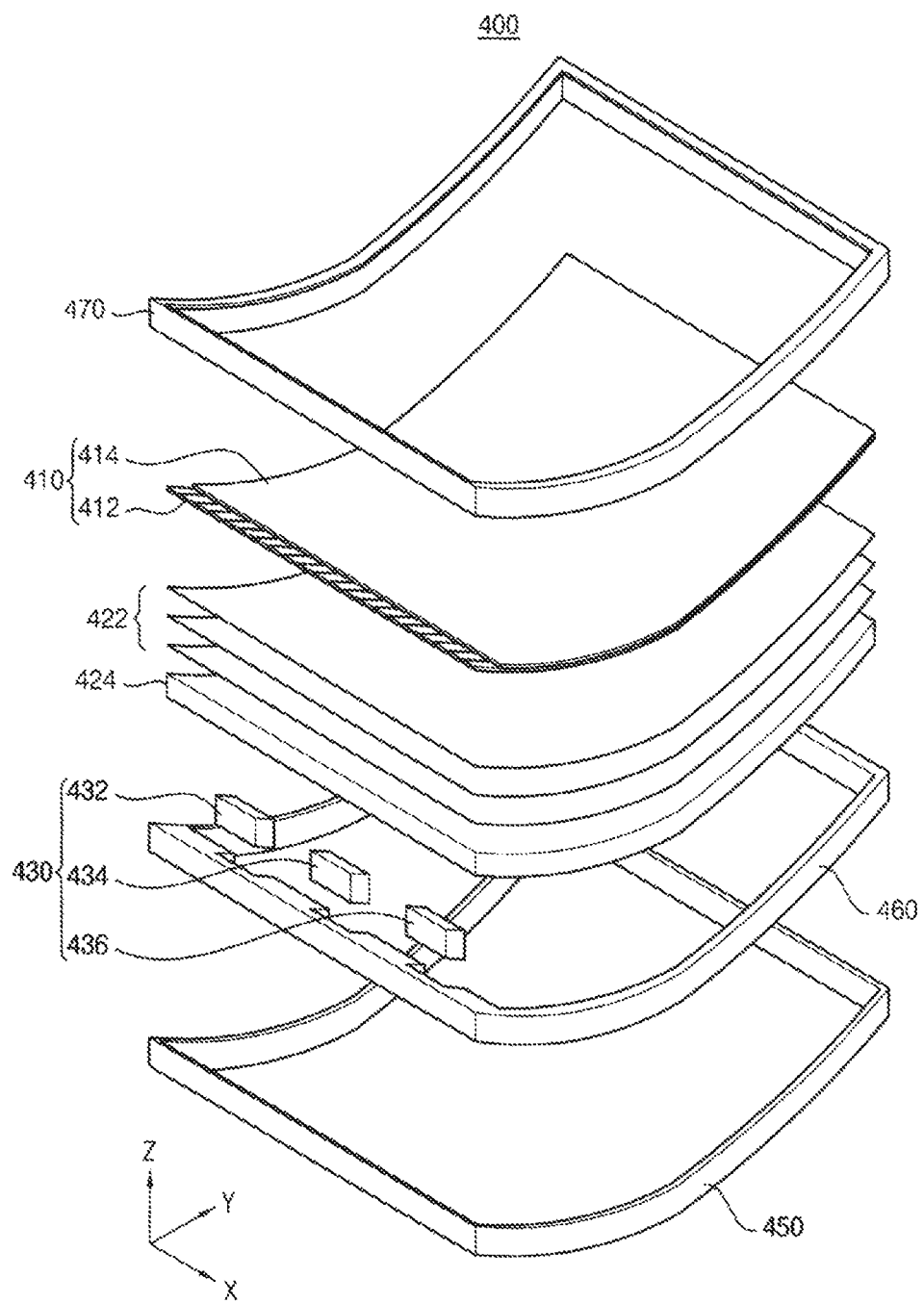
FIG. 20 is a schematic, exploded perspective view provided to explain the curved display apparatus 400 of FIG. 19.

FIG. 20 is a schematic, exploded perspective view provided to explain the curved display apparatus 400 of FIG. 19. FIG. 20 particularly illustrates a portrait-type, convex-curved display apparatus 400 having an edge-type backlight assembly.

Referring to FIG. 20, the curved display apparatus 400 includes a display panel 410, a backlight assembly and a top chassis 470. The curved display apparatus 400 illustrated in FIG. 20 may be implemented for use in a middle-sized or small-sized display apparatus, such as a mobile phone or smartphone which is used in contact with a user's face.

The display panel 410 may include an array substrate 412, a color filter substrate 414 facing the array substrate 412 and a liquid crystal layer (not illustrated) interposed between the array substrate 412 and the color filter substrate 414. The color filter substrate 414 may be a smaller size than the array substrate 412. Accordingly, a portion uncovered by the color filter substrate 414 is exposed. A pad portion is formed on the exposed portions.

The array substrate 412 has thin film transistors (TFT) in matrix form as switching devices. Data lines and gate lines are connected to source and gate terminals of the TFTs, and pixel electrodes formed from transparent conductive material are connected to the drain terminals. On the non-display area of the array substrate 412 is arranged a data pad portion extended from the data lines. Although not illustrated, the gate pad portion extended from the gate lines may additionally be arranged.

The color filter substrate 414 is arranged opposite to the array substrate 412 and has RGB pixels provided in membrane form to express colors. On the color filter substrate 414 is formed a common electrode formed from transparent conductive material, opposite to the pixel electrodes formed on the array substrate 412.

In the display panel 410, as the TFTs are turned on with the electricity applied through the gate terminals thereof, an electric field is formed between the pixel electrodes and the common electrodes. The liquid crystal arrangement of the liquid crystal layer interposed between the array substrate 412 and the color filter substrate 414 is varied according to the electric field, and accordingly, light transmittance is varied in accordance with the varied liquid crystal arrangement to thus express an image of intended grayscale.

The display panel 410 may additionally include a first polarization film (not illustrated) arranged on a lower side of the array substrate 412, and a second polarization film (not illustrated) arranged on an upper side of the color filter substrate 414. The first polarization film includes a transmittance axis in a first direction to thus polarize the light to the first direction. The second polarization film includes a transmittance axis in a second direction, to thus polarize the light to the second direction. For example, the transmittance axes of the first and second polarization films may be arranged perpendicularly to each other.

The backlight assembly is arranged on the lower portion of the display panel 410 to provide the display panel 410 with light. In one exemplary embodiment, the backlight assembly is an edge type. The backlight assembly may include optical sheets 422, a light guide panel 424, a molding member 460, a point light source 430, and a bottom chassis 450, and is arranged below the display panel 410 to provide the display panel 410 with light.

The optical sheets 422 are arranged on the upper portion of the diffusion plate 124 to increase the efficiency of the incoming light fed from the diffusion plate 424. The optical sheets 422 may include a reflection sheet, a diffusion sheet and a prism sheet to enhance a brightness property of the light emitted from the light guide panel 424. The reflection sheet is arranged on a lower side of the light guide panel 424 to reflect the light leaking to a lower side of the light guide panel 424 back to an interior of the light guide panel 424, to thus enhance utilization of light. The diffusion sheet is arranged on an upper side of the light guide panel 424 to diffuse the light emitted from the light guide panel 424. The prism sheet is arranged on an upper side of the diffusion sheet to collect the light emitted from the diffusion sheet to a front side. For example, the prism sheet may include a vertical prism sheet to focus the light in the vertical direction, and a horizontal prism sheet to focus the light in the horizontal direction.

The light guide panel 424 is arranged on a lower side of the display panel 410 and may have a plate shape. The light guide panel 424 is arranged on a side of the point light source 430 to oppose the light emitting surface of the point light source 430. The light guide panel 424 guides the light generated from the point light source 430 so that the light is emitted in the direction of the display panel 410. The light guide panel 424 may be formed from a transparent material to minimize the loss of light.

The molding member 460 is arranged on an upper outer side of the bottom chassis 450 to engage the display panel 410 with the backlight assembly in a vertical direction. That is, the molding member 460 plays a role of guiding and supporting the display panel 410. For example, the molding member 460 may have a square frame shape.

The point light source 430 is arranged on a side of the light guide panel 424 to provide the light guide panel 424 with light. The point light source 430 includes first to third light emitting diodes (LEDs) for the purpose of achieving a thinner configuration and lower power consumption. In one exemplary embodiment, three LEDs may be used. However, the number of LEDs may decrease or increase in accordance with the size of the display panel 410, required brightness, and/or other factors. The first to third LEDs may be mounted on a flexible circuit board (not illustrated) for light source control.

The bottom chassis 450 may include a bottom portion in a square frame shape, and sidewalls extended from an edge of the bottom portion. The bottom portion and the sidewalls together form an accommodating space in which a flexible circuit board (not illustrated) for light source control, the light guide panel 424 and the optical sheets 422 are received. In addition to the specific example of the bottom chassis 450 explained above, the bottom chassis 450 may alternatively be formed from a metal of good strength and low deformation, according to various other examples.

The backlight assembly may additionally include a reflection plate (not illustrated) arranged on the bottom surface of the bottom chassis 450 to reflect light leaked from the light guide panel 424. The reflection plate enhances the utilization of light.

The curved display apparatus 400 may additionally include a driving PCB (not illustrated) to provide a driving signal to drive the display panel 410.

The top chassis 470 covers a non-display area of the display panel 410 arranged on the backlight assembly and prevents damage to the display panel 410 due to external impacts.

Figure 21:
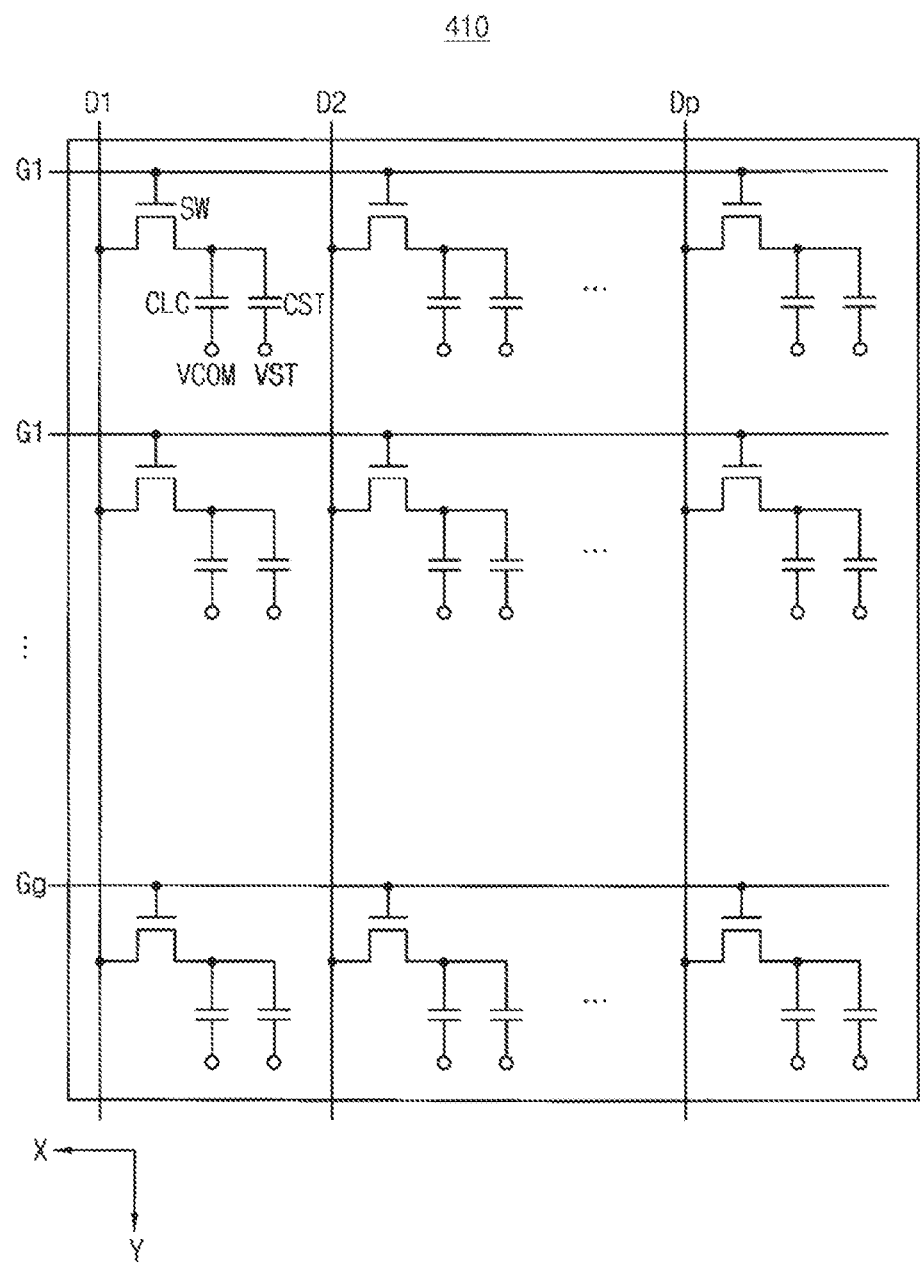
FIG. 21 is an equivalent circuit diagram provided to explain the display panel 410 of FIG. 20.

FIG. 21 is an equivalent circuit diagram provided to explain the display panel 410 of FIG. 20.

Referring to FIG. 21, the display panel 410 includes a plurality of data lines D1, D2, . . . , Dp (p=natural number), a plurality of gate lines G1 G2, . . . , Gg (g=natural number), a plurality of switching devices SW, a plurality of liquid crystal capacitors (CLC), and a plurality of storage capacitors (CST).

The data lines D1, D2, . . . , Dp are extended in a Y-axis direction, and arranged in an X-axis direction.

The gate lines G,1 G2, . . . , Gq are extended in the X-axis direction, and arranged in the Y-axis direction. In one exemplary embodiment, the data lines D1, D2, . . . , Dp each have a longer length than the gate lines G,1 G2, . . . , Gg.

The switching device SW includes a source electrode connected to the data lines, a gate electrode connected to the gate lines, and a drain electrode connected to the CLC and CST.

The CLC is connected to the drain electrode of the switching device SW at one end, and connected to the common voltage end (VCOM) at the other end.

The CST is connected to the drain electrode of the switching device SW at one end, and connected to the storage voltage end (VST) at the other end.

In one exemplary embodiment, the data lines D1, D2, . . . , Dp are curved with multiple curvatures, with the display panel arranged in portrait fashion.

Figure 22:
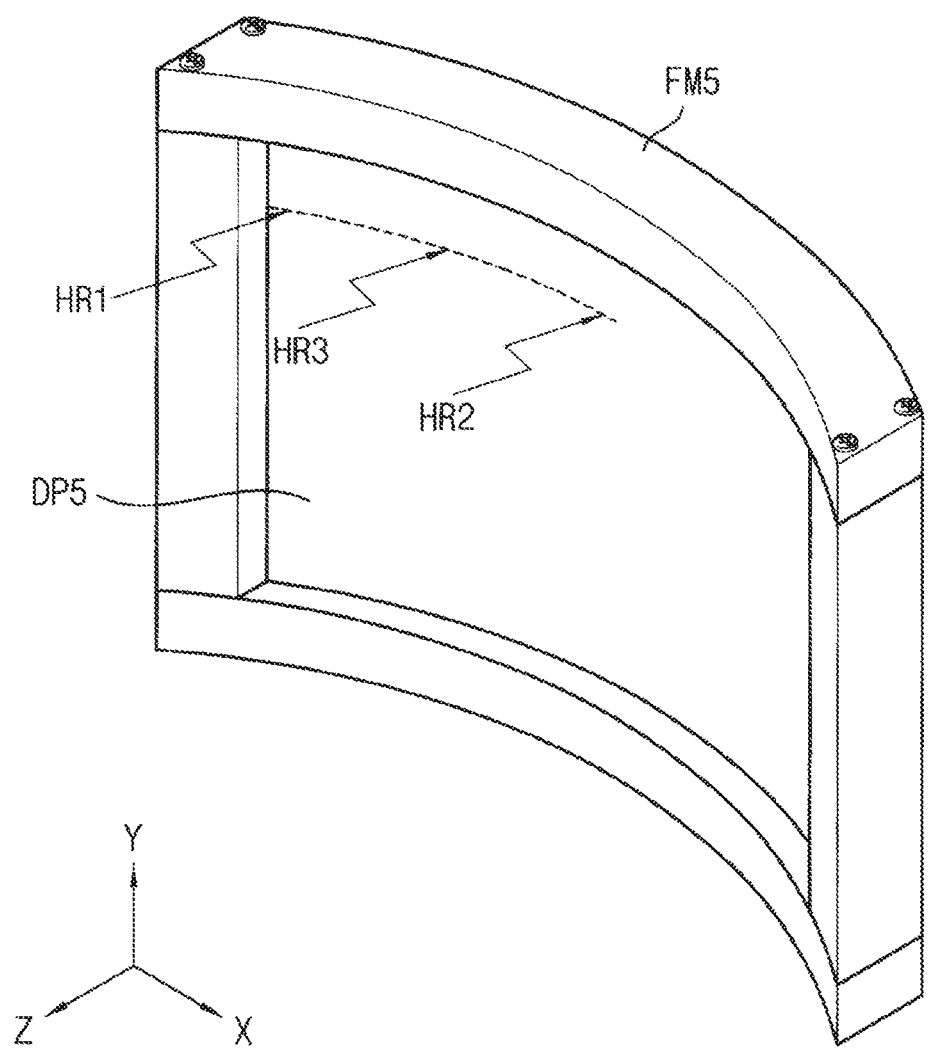
FIG. 22 is a perspective view provided to explain a curved display apparatus according to a fifth exemplary embodiment.
Figure 23:
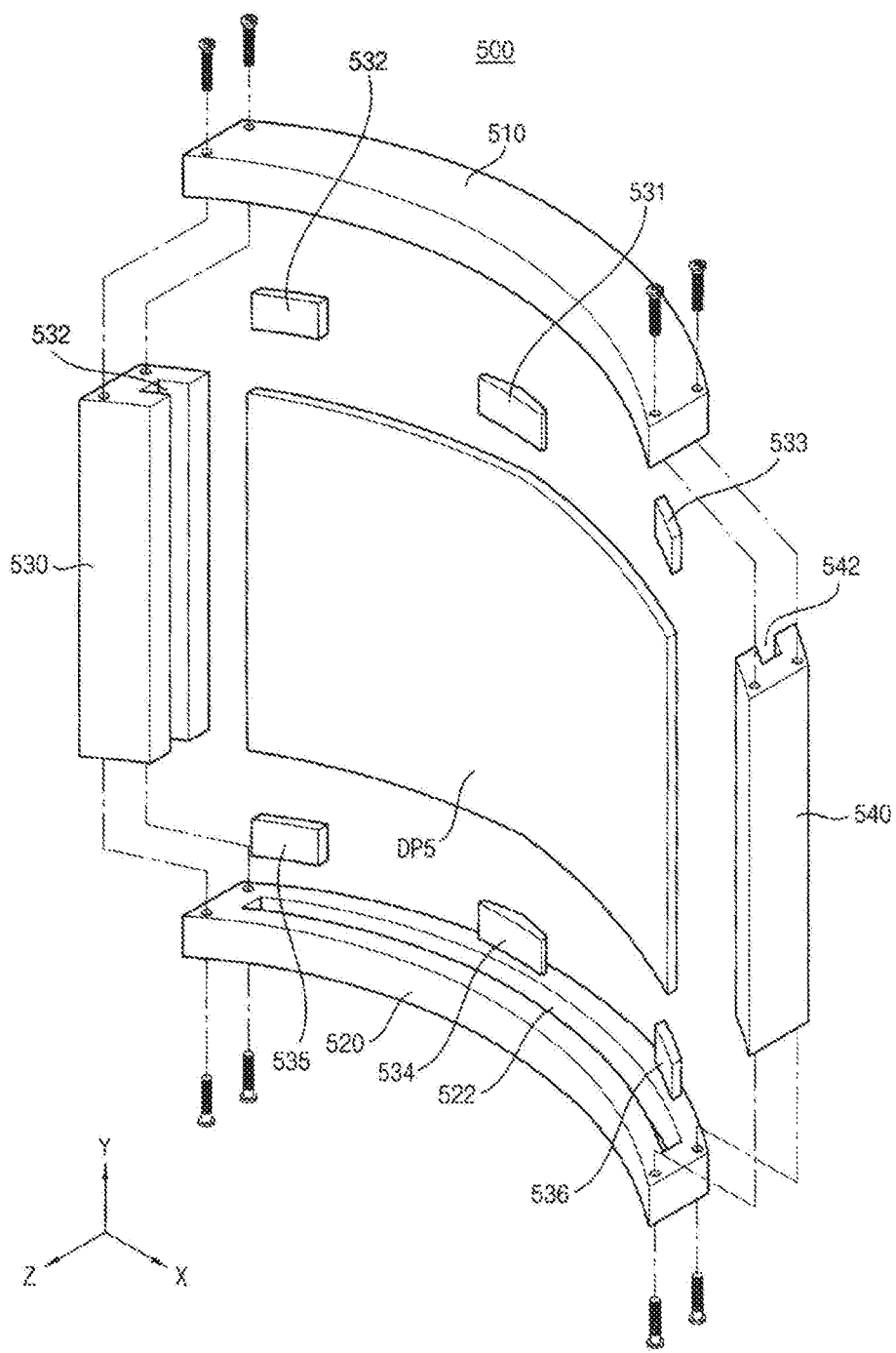
FIG. 23 is a schematic, exploded perspective view of the curved display apparatus of FIG. 22.
Figure 24:
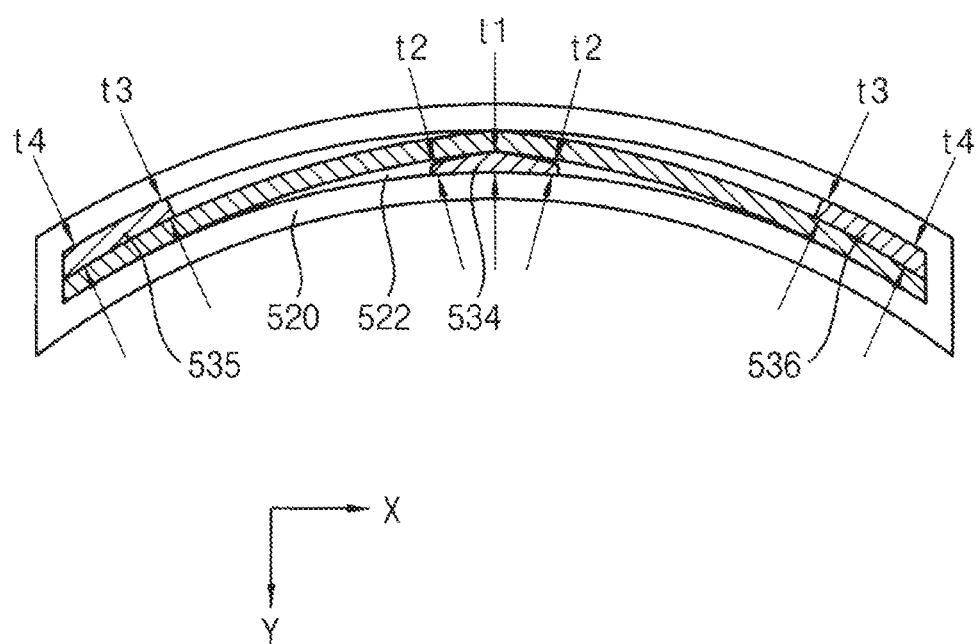
FIG. 24 is a plan view of the curved display apparatus of FIG. 23 viewed on an XZ plane.

FIG. 22 is a perspective view provided to explain a curved display apparatus according to a fifth exemplary embodiment. FIG. 23 is a schematic, exploded perspective view of the curved display apparatus of FIG. 22. FIG. 24 is a plan view of the curved display apparatus of FIG. 23 viewed on an XZ plane. FIG. 24 particularly illustrates a curved display apparatus having panel structures with multiple curvatures on lower and upper sides of the display panel.

Referring to FIGS. 22 to 24, the curved display apparatus 500 according to the fifth exemplary embodiment includes a display panel DP5 and a fixation member FM5.

The display panel DP5 is arranged in a landscape fashion to display an image. The display member DP5 may have a curved form with a single curvature, or a curved form with multiple curvatures. Either the point of origin of the horizontal radius of curvature corresponding to the single curvature, or the respective points of origin of the horizontal radii of curvature corresponding to the multiple curvatures, may be formed on the front space (or to the viewer's side) of the display member DP5. As a result, the center of the display member DP5 is recessed from the viewer in a concave-curved form. Further, the display panel DP5 may have a flexible property.

The fixation member FM5 includes an upper frame 510, a lower frame 520, a left frame 530 and a right frame 540, and fixes the display panel DP5 so that the display panel DP5 is curved with multiple curvatures. For example, if the display panel DP5 has a curved shape with a single curvature, the fixation member FM5 may vary the curvature of the display panel DP5 so that the display panel DP5 is curved with multiple curvatures.

Also, if the display panel DP5 has multiple curvatures, the fixation member FM5 fixes the display panel DP5 so that the display panel DP5 maintains the multiple curvatures.

Also, if the display panel DP5 has a flexible property, the fixation member FM5 fixes the display panel DP5 so that the display panel DP5 is curved with multiple curvatures.

The upper frame 510 has a curved shape, corresponds to a first longer side of the display panel DP5, and fixes the display panel DP5 so that the display panel DP5 is curved with multiple curvatures. The lower frame 520 has a curved shape, corresponds to a second longer side of the display panel DP5, and fixes the display panel DP5 so that the display panel DP5 is curved with multiple curvatures.

The upper frame 510 has a first opening (not illustrated) into which the first longer side of the display panel DP5 is inserted. The width of the first opening is larger than the thickness of the display panel DP5. For example, the width of the first opening may be twice as large as the thickness of the display panel DP5.

A first guide member 531, a second guide member 532 and a third guide member 533 are arranged in the first opening to guide the curvature of the display panel DP5 so that the display panel DP5 is curved with multiple curvatures. The maximum thickness of the first to third guide members 531, 532, 533 may be a difference between the width of the first opening and the thickness of the display panel DP5. The first to third guide members 531, 532, 533 may utilize many different types of materials, such as silicone, rubber, sponge, etc.

For example, the first guide member 531 is arranged between the center of the front surface of the upper frame 510 and the center of the first longer side of the display panel DP5. The second guide member 532 is arranged between the left side of the rear surface of the upper frame 510 and the left side of the first longer side of the display panel DP5. The third guide member 533 is arranged between the right side of the rear surface of the upper frame 510 and the right side of the first longer side of the display panel DP5. Accordingly, the display panel DP5 is curved in a manner in which the radius of curvature corresponding to the center of the display panel DP5 is smaller than the radius of curvature corresponding to the left and right sides of the display panel DP5.

A fourth guide member 534, a fifth guide member 535 and a sixth guide member 536 are arranged in the second opening to guide the curvature of the display panel DP5 so that the display panel DP5 is curved with multiple curvatures. The maximum thickness of the fourth to sixth guide members 534, 535, 536 may be a difference between the width of the second opening and the thickness of the display panel DP5. The fourth to sixth guide members 534, 535, 536 may utilize many different types of materials, such as silicone, rubber, sponge, etc.

For example, the fourth guide member 534 is arranged between the center of the front surface of the lower frame 520 and the center of the second longer side of the display panel DP5. The fifth guide member 535 is arranged between the left side of the rear surface of the lower frame 520 and the left side of the second longer side of the display panel DP5. The sixth guide member 536 is arranged between the right side of the rear surface of the lower frame 520 and the right side of the second longer side of the display panel DP5. Accordingly, the display panel DP5 is curved in a manner in which the radius of curvature corresponding to the center of the display panel DP5 is smaller than the radius of curvature corresponding to the left and right sides of the display panel DP5.

The left frame 530 has a linear shape, corresponds to a first shorter side of the display panel DP5, and is coupled to one end of the upper frame 510 and to one end of the lower frame 520. The right frame 540 has a linear shape, corresponds to a second shorter side of the display panel DP5, and is coupled to the other end of the upper frame 510 and to the other end of the lower frame 520.

The left frame 530 has a third opening 532 in which the first shorter side of the display panel DP5 is inserted, and the right frame has a fourth opening 542 in which the second shorter side of the display panel DP5 is inserted. The widths of the third and fourth openings 532, 542 may be equal to the thickness of the display panel DP5.

In one exemplary embodiment, the upper and lower frames 510, 520 have openings with widths which are wider than the thickness of the display panel DP5 so that the display panel DP5 is curved with multiple curvatures. According to this exemplary embodiment, separate guide members are used.

In another exemplary embodiment, the upper and lower frames 510, 520 may have openings with widths which are equal to the thickness of the display panel DP5 so that the display panel DP5 may be fixed to be curved with multiple curvatures. According to this other exemplary embodiment, guide members may be omitted.

Figure 25:
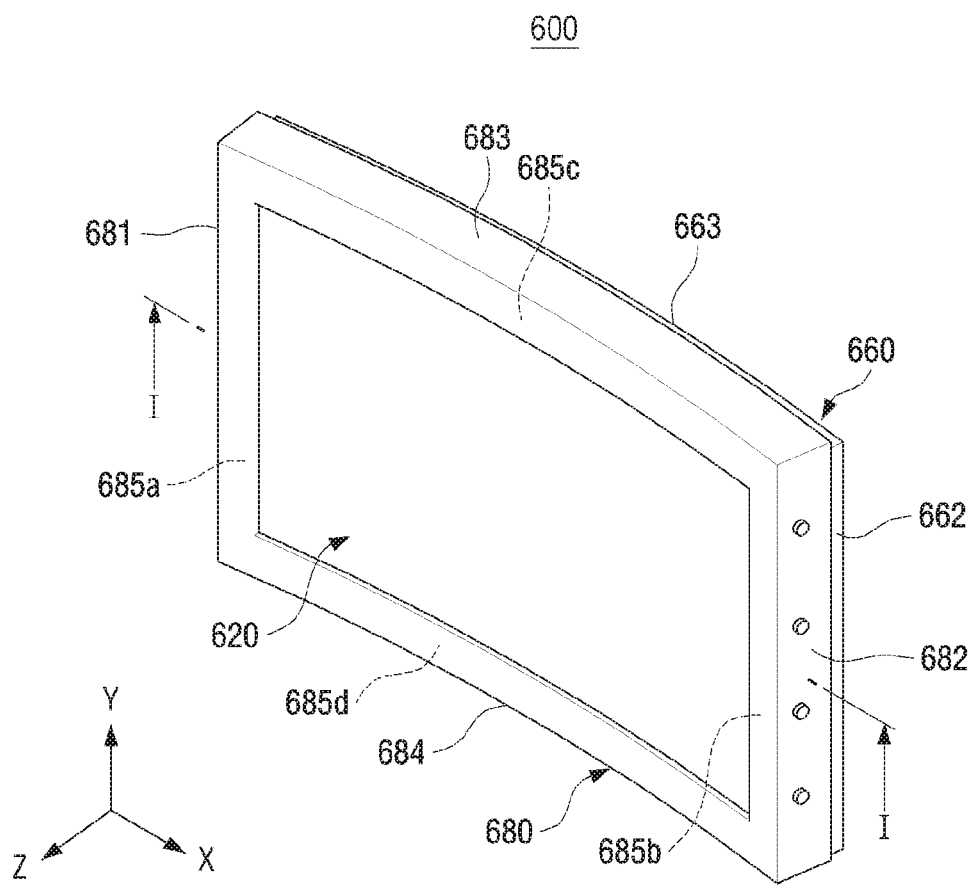
FIG. 25 is a perspective view provided to explain a curved display apparatus according to a sixth exemplary embodiment.
Figure 26:
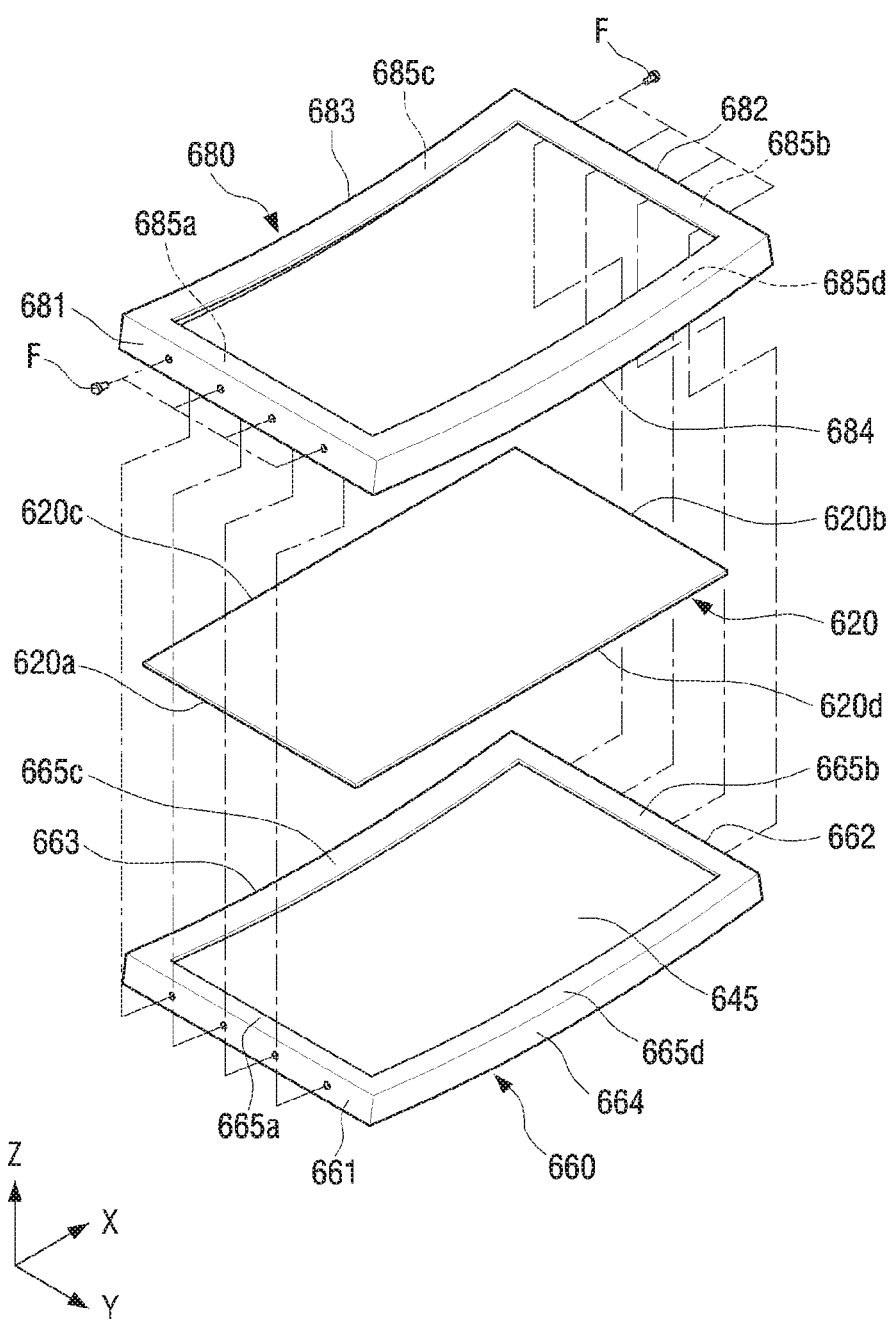
FIG. 26 is a schematic, exploded perspective view of the curved display apparatus of FIG. 25.
Figure 27:
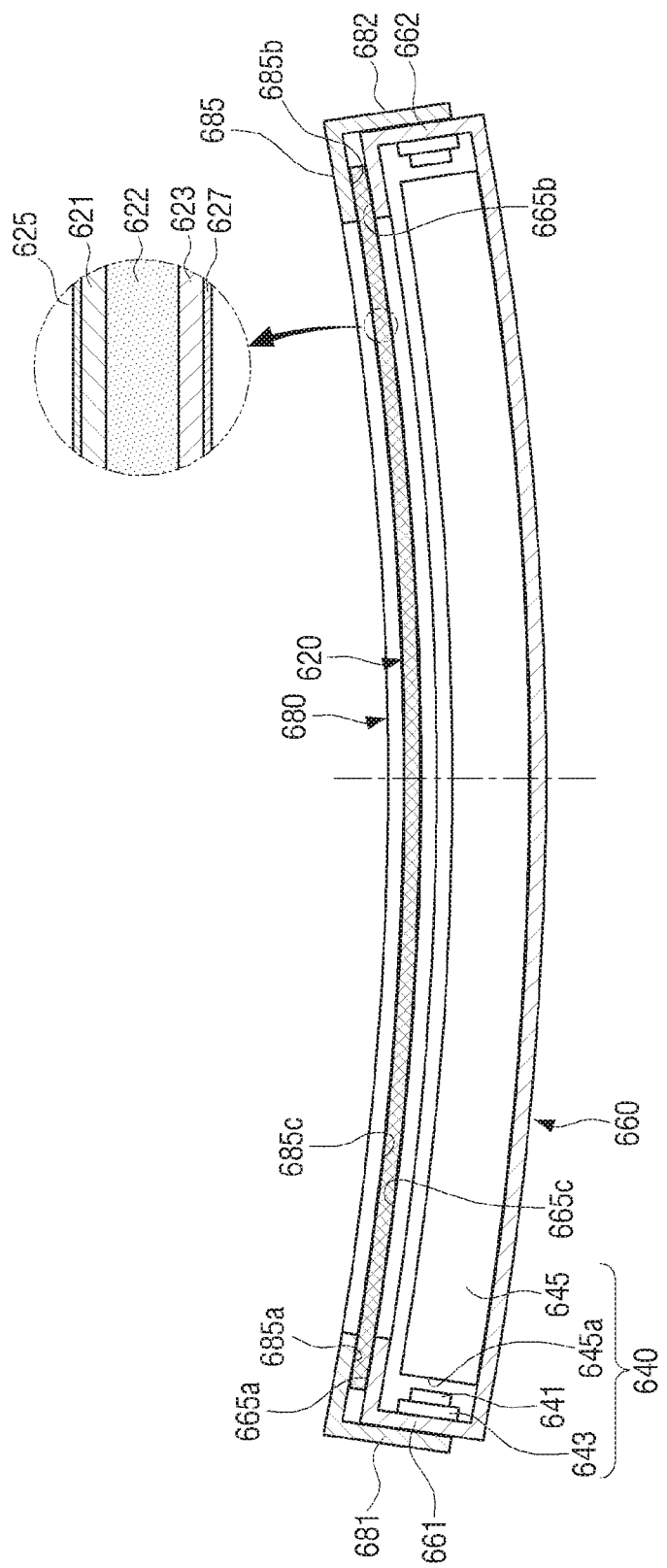
FIG. 27 is a cross-sectional view taken on line I-I of FIG. 25.

FIG. 25 is a perspective view provided to explain a curved display apparatus 600 according to a sixth exemplary embodiment, FIG. 26 is a schematic, exploded perspective view of the curved display apparatus 600 of FIG. 25, and FIG. 27 is a cross-sectional view taken on line I-I of FIG. 25.

Referring to FIGS. 25 through 27, the curved display apparatus 600 according to the sixth exemplary embodiment includes a display panel 620, a backlight unit 640, a bottom chassis 660 and a top chassis 680.

Referring to FIG. 27, the display panel 620 may include an array substrate 623, a color filter substrate 621 facing the array substrate 623, and a liquid crystal 622 interposed between the array substrate 623 and the color filter substrate 621. The color filter substrate 621 may be provided with a front polarization filter 625 on a front surface thereof, and the array substrate 623 may be provided with a rear polarization filter 627 on a rear surface thereof.

Figure 28:
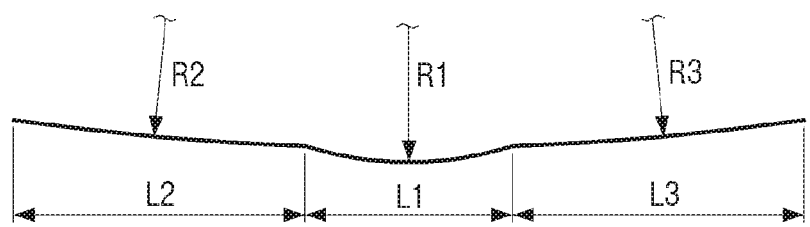
FIG. 28 is a schematic view illustrating curvature regarding the supporting surface of the bottom chassis supporting the rear surface of the display panel of FIG. 27.

Accordingly, the display panel 620 before assembly maintains an approximately planar state as illustrated in FIG. 26, and maintains a curved form when in an assembled state under pressure from the bottom chassis 660 and the top chassis 680 (FIG. 28).

The backlight unit 640 provides the display panel 620 with light for an image display. The backlight unit 640 may include one or more light source PCBs 641, a plurality of light sources 643 mounted on the light source PCBs 641, a light guide panel 645 arranged on a rear portion of the display panel 620, a reflection sheet (not illustrated) arranged on a rear portion of the light guide panel 645, a plurality of optical sheets (which may include optical sheets 122 and the diffusion plate 124 of the first exemplary embodiment illustrated in FIG. 6) arranged between the display panel 620 and the light guide panel 645.

A plurality of light sources 643 may preferably be arranged to oppose one edge surface 645a of the light guide panel 645. For example, the light sources 643 may be implemented as light emitting diodes LEDs. Light emitted from the light sources 643 is introduced into the light guide panel 645 via the edge surface 645a, and is guided to the front of the light guide panel 645 through the light emitting patterns (not illustrated) provided at the light guide panel 645 and the reflection sheet (not illustrated) at the rear portion. The guided lights are altered to have a more uniform brightness distribution due to the optical sheets (not illustrated) and then are provided to the display panel 620.

For efficient transmission of the heat of the light sources 643 to the bottom chassis 660, the light source PCBs 641 may be formed from highly thermal-conductive metal material, such as, for example, aluminum, stainless steel, etc.

An example of the constitution of the backlight unit 640 has been explained above. However, many alternative exemplary embodiments are possible, depending on the design requirements. Because the general structure of the backlight unit 640 is well known, the backlight unit 640 will not be explained in detail for the sake of brevity.

Hereinbelow, the structure of the bottom chassis 660 and the top chassis 680 to curve the display panel 620 according to multiple curvatures will be explained. The bottom chassis 660 and the top chassis 680 package the respective components of the curved display apparatus including the display panel 620 and the backlight unit 640 into one module.

The bottom chassis 660 may preferably be formed from a metallic material with a strength that can maintain the overall shape of the curved display apparatus. In this example, the bottom chassis 660 may preferably be formed from a material with is metal and which has high heat conductivity, such as, for example, aluminum or stainless steel, so as to play a role of releasing heat of the light sources 643 to the outside. Each bottom chassis 150, 250, 450, and 1150 explained above with reference to the first to fifth exemplary embodiments may also be formed from the same material as the bottom chassis 660 of the sixth exemplary embodiment.

The bottom chassis 660 includes the backlight unit 640 provided therein. Although not illustrated, the bottom chassis 660 may include an image board, a control board and a power board on an outer rear surface thereof.

The bottom chassis 660 includes left and right connecting portions 661, 662 arranged substantially perpendicularly to the display panel 620 and the light guide panel 645. When the left and right connecting portions 661, 662 are connected to the top chassis 680 by a fastening device F, such as, for example, a screw, the bottom chassis 660 is directly connected to the top chassis 680. A first and a second supporting surface 665a, 665b to respectively support rear portions of a left end 620a and a right end 620b of the display panel 620 extend from the connecting portions 661, 662.

Further, third and fourth supporting surfaces 665c, 665d to respectively support rear portions of an upper end 620c and a lower end 620d of the display panel 620 extend from the bottom chassis 660.

In the above example, the third and fourth supporting surfaces 665c, 665d may be so formed that second and third region L2, L3 at both sides of the display panel 620 have a smaller curvature than that of a first region L1 in the middle of the second and third regions L2, L3 (that is, a curvature that is close to a line), so as to support the display panel 620 in a state in which a front surface of the display panel 620 is concavely curved, while minimizing a buckling distortion on the front surface of the display panel 620 which may be generated due to curving of the display panel 620. For example, the horizontal radius of curvature R1 of the first region L2 may be set to 1,000 mm to 7,000 mm, while the second and third regions L2, L3 may be curved to have radii of curvature R2, R3 between about 7,000 mm and 15,000 mm.

Further, if the second and third regions L2, L3 are formed to be linear (i.e., curvature=0), the same effect of a minimized buckling distortion of the display panel 620 can be obtained as setting the above-mentioned curvatures close to a line.

Considering that the buckling distortion occurs at a location approximately 2/10 toward the center from the left and right ends of the display panel 620 (aspect ratio=16:9), the second and third regions L2, L3 of the third and fourth supporting surfaces 665c, 665d may be set to lengths that can include the locations where the buckling distortion occurs.

Additionally, considering the possibility that the locations having buckling distortion vary along the display panel 620 depending on the aspect ratio of the display panel 620 and the curvature to be applied to the display panel 620, the second and third regions L2, L3 of the third and fourth supporting surfaces 665c, 665d may be varied depending on the aspect ratio and the curvature of the display panel 620.

Further, considering the fact that the display panel 620 may be curved in a laterally symmetric manner to ensure a uniform degree of viewing angles for a viewer who observes the display panel 620 of the curved display apparatus 600, the second and third regions L2, L3 of the third and fourth supporting surfaces 665c, 665d may be symmetrically formed with reference to the first region L1, and the second and third curvatures of the second and third regions L2, L3 may be equally set.

According to exemplary embodiments, discontinuous points are generated between the first and second regions L1, L2 and between the first and third regions L1, L3 due to different curvatures of the second and third regions L2, L3 than that of the first region L1. These discontinuous points naturally protrude toward the rear surface which is in contact with the display panel 620, and depending on the degree of protrusion, physical influence can be exerted on the display panel 620. Accordingly, additional fourth and fifth regions L4, L5 may be included in the third and fourth supporting surfaces 665c, 665d (FIG. 29) to smoothen the protruded areas.

The fourth region L4 is in between the first and second regions L1, L2, and the fifth region is in between the first and third regions L1, L3. The fourth and fifth regions L4, L5 are formed to have a smaller curvature than that of the first region L1. For example, the horizontal radius of curvature R1 of the first region L1 may be set to approximately 1,000 mm to 6,000 mm, the horizontal radii of curvature R2, R3 of the second and third regions L2, L3 may be set to approximately 11,000 mm to 15,000 mm, and the horizontal radii of curvature R4, R5 of the fourth and fifth regions L4, L5 may be set to approximately 6,000 mm to 11,000 mm.

The bottom chassis 660 may be so formed that the rear surface (on which the light guide panel 645 is installed) has a curvature corresponding to the third and fourth supporting surfaces 665c, 665d, or alternatively, the entire rear surface may have a single curvature along a horizontal direction.

As explained above, the first to third regions L1 to L3 and the first to fifth regions L1 to L5 with varying curvatures are formed on the third and fourth supporting surfaces 665c, 665*d* so that the bottom chassis 660 supports the display panel 620 in a curved form, while minimizing the buckling distortion on the part of the display panel 620.

Likewise, the top chassis 680, which supports the display panel 620 in a curved form in cooperation with the bottom chassis 660, also has first to third regions L1 to L3 or first to fifth regions L1 to L5 with varying curvatures on third and fourth supporting surfaces 685*c*, 685*d* which respectively support the front surface of the upper end 620*c* and the lower end 620*d* of the display panel 620. The first to third regions L1 to L3 or the first to fifth regions L1 to L5 of the third and fourth supporting surfaces 685*c*, 685*d* of the top chassis 680 have the same curvatures of those of the bottom chassis 660, and therefore, the curvatures of the respective regions of the third and fourth supporting surfaces 685*c*, 685*d* of the top chassis 680 will not be explained in detail for the sake of brevity.

The top chassis 680 may be formed from a metallic material with a predetermined strength, or formed from any material provided that the material is not substantially deformable, to maintain the third and fourth supporting surfaces 685*c*, 685*d* of the top chassis 680.

According to exemplary embodiments, the bottom and top chassis 660, 680 support the display panel 620 both horizontally and vertically, when coupled to each other by one or a plurality of the fastening devices (F). Specifically, concerning the bottom chassis 660, the first and second supporting surfaces 665*a*, 665*b* support the rear surfaces of the left and right ends 620*a*, 620*b* of the display panel 620, and the third and fourth supporting surfaces 665*c*, 665*d* support the rear surfaces of the upper and lower ends 620*c*, 620*d* of the display panel 620 in a curved form. Concerning the top chassis 680, the first and second supporting surfaces 685*a*, 685*b* support the front surfaces of the left and right ends 620*a*, 620*b* of the display panel 620, and the third and fourth supporting surfaces 685*c*, 685*d* support the front surfaces of the upper and lower ends 620*c*, 620*d* of the display panel 620 in a curved form.

Because the display panel 620 is curvingly supported by the third and fourth supporting surfaces 665*c*, 665*d*, 685*c*, 685*d* of the bottom and top chassis 660, 680, buckling distortion is minimized, and as a result, light leaks and uneven color defect can be resolved.

Furthermore, the curved display apparatus according to exemplary embodiments is applicable for use in 2D or 3D televisions. Since the defects such as the ones explained above are resolved and the viewer's visual perception is improved, the viewer is provided with images completely spanning his or her visual field, and due to the curved display panel 620, a more effective 3D effect can be provided, resulting in a more enjoyable viewer experience.

Referring to FIGS. 26 and 27, reference numerals 681, 682 refer to coupling portions which couple the left and right sides of the top chassis 680 to the connecting portions 661, 662 of the bottom chassis 660, and 683, 684 refer to upper and lower ends which form upper and lower sides of the top chassis 680.

Figure 29:
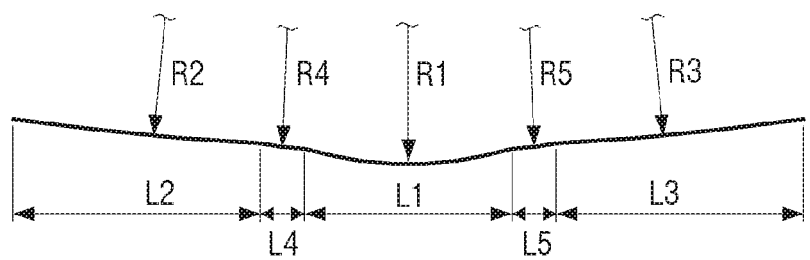
FIG. 29 is a schematic view illustrating curvature regarding the supporting surface of the bottom chassis supporting the rear surface of the display panel of FIG. 27 according to another example.

Meanwhile, although FIGS. 28 and 29 emphasize the illustration of curvatures for convenient understanding, in actual implementation, the curvatures of the first to third regions L1 to L3 and the first to fifth regions L1 to L5 of the third and fourth supporting surfaces 665*c*, 665*d*, 685*c*, and 685*d* can be so set that, to the naked eye, the curvatures of the entire regions L1, L2, L3 can be perceived to be approximately uniform.

Figure 30:
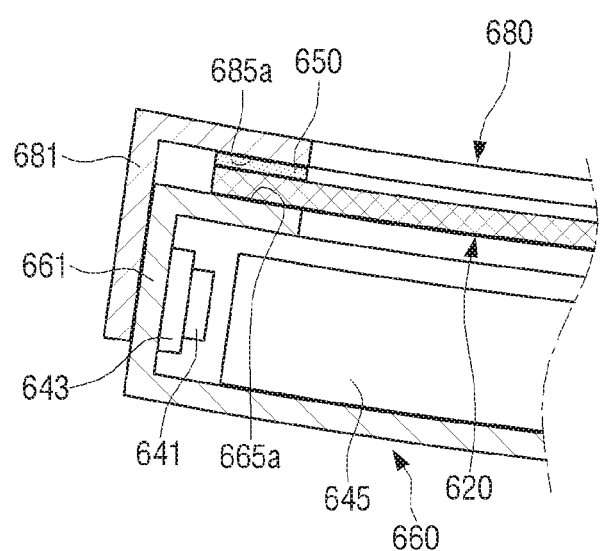
FIG. 30 is a partial cross-section view illustrating an adhesive member formed between the top chassis and the display panel.

Referring to FIG. 30, an adhesive member 650 may be arranged to maintain the display panel 620 at a stable setting position between the display panel 620 and the top chassis 680.

According to exemplary embodiments, the adhesive member 650 has a predetermined thickness and may be formed from a material with a predetermined elasticity to protect the display panel 620 with a relatively weaker strength than that of the top chassis 680. The adhesive member 650 may be provided as a plurality of adhesive members 650 which are respectively arranged on the left and right ends 620*a*, 620*b* and upper and lower ends 620*c*, 620*d* of the display panel 620, and may be formed to an appropriate thickness so as not to influence the configuration of the display panel 620 when the display panel 620 is supported with different curvatures by the third and fourth supporting surfaces 685*c*, 685*d* of the top chassis 680.

Although not illustrated, the adhesive member 650 may be arranged between the display panel 620 and the bottom chassis 660. Further, the adhesive member 650 may be arranged between the display panel 620 and the top chassis 680 and between the display panel 620 and the bottom chassis 660.

Figure 31:
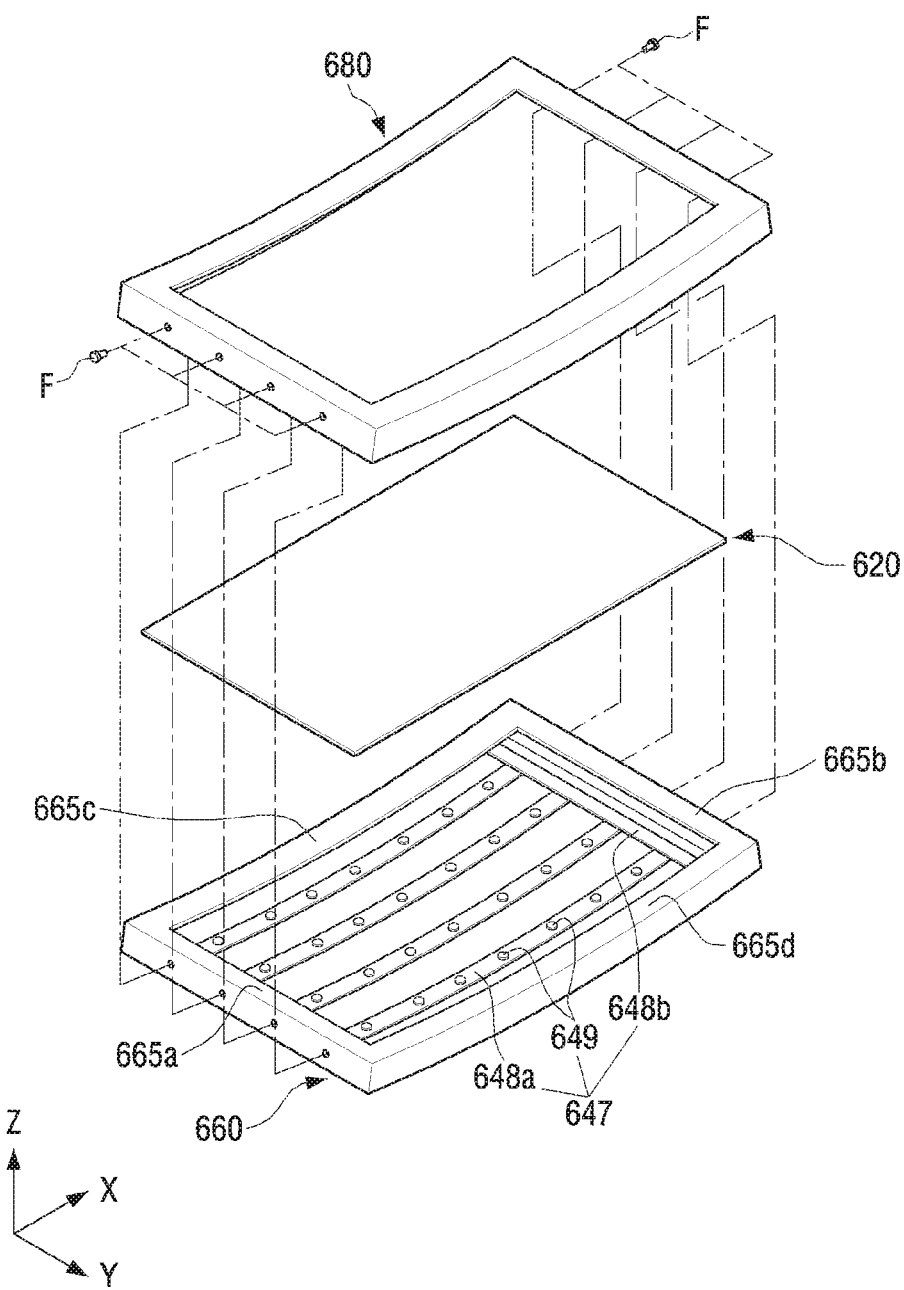
FIG. 31 is an exploded perspective view provided to explain the curved display apparatus of FIG. 25 according to another example.

Although the curved display apparatus according to the sixth exemplary embodiment is illustrated and described as being implemented as having an edge-type backlight unit 640, this is exemplary only. Accordingly, the curved display apparatus according to other exemplary embodiments may employ a direct-type backlight unit, such as direct-type backlight unit 640 as illustrated in FIG. 31.

The direct-type backlight unit 640 may include a plurality of main PCBs 648*a* and a single sub PCB 648*b*. The main PCBs 648*a* and the sub PCB 648*b* may commonly be formed in an elongated rectangular tape. The main PCBs 648*a* are arranged at intervals above one another along a horizontal direction of the rear inner surface of the bottom chassis 660, and the sub PCB 648*b* is arranged along a vertical direction of the bottom chassis 660 and is electrically connected to one end of each of the main PCBs 648*a*.

Accordingly, the curved display apparatus according to the sixth exemplary embodiment may be implemented without being limited by the types of the backlight unit.

Figure 32:
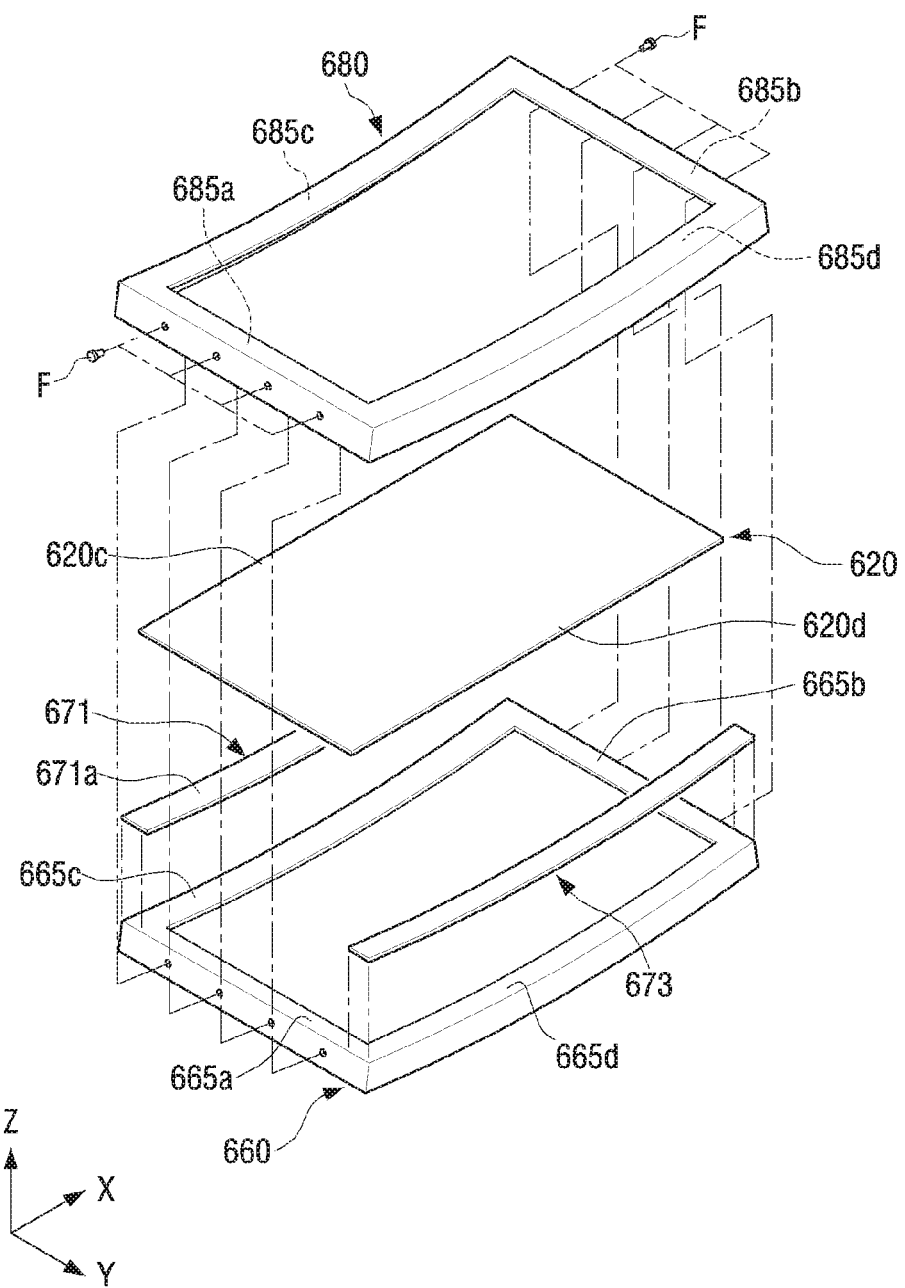
FIG. 32 illustrates a curved display apparatus according to a seventh exemplary embodiment.

FIG. 32 illustrates a curved display apparatus according to a seventh exemplary embodiment. The like elements as those of the curved display apparatus 600 illustrated and explained above according to the sixth exemplary embodiment will be given the same reference numerals, and will not be explained in detail for the sake of brevity.

The curved display apparatus according to the seventh exemplary embodiment has a substantially similar constitution as that of the curved display apparatus 600 according to the sixth exemplary embodiment, except for a pair of guide members 671, 673 which are additionally provided to support the display panel 620. According to an exemplary embodiment, the guide members 671, 673 are bar shaped.

Figure 33:
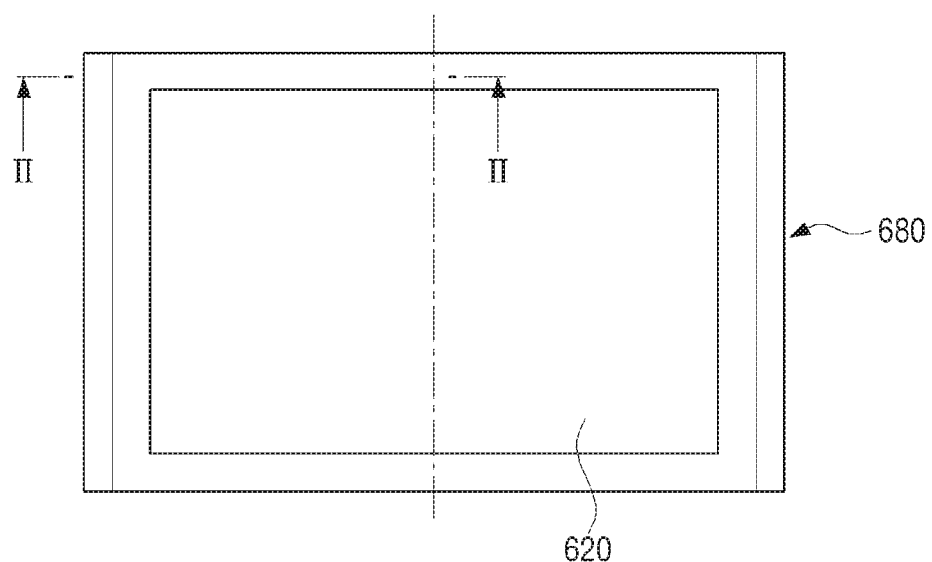
FIG. 33 is an elevation view illustrating the cured display apparatus of FIG. 32 in an assembled state.
Figure 34:
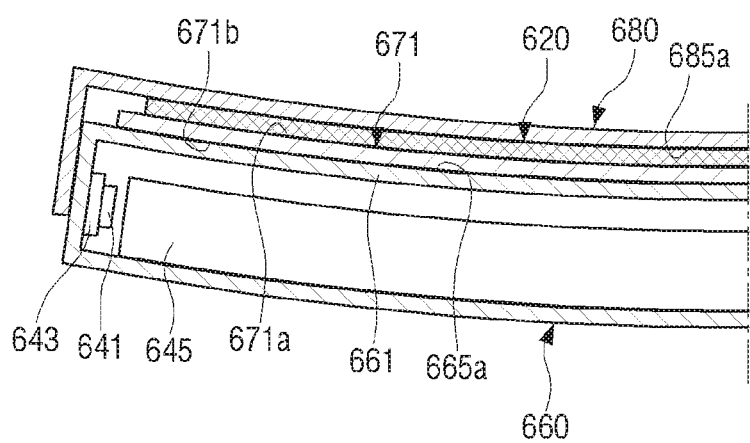
FIG. 34 is a cross-section taken on line II-II of FIG. 33.
Figure 35:
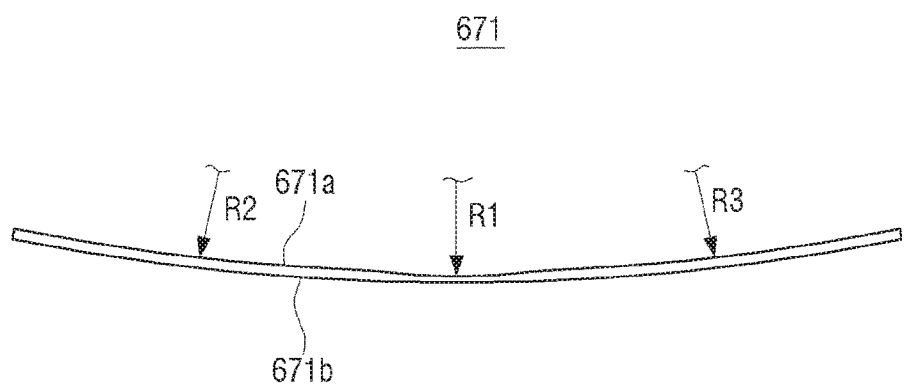
FIG. 35 is a schematic view illustrating curvature applied for the guide bar of FIG. 32.

The pair of guide members 671, 673 are respectively attached along the third and fourth supporting surfaces 665*c*, 665*d* of the bottom chassis 660, and when completely assembled (as in FIG. 33), support the upper and lower ends 620*c*, 620*d* of the display panel 620 with the top chassis 680 so that the display panel 620 is curved.

Referring to FIG. 28, on the third and fourth supporting surfaces 685*c*, 685*d* of the top chassis 680, the first region L1 on the center has a first curvature, and the second and third regions L2, L3 on both sides of the first region L1 have smaller curvatures than the first curvature. Further, although not illustrated, the third and fourth supporting surfaces 685*c*, 685*d* of the top chassis 680 may be so formed that the first to fifth regions L1 to L5 respectively have curvatures similar to the curvatures in the sixth exemplary embodiment illustrated in FIG. 25.

The pair of guide members 671, 673 have identical shapes and, therefore, the constitution thereof will be explained with reference to one of the guide members 671. Referring to FIG. 32, the guide member 671 has first to third regions corresponding to the third and fourth supporting surfaces 685*c*, 685*d* of the top chassis 680 and curvatures corresponding to the respective regions.

The bottom chassis 660 may have a single curvature along the entire regions of the third and fourth supporting surfaces 665*c*, 665*d*, while the opposite surface 671*b* of the guide member 671 that is fixed to the third and fourth supporting surfaces 665*c*, 665*d* of the bottom chassis 660 may have a curvature corresponding to that formed on the third and fourth supporting surfaces 665*c*, 665*d* of the bottom chassis 660.

A pair of additional guide members (not illustrated) may be attached to the first and second supporting surfaces 665*a*, 665*b* of the bottom chassis 660 to more stably support the rear surface of the display panel 620. The pair of additional guide members may have the same or a similar thickness as the pair of guide members 671, 672.

According to exemplary embodiments, although not illustrated, the pair of guide members 671, 672 may be arranged between the display panel 620 and the top chassis 680. The third and fourth supporting surfaces 665*c*, 665*d* of the bottom chassis 660 that directly support the rear surface of the display panel 620 may have the curvatures that are formed on the third and fourth supporting surfaces 665*c*, 665*d* of the bottom chassis 660 explained above with reference to the sixth exemplary embodiment.

Further, the pair of guide members 671, 672 may be installed between the display panel 620 and the bottom chassis 660 and between the display panel 620 and the top chassis 680.

Figure 36:
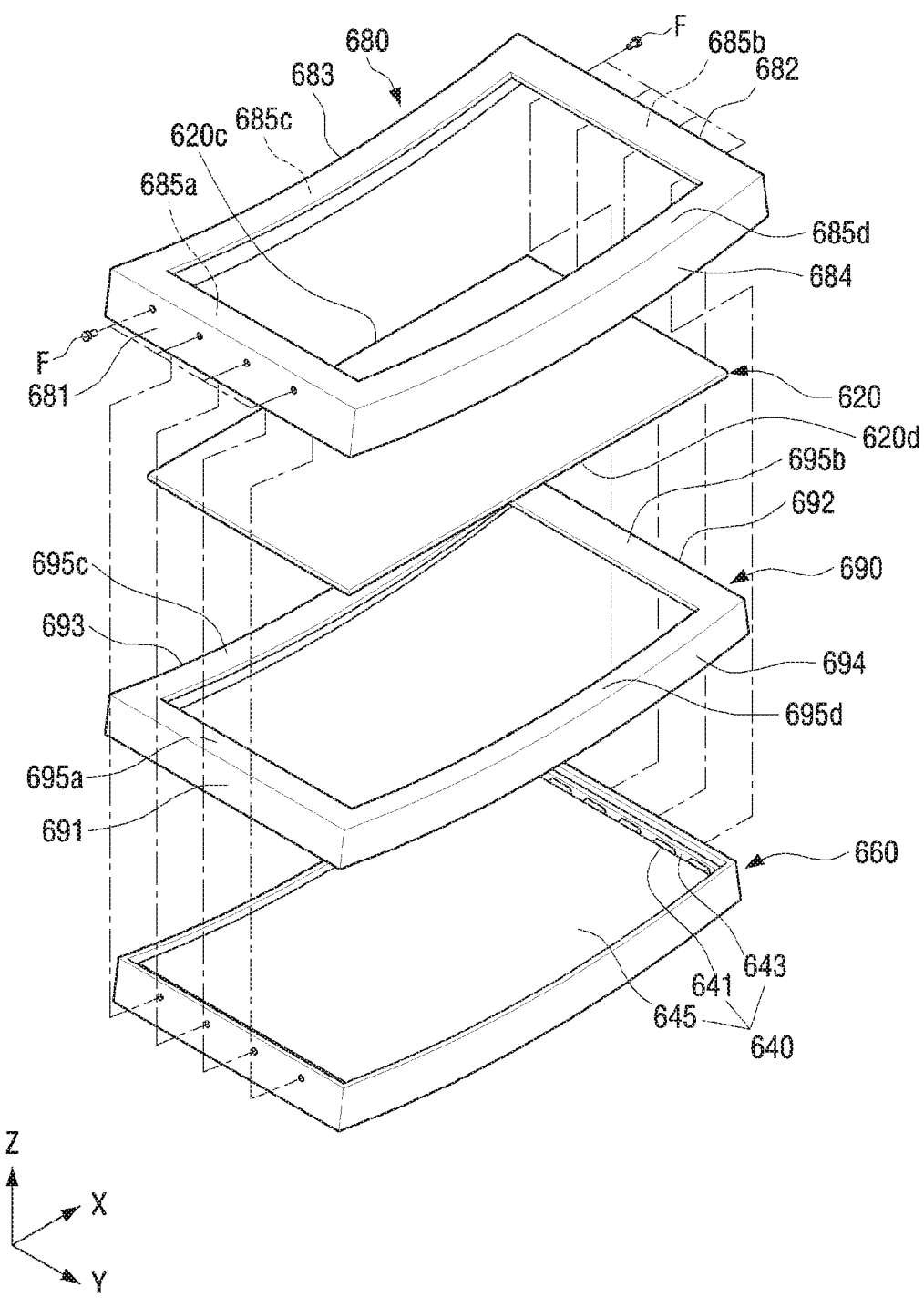
FIG. 36 is an exploded perspective view provided to explain a curved display apparatus according to an eighth exemplary embodiment.
Figure 37:
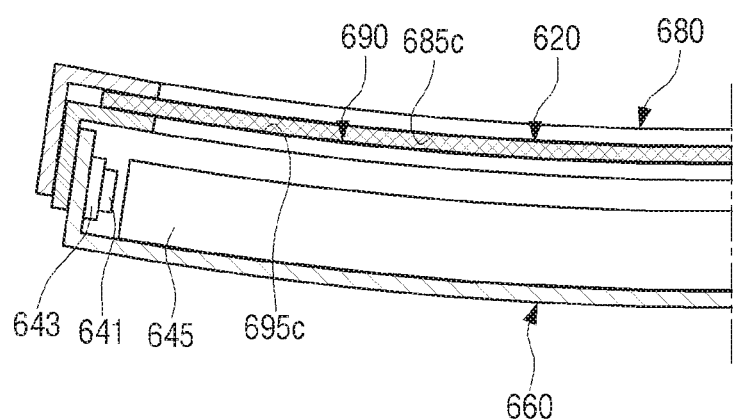
FIG. 37 is a partial cross-section view illustrating the curved display apparatus of FIG. 36 in an assembled state.

FIGS. 36 and 37 illustrate a curved display apparatus according to an eighth exemplary embodiment. The like elements as those of the curved display apparatus illustrated and explained above according to the sixth exemplary embodiment will be given the same reference numerals, and will not be explained in detail for the sake of brevity.

Compared to the sixth exemplary embodiment, the curved display apparatus according to the eighth exemplary embodiment additionally includes a molding member 690. The molding member 690 supports the display panel 620 in a curved form in cooperation with the top chassis 680, while minimizing buckling distortion generated on the display panel 620.

As explained above with reference to the sixth exemplary embodiment illustrated in FIG. 28, on the third and fourth supporting surfaces 685*c*, 685*d* of the top chassis 680, the first region L1 on the center may have a first curvature, and second and third regions L2, L3 on both sides of the first region may have curvatures smaller than the first curvature, or first to fifth regions L1 to L5 may have the respective curvatures, in substantially the same fashion as the sixth exemplary embodiment illustrated in FIG. 28.

The molding member 690 is arranged on a front of the bottom chassis 660, supports components including the display panel 620 and the optical sheets (not illustrated), and assists the top chassis 680 in packaging the curved display apparatus.

The molding member 90 includes a pair of coupling portions 691, 692 which support the display panel 620, and upper and lower ends 693, 694. The pair of coupling portions 691, 692 are coupled when the top chassis 680 is coupled to the bottom chassis 660 with the fastening device F.

Further, first to fourth supporting surfaces 695*a* to 695*d* are formed on the pair of coupling portions 691, 692 and the upper and lower ends 693, 694 of the molding member, to respectively support the rear surfaces of the left and right ends 620*a*, 620*b* and the rear surfaces of the upper and lower ends 620*c*, 620*d* of the display panel 620.

The third and fourth supporting surfaces 695*c*, 695*d* of the molding member 690 supporting the rear surfaces of the upper and lower ends 620*c*, 620*d* of the display panel 620 have curvatures that correspond to the first to third regions corresponding to the third and fourth supporting surfaces 685*c*, 685*d* of the top chassis 680 and the respective regions.

Since the display panel 620 is supported by the top chassis 680 and the molding member 690, it is not necessary for the bottom chassis 660 to directly support the rear surface of the display panel 620. Accordingly, the first to fourth contacting surfaces 665*a* to 665*d* of the bottom chassis 660 of the first to seventh exemplary embodiments may be omitted.

The top chassis 680 explained above with reference to the sixth to eighth exemplary embodiments may be formed from a metallic material or a synthetic resin material with a predetermined strength so as to prevent deformation.

Alternatively, the top chassis 780 according to a ninth exemplary embodiment to be explained below may be formed from a synthetic resin material (e.g., polycarbonate resin or a mixture of polycarbonate resin and acrylonitrile-butadiene-styrene (ABS) resin) with ductility which can deform when coupled to the bottom chassis 160.

Figure 38:
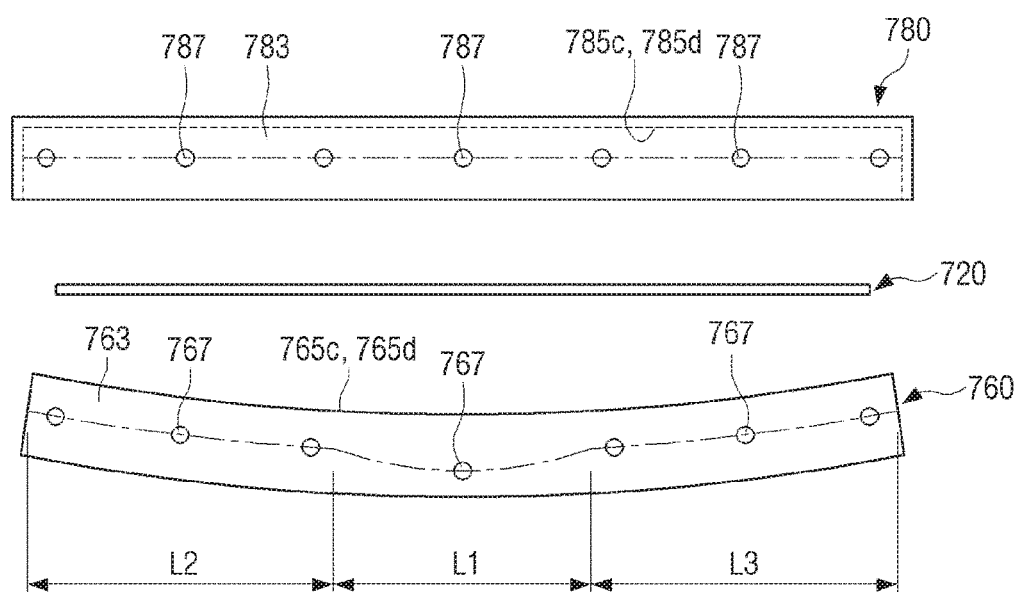
FIG. 38 is a schematic view illustrating the curved display apparatus according to a ninth exemplary embodiment in a disassembled state.
Figure 39:
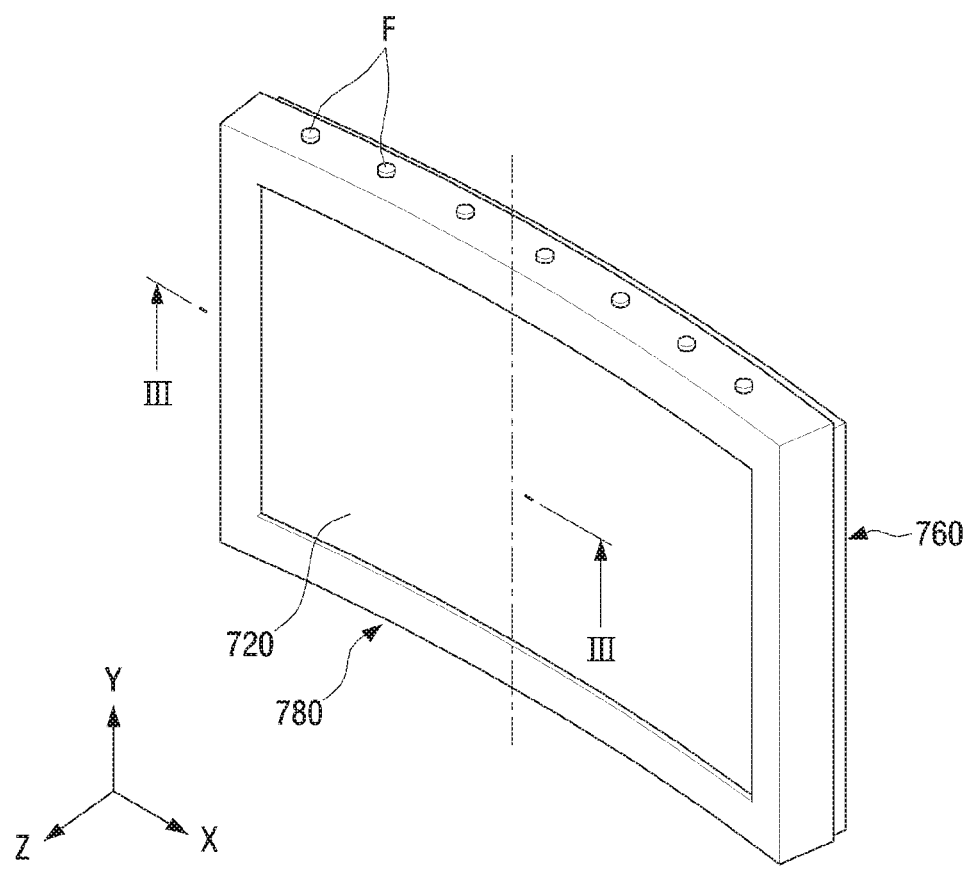
FIG. 39 is a schematic view illustrating the curved display apparatus of FIG. 38 in an assembled state.

FIGS. 38 and 39 are views illustrating the curved display apparatus in disassembled and assembled states according to the exemplary ninth embodiment.

Referring to FIG. 38, the curved display apparatus according to the ninth exemplary embodiment is arranged between the bottom chassis 760 and the top chassis 780.

The bottom chassis 760 has the same constitution as the bottom chassis 660 according to the sixth exemplary embodiment, and unlike the top chassis 780, is formed from a metallic material which is hardly deformable.

Further, the bottom chassis 760 includes a plurality of coupling holes 767 formed along an upper end 763 and a lower end (not illustrated) of the bottom chassis 760. The coupling holes 767 may be formed in the same profile as that of the first to third regions L1 to L3 with the first to third curvatures formed on the third and fourth supporting surfaces 765*c*, 765*d* of the bottom chassis 760.

The top chassis 780 is formed in an approximately linear fashion which does not have curvature along a horizontal direction, and includes a plurality of coupling holes 787 arranged along the upper end 784 and the lower end (not illustrated) in an appropriately linear fashion.

Hereinbelow, the process of fixing the display panel 720 with the bottom chassis 760 and the top chassis 780 will be explained in a stepwise manner.

First, the bottom chassis 760 is placed on a working table (not illustrated) and the display panel 720 is seated on the bottom chassis 760. The display panel 720 is aligned so that the left and right ends and the upper and lower ends are seated on the first and fourth supporting surfaces of the bottom chassis 760. The liquid crystal panel 720 may be stably fixed to the bottom chassis 760 by a predetermined adhesive member.

Next, the top chassis 780 is seated on the bottom chassis 760 to support the front surface of the left and right ends and the upper and lower ends of the display panel 720.

After that, to couple the bottom chassis 760 with the top chassis 780 with the fastening device F, which may be, for example, a bolt or screw, the plurality of coupling holes 767 formed in the bottom chassis 760 are aligned with the plurality of coupling holes 787 formed in the top chassis 780 which is pressed against the bottom chassis 760, and the fastening device F is fastened into the respective coupling holes 767, 787.

Figure 40:
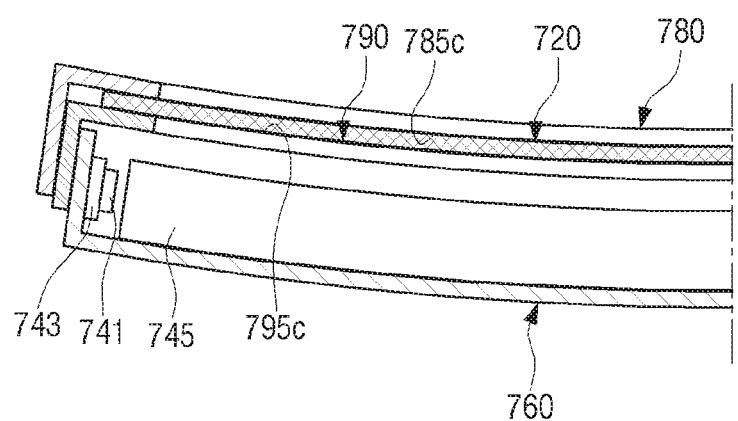
FIG. 40 is a cross-section taken on line III-III of FIG. 39.

Referring to FIG. 39, when the fastening device F is completely fastened into the coupling holes 767, 787, referring to FIG. 40, the third and fourth supporting surfaces 785c, 785d of the top chassis 780 support the front surface of the display panel 720, while maintaining the same or almost the same curvatures formed on the third and fourth supporting surfaces 765c, 765d of the bottom chassis 760. Accordingly, due to the bottom chassis 760 and the top chassis 780, the display panel 720 is supported to maintain smaller curvatures on both sides in a horizontal direction as compared to the curvature at the center.

Figure 41:
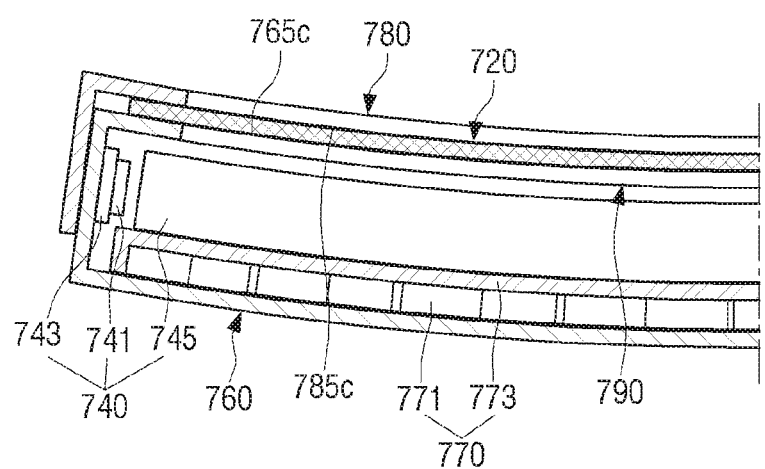
FIG. 41 is a partial cross-section view illustrating the curved display apparatus of FIG. 40 according to another example.

Meanwhile, the bottom chassis 760 may be subject to stress that pulls the bottom chassis 760 in a direction of the top chassis 780 due to an elastic recovery force of the top chassis 780. Accordingly, the bottom chassis 760 may include a form reinforcing device 770 such as the one illustrated in FIG. 41 to overcome the stress and maintain the current form.

The form reinforcing device 770 may include, for example, a core 771 and a cover member 773 to cover the core 771.

Figure 42:
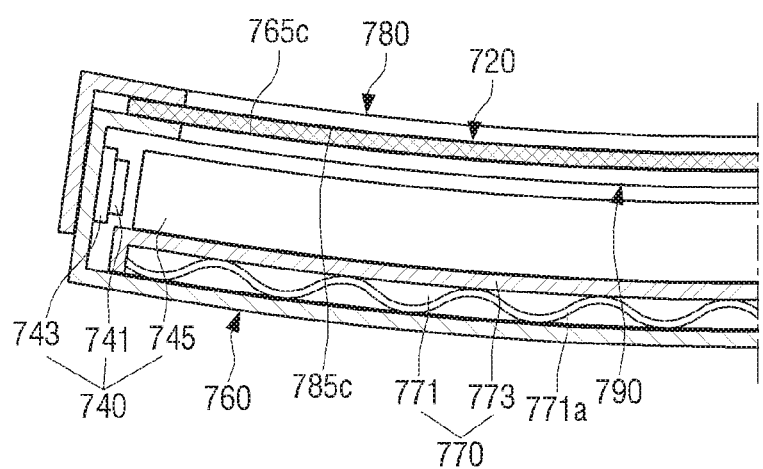
FIG. 42 is a partial cross-section view illustrating the curved display apparatus of FIG. 40 according to yet another example.

The core 771 may be attached along an inner side of the bottom chassis 760, with an adhesive such as a hot melt adhesive. The core 771 may be provided in the form of a honeycomb (FIG. 41) to structurally maintain optimum strength at using a lightweight configuration. Alternatively, the core 771 is not specifically limited to the honeycomb structure, but may be varied to any pattern, such as, for example, a square or circular structure. Further, according to another example, the core 771a may be provided in a corrugated structure as illustrated in FIG. 42.

The core 771 may be formed from aluminum which has good strength, but is not limited thereto and may also be formed from other materials. Accordingly, the core 771 may be formed from other metallic materials or nonmetallic materials (e.g., plastic).

The cover member 773 covers the core 771, 771a from exposure. The cover member 773 may be formed from identical material as the core 771, 771a, although may also be formed from other materials. That is, the cover member 773 may be formed from aluminum, for example. Further, the cover member 773 may be attached to the core 771, 771a, with an adhesive such as a hot melt adhesive.

Because the cover member 773 covers the core 771, 771a, contaminants that may be present on the core 771, 771a are blocked from entering the display panel 720.

As explained above, due to the presence of the form reinforcing member 770 mounted on the bottom chassis 760, the curved display apparatus according to the ninth exemplary embodiment reinforces the strength of the bottom chassis 760, and as a result, deformation of the bottom chassis 760 due to coupling with the top chassis 780 can be minimized. Accordingly, the form reinforcing member 770 maintains the curvatures formed on the third and fourth supporting surfaces in their curved state, and prevents deterioration of image quality on the display panel 720 which would otherwise occur due to deformation.

Figure 43:
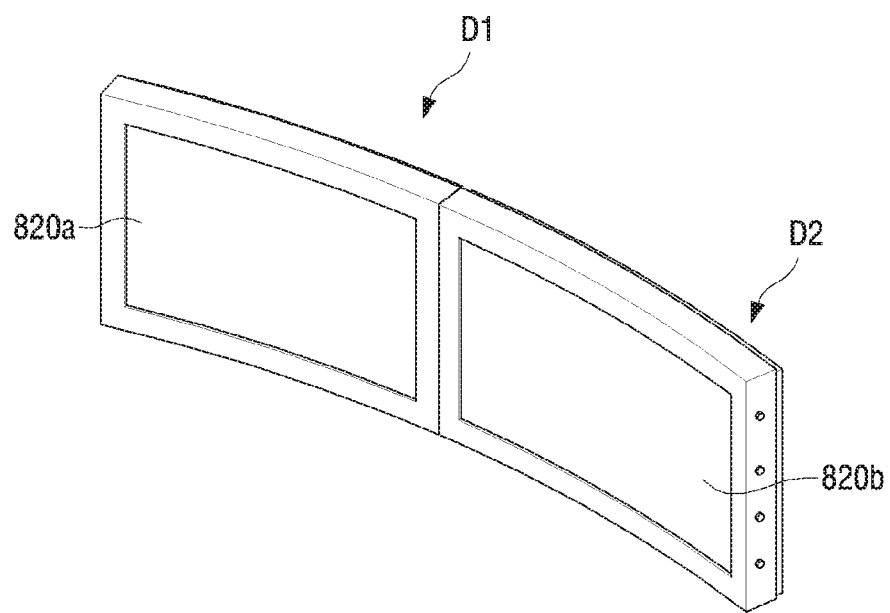
FIG. 43 is a perspective view of a multi display apparatus including a plurality of curved display apparatuses according to a tenth exemplary embodiment.

FIG. 43 is a perspective view of a multi display apparatus including a plurality of curved display apparatuses according to a tenth exemplary embodiment.

According to the tenth exemplary embodiment, referring to FIG. 43, a multi display apparatus may employ a plurality of the curved display apparatuses according to the first to ninth exemplary embodiments.

Referring to FIG. 43, the curved display apparatuses D1, D2 according to the first to ninth exemplary embodiments may be arranged in a horizontal direction. The multi display apparatus may divide a single image for transmission to the curved display apparatuses D1, D2 into images for transmission to the curved display apparatuses D1, D2 and transmit the corresponding images to the curved display apparatuses D1, D2, respectively.

Figure 44:
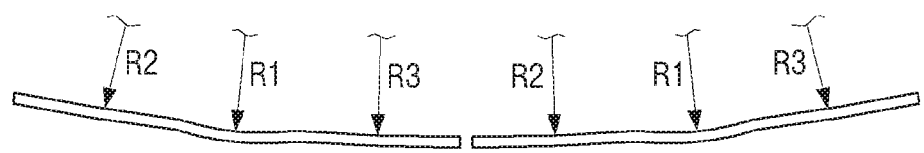
FIG. 44 is a schematic view illustrating curvature of a display panel embedded in the respective curved display apparatuses of FIG. 43.

As explained above, because the curved display apparatuses D1, D2 are curved while maintaining the same curvatures as the display panels 110, 410, 620, 720, and DP5 of the first to ninth exemplary embodiments (see FIG. 44), buckling distortion on the display panels 820a, 820b is minimized, and image quality deterioration due to light leaks and an uneven color defect can be prevented.

Figure 45:
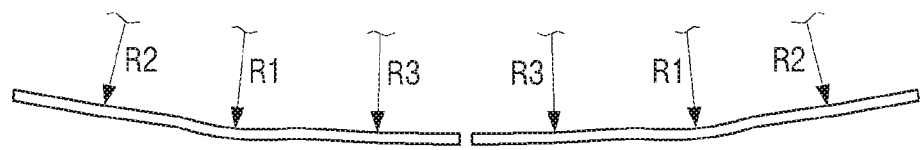
FIG. 45 is a schematic view illustrating another curvature of a display panel embedded in the respective curved display apparatuses of FIG. 43.

Further, referring to the example shown in FIG. 45, the display panels 820a, 820b of the plurality of curved display apparatuses D1, D2 may be symmetrically arranged. The display panels 820a, 820b may be so formed that regions (with a radius of curvature R3) adjoining each other have a different length from the regions located on the opposite sides (with a radius of curvature R2).

In the example shown in FIG. 45, the region at the center (formed with a radius of curvature R1) of each of the display panels 820a, 820b may be placed close to the side near the display panels 820a, 820b instead of close to the center of the display panels 820a, 820b.

Furthermore, the curved display apparatuses D1, D2 employed in the multi display apparatus may include the guide members 671, 672 as in the seventh exemplary embodiment (FIG. 32), and/or the molding member 690 as in the eighth exemplary embodiment (FIG. 36).

Meanwhile, although the display panels 620, 720, 820a, and 820b according to the sixth to tenth exemplary embodiments are curved along the horizontal direction (i.e., in a landscape type) in the description provided above, this configuration is exemplary only. Accordingly, the display panel may be curved vertically (i.e., in portrait type) as in the fourth exemplary embodiment (FIG. 19) to minimize the buckling distortion that may be generated on part of the upper and lower portions of the display panel.

That is, in the bottom chassis and the top chassis supporting the left and right ends of the display panel, the first supporting region at the center of the supporting surfaces of the left and right ends may be maintained with the first curvature, while the second and third supporting regions located on left and right sides of the first region may be maintained with the second and third curvatures which are smaller than the first curvature.

The second and third curvatures may be identical to each other, may be close to a line, or may be a line (i.e., curvature=0). Further, the second and third supporting regions may be symmetrically formed with reference to the first supporting region.

Furthermore, it is possible to construct a multi display apparatus by arranging a plurality of vertically-curved display apparatuses in a vertical direction.

As explained above, the concave-curved display apparatus according to exemplary embodiments may be implemented for use in a wide screen display apparatus, such as a wide screen television, or in a middle-sized or small-sized display apparatus, such as a mobile phone or smartphone which is used in contact with a human face, or in a large advertisement display apparatus.

According to exemplary embodiments, because the display panel is constructed to have multiple curvatures, thermal or mechanical stress is reduced and phrase difference on a liquid crystal layer is prevented. As a result, display defects such as a mura defect or a yellowish defect, which are generated due to stress on the display panel in a curved state, can be prevented.

By way of example, by curving the display panel in a manner in which the curvature per unit decreases (i.e., radius of curvature increases) in a direction moving farther away from the center of the display panel, thermal or mechanical stress, which may be exerted depending on the curving of the display panel, can be prevented. At this time, the curvature may decrease linearly or non-linearly.

Meanwhile, by curving the display panel in a manner in which the curvature per unit increases (i.e., radius of curvature decreases) in a direction moving farther away from the center of the display panel, thermal or mechanical stress, which may be exerted depending on the curving of the display panel, can be prevented. At this time, the curvature may decrease linearly or non-linearly.

The foregoing exemplary embodiments and advantages are merely exemplary and are not to be construed as limiting. The present teachings can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A curved display apparatus, comprising:
   a display panel; and
   a fixation member with multiple curvatures in a part of the fixation member which supports the display panel so that the display panel is curved with multiple curvatures,
   wherein the fixation member includes a center portion corresponding to a center portion of the display panel, peripheral portions corresponding to peripheral portions of the display panel, and intermediate portions corresponding to intermediate portions of the display panel, each of the intermediate portions of the fixation member connecting the center portion of the fixation member and a peripheral portion of the peripheral portions of the fixation member,
   wherein the multiple curvatures include a curvature of the center portion of the fixation member, curvatures of the peripheral portions of the fixation member and curvatures of the intermediate portions of the fixation member,
   wherein the curvatures of the peripheral portions of the fixation member are symmetric with reference to the center portion of the fixation member, and
   wherein the multiple curvatures of the fixation member are set to decrease along a direction away from the center portion of the fixation member towards each of the peripheral portions of the fixation member.

2. The curved display apparatus of claim 1, wherein the display panel is a liquid crystal display (LCD) panel, and the curved display apparatus further comprises a direct-type backlight assembly which provides the LCD panel with light, wherein
   the direct-type backlight assembly includes a plurality of light sources arranged on a rear side of the LCD panel.

3. The curved display apparatus of claim 1, wherein the fixation member comprises:
   an upper frame which corresponds to an upper side of the display panel and which supports the display panel so that the display panel is curved with the multiple curvatures;
   a lower frame which corresponds to a lower side of the display panel and which supports the display panel so that the display panel is curved with the multiple curvatures;
   a left frame which corresponds to a left side of the display panel and which is disposed between the upper frame and the lower frame; and
   a right frame which corresponds to a right side of the display panel and which is disposed between the upper frame and the lower frame.

4. The curved display apparatus of claim 3, wherein the upper frame comprises a first opening formed therein to receive the upper side of the display panel, and the lower frame comprises a second opening formed therein to receive the lower side of the display panel, the left frame comprises a third opening formed therein to receive the left side of the display panel, and the right frame comprises a fourth opening formed therein to receive the right side of the display panel.

5. The curved display apparatus of claim 1, wherein the fixation member comprises:
   a bottom chassis arranged below the display panel; and
   a top chassis arranged above the display panel, the top chassis comprising multiple curvatures and fixing the display panel via coupling with the bottom chassis.

6. The curved display apparatus of claim 1, wherein the fixation member comprises:
   a bottom chassis arranged below the display panel;
   a molding member arranged between the display panel and the bottom chassis, the molding member comprising multiple curvatures which support the display panel; and
   a top chassis arranged above the display panel, the top chassis comprising multiple curvatures and fixing the display panel via coupling with the bottom chassis.

7. The curved display apparatus of claim 1, wherein the fixation member comprises:
   a bottom chassis arranged below the display panel;
   a molding member arranged between the display panel and the bottom chassis, the molding member comprising multiple curvatures which support the display panel; and
   an adhesive member arranged between the molding member and the display panel to fix the display panel with the multiple curvatures to the molding member.

8. The curved display apparatus of claim 1, wherein the multiple curvatures are defined by a plurality of radii of curvature which increase in a direction moving farther away from the center portion of the fixation member.

9. The curved display apparatus of claim 1, wherein the multiple curvatures are defined by a plurality of radii of curvature which change in a direction moving farther away from the center portion of the fixation member.

10. The curved display apparatus of claim 1, wherein the fixation member comprises:
    first and second members which respectively support the display panel at front and rear locations of the display panel so that the display panel is curved with multiple curvatures, wherein
    the first and second members each provide support so that a first region of the display panel maintains a first curvature, a second region on a left side of the first region maintains a second curvature which is smaller than the first curvature, and a third region on a right side of the first region maintains a third curvature which is smaller than the first curvature.

11. The display apparatus of claim 10, wherein the first member comprises a first supporting surface to be in contact with a front surface of the display panel, and the second member comprises a second supporting surface to be in contact with a rear surface of the display panel, and
the first and second supporting surfaces each comprise:
a first supporting region having the first curvature and corresponding to the first region,
a second supporting region having the second curvature and corresponding to the second region, and
a third supporting region having the third curvature and corresponding to the third region.

12. The display apparatus of claim 11, wherein the first and second supporting surfaces having the first, second and third supporting regions formed thereon each comprise:
a fourth supporting region arranged between the first and second supporting regions and having a fourth curvature which is larger than the first curvature; and
a fifth supporting region arranged between the first and third supporting regions and having a fifth curvature which is larger than the first curvature.

13. The display apparatus of claim 10, wherein the second member comprises a supporting surface to contact a front surface of the display panel, and the supporting surface comprises a first supporting region having the first curvature and corresponding to the first region, a second supporting region having the second curvature and corresponding to the second region, and a third supporting region having the third curvature and corresponding to the third region, and
the first member is deformed by a force to couple the first member into tight contact with the second member so as to bring the display panel into tight contact with the supporting surface of the second member.

14. A curved display apparatus, comprising:
a flexible display panel; and
a fixation member supporting the flexible display panel so that the flexible display panel is curved with multiple curvatures,
wherein the fixation member includes a plurality of guide members according to which the flexible display panel is curved with the multiple curvatures,
wherein the fixation member comprises a support opening which has a larger width than a thickness of the flexible display panel and into which a part of the flexible display panel is inserted,
wherein a maximum thickness of each of the plurality of guide members is a difference between the width of the support opening and the thickness of the display panel, the plurality of guide members have different shapes and are made of silicone, rubber, or sponge, and
wherein the plurality of guide members are disposed in the support opening to support the part of the flexible display panel.

15. The curved display apparatus of claim 14, wherein at least one guide member of the plurality of guide members supports a rear surface or a front surface of the flexible display panel.

16. The curved display apparatus of claim 14, wherein the flexible display panel maintains a curvature of a central portion of the flexible display panel to be larger than a curvature of a peripheral portion of the flexible display panel.

17. The curved display apparatus of claim 14, wherein a first guide member of the plurality of guide members supports a front surface of the flexible display panel and a second guide member of the plurality of guide members supports a rear surface of the flexible display panel.

18. The curved display apparatus of claim 14, wherein the flexible display panel has an upper edge, a lower edge, a left edge and a right edge,
wherein the fixation member includes an upper frame extending along the upper edge of the flexible display panel and having an upper support opening into which the upper edge of the flexible display panel is inserted and a lower frame extending along the lower edge of the flexible display panel and having a lower support opening into which the lower edge of the flexible display panel is inserted, and
wherein at least one guide member of the plurality of guide members is disposed in each of the upper support opening and the lower support opening to support the flexible display panel.

* * * * *